(12) United States Patent
Nakahata et al.

(10) Patent No.: US 7,473,315 B2
(45) Date of Patent: *Jan. 6, 2009

(54) $AL_xIN_yGA_{1-x-y}N$ MIXTURE CRYSTAL SUBSTRATE, METHOD OF GROWING $AL_xIN_yGA_{1-x-y}N$ MIXTURE CRYSTAL SUBSTRATE AND METHOD OF PRODUCING $AL_xIN_yGA_{1-x-y}N$ MIXTURE CRYSTAL SUBSTRATE

(75) Inventors: Seiji Nakahata, Itami (JP); Ryu Hirota, Itami (JP); Kensaku Motoki, Itami (JP); Takuji Okahisa, Itami (JP); Koji Uematsu, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 548 days.

This patent is subject to a terminal disclaimer.

(21) Appl. No.: 11/067,928

(22) Filed: Mar. 1, 2005

(65) Prior Publication Data
US 2005/0183658 A1 Aug. 25, 2005

(51) Int. Cl.
C30B 25/04 (2006.01)
(52) U.S. Cl. .............. 117/84; 117/85; 117/86; 117/90; 117/94
(58) Field of Classification Search ............... 117/86, 117/84, 85, 90, 94
See application file for complete search history.

(56) References Cited

U.S. PATENT DOCUMENTS 6,252,261 B1 6/2001 Usui et al.
7,087,114 B2 * 8/2006 Motoki et al. .......... 117/86

FOREIGN PATENT DOCUMENTS

| EP | 0966047 A | 12/1999 |
|---|---|---|
| EP | 1041610 A | 10/2000 |
| EP | 1 088 914 A1 | 4/2001 |
| EP | 1088914 A | 4/2001 |
| JP | 9-298300 | 10/1997 |
| JP | 10-9008 | 1/1998 |

(Continued)

OTHER PUBLICATIONS

European Search Report issued in European Patent Application No. EP 02 02 1243, dated Apr. 2, 2008.

(Continued)

*Primary Examiner*—Robert M Kunemund
(74) *Attorney, Agent, or Firm*—McDermott Will & Emery LLP

(57) ABSTRACT

A low dislocation density $Al_xIn_yGa_{1-x-y}N$ single crystal substrate is made by forming a seed mask having parallel stripes regularly and periodically aligning on an undersubstrate, growing an $Al_xIn_yGa_{1-x-y}N$ crystal on a facet-growth condition, forming repetitions of parallel facet hills and facet valleys rooted upon the mask stripes, maintaining the facet hills and facet valleys, producing voluminous defect accumulating regions (H) accompanying the valleys, yielding low dislocation single crystal regions (Z) following the facets, making C-plane growth regions (Y) following flat tops between the facets, gathering dislocations on the facets into the valleys by the action of the growing facets, reducing dislocations in the low dislocation single crystal regions (Z) and the C-plane growth regions (Y), and accumulating the dislocations in cores (S) or interfaces (K) of the voluminous defect accumulating regions (H).

92 Claims, 13 Drawing Sheets

Growing method of the present invention

FOREIGN PATENT DOCUMENTS

| | | |
|---|---|---|
| JP | 10-102546 | 4/1998 |
| JP | 2000-12900 | 1/2000 |
| JP | 2000-22212 | 1/2000 |
| WO | WO 99/23693 | 5/1999 |

OTHER PUBLICATIONS

Hiramatsu, K., et al. "Fabrication and characterization of low defect density GaN using facet-controlled epitaxial lateral overgrowth (FACELO)," Journal of Crystal Growth, 2000, p. 316-326, vol. 221, Elsevier Science B.V.

Wu, J et al., "Selective growth of cubic GaN on patterned GaAs (100) substrates by metalorganic vapor phase epitaxy", 3rd International Conference on Nitride Semiconductors, Montpellier, France, Jul. 4-9, 1999, 'Online!, vol. 176, No. 1, pp. 557-560, XP002228656.

Li, X et al., "Characteristics of GaN stripes grown by selective-area metalorganic chemical vapor deposition", Proceedings of the 38th Electronic Materials Conference, Santa Barbara, CA, USA, Jun. 26-28, 1996, vol. 26, No. 3, pp. 306-310, XP009004611.

Kawaguchi, Y. et al., "Selective area growth (SAG) and epitaxial lateral overgrowth (ELO) of GaN using tungsten mask", GaN and Related Alloys, Symposium, GaN and Related Alloys, Symposium, Boston, MA, USA, Nov. 30-Dec. 4, 1998, 'Online!, p. G4 1/6 pp. XP002228657.

Zhang, et al., "Epitaxial overgrowth of GaN with chloride-based growth chemistries in both hydride and metalorganic vapor phase epitaxy", GaN and Related Alloys, Symposium, GaN and Related Alloys, Symposium, Boston, MA, USA, Nov. 30-Dec. 4, 1998, 'Online!, p. G4. 7/6 pp. XP002228658.

Kuan, T S et al., "Dislocation mechanisms in the GaN lateral overgrowth by hydride vapor phase epitaxy", GaN and Related Alloys—1999. Symposium (Materials Research Society Symposium Proceedings vol. 595), GaN and Related Alloys—1999. Symposium, Boston, MA, USA, Nov. 28-Dec. 3, 1999, 'Online!, pp. W2.6.1-6, XP002228659.

Miyake, H et al., "Fabrication of GaN with buried tungsten (W) structures using epitaxial lateral overgrowth (ELO) via LP-MOVPE" GaN and Related Alloys—1999. Symposium (Materials Research Society Symposium Proceedings vol. 595), GaN and Related Alloys—1999. Symposium, Boston, MA, USA, Nov. 28-Dec. 3, 1999. 'Online! pp. W2.3.1.-6, XP002228660.

Usui, A "Growth of Thick GaN Layers by Hydride Vapor-Phase Epitaxy", Electronics & Communications in Japan, Part II—Electronics, Scripta Technica. New York, US, vol. 81, No. 7, Jul. 1998, pp. 57-63, XP000835031.

Yoshiki, K., et al., "Selective Growth of Wurtzite GaN and AlXGa1-Xn on GaN/Sapphire Substrates by Metalorganic Vapor Phase Epitaxy", Journal of Crystal Growth, North-Holland Publishing Co. Amsterdam, NL, vol. 144, No. 3/4, Dec. 2, 1994, pp. 133-140, XP000483655.

Beaumont, B, et al., Lateral Overgrowth of GaN on Patterned GaN/Sapphire Substrate via Selective Metal Organic Vapour Phase Epitaxy: A Route to Produce Self Supported GaN Substrates, Journal of Crystal Growth, North-Holland Publishing Co., Amsterdam, NL, vol. 189/190, Jun. 2, 1998, pp. 97-102, XP000667735.

Usui, A et al., "Thick GaN Epitaxial Growth With Low Dislocation Density by Hydride Vapor Phase Epitaxy", Japanese Journal of Applied Physics, Publication Office Japanese Journal of Applied Physics, Tokyo, JP, vol. 36., No. 7B, Part 2, Jul. 15, 1997, pp. L899-L902, XP000742410.

Akasaka, T et al., "GaN Hexagonal Microprisms With Smooth Vertical Facets Fabricated by Selective Metalorganic Vapor Phase Epitaxy", Applied Physics Letters, American Institute of Physics, New York, US, vol. 71, No. 15, Oct. 13, 1997, pp. 2196-2198, XP000725873.

Kapolnek, D et al. "Anisotropic Epitaxial Lateral Growth in GaN Selective Area Epitaxy", Applied Physics Letters, American Institute of Physics, New York, US, vol. 71, No. 9, Sep. 1, 1997, pp. 1204-1206, XP000720234.

Powell, A.R. "New Approach to growth of low dislocation relaxed SiGe material." Applied Physics Letter, 64 (14) Apr. 4, 1994, pp. 1856-1858.

* cited by examiner

Decrement of dislocations by a pit made by facets (a) a pit made by facets average growing direction (b) after continual growth 10 planar defect 11 linear defect assembly Movements of dislocations inside a pit made by facets Facet growth Growing method of the present invention Relation between mask and voluminous defect accumulating region H in the present invention (a) arrangement of mask (b) after growing thick AlInGaN Prism shaped growth of the present invention AlInGaN substrate of the present invention Crystal composition on surface (a) stripe along <1-100> direction voluminous defect accumulating region H C-plane growth region Y low dislocation single crystal region Z (b) stripe along <11-20> direction Embodiment 1

Processes of producing an $Al_{0.8}Ga_{0.2}N$ substrate

Embodiment 2

Processes of producing an $In_{0.9}Ga_{0.1}N$ substrate

Embodiment 3

Processes of producing $Al_{0.3}In_{0.3}Ga_{0.4}N$ substrate (1)

(2)

(3)

Embodiment 4, 5, 6

Embodiment 4

Embodiment 5

Embodiment 6

$AL_xIN_yGA_{1-x-y}N$ MIXTURE CRYSTAL SUBSTRATE, METHOD OF GROWING $AL_xIN_yGA_{1-x-y}N$ MIXTURE CRYSTAL SUBSTRATE AND METHOD OF PRODUCING $AL_xIN_yGA_{1-x-y}N$ MIXTURE CRYSTAL SUBSTRATE

BACKGROUND OF THE INVENTION

1. Field of the Invention

This invention relates to an aluminum indium gallium nitride ($Al_xIn_yGa_{1-x-y}N$: $0 \leq x \leq 1$, $0 \leq y \leq 1$, $0 < x+y \leq 1$) mixture crystal substrate for producing ultraviolet, blue light emitting diodes (LEDs) and ultraviolet, blue light laser diodes (LDs) composed of groups 3-5 nitride type semiconductors, a method of growing an aluminum indium gallium nitride ($Al_xIn_yGa_{1-x-y}N$: $0 \leq x \leq 1$, $0 \leq y \leq 1$, $0 < x+y \leq 1$) mixture crystal substrate, and a method of producing an aluminum indium gallium nitride ($Al_xIn_yGa_{1-x-y}N$: $0 \leq x \leq 1$, $0 \leq y \leq 1$, $0 < x+y \leq 1$) substrate.

This application claims the priority of Japanese Patent Applications No. 2001-311018 filed on Oct. 9, 2001 and No. 2002-269387 filed on Sep. 17, 2002, which are incorporated herein by reference.

A substrate means a thick freestanding base plate on which thin films are grown. A substrate should not be confused with thin films of similar components. The scope of component ratios of the $Al_xIn_yGa_{1-x-y}N$ mixture crystals of the present invention is defined by mixture parameters x and y. Designated ranges are $0 \leq x \leq 1$, $0 \leq y \leq 1$ and $0 < x+y \leq 1$. When x=0, $Al_xIn_yGa_{1-x-y}N$ means $In_yGa_{1-y}N$ ($0 < y \leq 1$; abbr. InGaN). No prior art of making InGaN substrates was found. When y=0, $Al_xIn_yGa_{1-x-y}N$ means $Al_xGa_{1-x}N$ ($0 < x \leq 1$; abbr. AlGaN). The inventors have found no prior art of making AlGaN substrate yet. The third inequality $0 < x+y \leq 1$ forbids the case that x and y simultaneously take 0 value (x=0 and y=0). Thus GaN is excluded from the collective expression of $Al_xIn_yGa_{1-x-y}N$ ($0 \leq x \leq 1$, $0 \leq y \leq 1$, $0 < x+y \leq 1$) of the present invention. GaN is excluded from the scope of the present invention. When x and y are not zero, $Al_xIn_yGa_{1-x-y}N$ is sometimes abbreviated to AlInGaN. No prior art of producing AlInGaN substrates has been found.

The bandgap energy Eg of a semiconductor is proportional to an inverse of the wavelength λ of light which is absorbed into or emitted from the semiconductor. A simple inverse relation λ(nm)=1239.8/Eg(eV) holds between Eg and λ. Gallium nitride has a bandgap of 3.2 eV. Emission or absorption light wavelength is 387 nm for GaN. Aluminum nitride AlN has a high bandgap energy Eg=6.2 eV. Emission or absorption light wavelength is 200 nm for AlN. Indium nitride InN has a low bandgap energy of Eg=0.9 eV. Emission or absorption light wavelength is 1378 nm for InN. If light emitting devices having a light receiving layer composed of aluminum indium gallium nitride $Al_xIn_yGa_{1-x-y}N$ were produced, the devices could produce various light having a wide range wavelength between about 200 nm and about 1300 nm. However, such devices relying upon nitride semiconductors have not been made yet. The reason why such nitride semiconductor devices have not been made is that no pertinent substrates are available. Light emitting devices (light emitting diodes or laser diodes) are made by preparing a substrate wafer, growing several semiconductor thin films on the substrate, etching some regions of some films, doping the films with dopants and forming electrodes. The substrate is a starting material. The lattice constant of aluminum nitride (AlN) is 0.3112 nm. The lattice constant of gallium nitride (GaN) is 0.3189 nm. The lattice constant of indium nitride (InN) is 0.3545 nm.

Sapphire (α-$Al_2O_3$) which has been used as a substrate of InGaN-type blue ray LEDs is not a promising candidate for AlInGaN devices. Sapphire is insulating and uncleavable. Sapphire is not a promising candidate for producing nitride semiconductor devices thereon. Nitride semiconductor substrates would be preferable to sapphire as substrates for making nitride light emitting devices.

Among simple nitride compounds GaN, InN and AlN, only GaN substrates can now be produced by the applicant's endeavors. But nobody has succeeded in producing InN substrates or AlN substrates of good quality. Neither InN substrates nor AlN substrates are available at present. If indium nitride InN films were epitaxially grown on an obtainable GaN substrate, large lattice misfit would induce a lot of defects and strong stress in the InN films. If aluminum nitride AlN films were grown on an obtainable GaN substrate, the AlN film would be plagued with many defects. Thus GaN wafer is not a pertinent candidate as a substrate of making $Al_xIn_yGa_{1-x-y}N$ films.

The most suitable substrate for making $Al_xIn_yGa_{1-x-y}N$ ($0 \leq x \leq 1$, $0 \leq y \leq 1$, $0 < x+y \leq 1$) films is an $Al_xIn_yGa_{1-x-y}N$: $0 \leq x \leq 1$, $0 \leq y \leq 1$, $0 < x+y \leq 1$ substrate having the same values of x and y as the epitaxial films. If an $Al_xIn_yGa_{1-x-y}N$ ($0 \leq x \leq 1$, $0 \leq y \leq 1$, $0 < x+y \leq 1$) were obtainable, $Al_xIn_yGa_{1-x-y}N$ films would be grown homoepitaxially on the $Al_xIn_yGa_{1-x-y}N$ substrate.

The purpose of the present invention is to provide an $Al_xIn_yGa_{1-x-y}N$: $0 \leq x \leq 1$, $0 \leq y \leq 1$, $0 < x+y \leq 1$ mixture crystal substrate and a method of producing an $Al_xIn_yGa_{1-x-y}N$: $0 \leq x \leq 1$, $0 \leq y \leq 1$, $0 < x+y \leq 1$ mixture crystal substrate.

2. Description of Related Art

No prior art of $Al_xIn_yGa_{1-x-y}N$: $0 \leq x \leq 1$, $0 \leq y \leq 1$, $0 < x+y \leq 1$ mixture crystal substrates has been found. There are several references about the method of making GaN substrates contrived by the inventors of the present invention. Although $Al_xIn_yGa_{1-x-y}N$: $0 \leq x \leq 1$, $0 \leq y \leq 1$, $0 \leq y \leq 1$, $0 < x+y \leq 1$ does not include GaN, some GaN-related documents are now described instead of $Al_xIn_yGa_{1-x-y}N$ substrates.

The inventors of the present invention contrived a GaAs-based epitaxial lateral overgrowth method (ELO) for making low-dislocation GaN crystals by preparing a GaAs substrate, making an ELO mask having many small regularly-populated windows on the GaAs substrate, and growing GaN films by a vapor phase growing method on the ELO-masked GaAs substrate. The inventors had filed a series of patent applications based on the GaAs-based ELO methods for making GaN crystal bulks.

① Japanese Patent Application No. 9-298300
② Japanese Patent Application No. 10-9008
③ Japanese Patent Application No. 10-102546
(①, ② and ③) have been combined into a PCT application of WO 99/23693.)
④ Japanese Patent Laying Open No. 2000-012900
⑤ Japanese Patent Laying Open No. 2000-022212

The ELO method makes a thin GaN film on an undersubstrate by forming a mask layer (SiN or $SiO_2$) on the undersubstrate, etching small dots aligning in a small regular pattern of an order of micrometers on the mask, forming regularly aligning small windows, growing a GaN layer on the exposed undersubstrate in the windows in vapor phase, making dislocations running upward in a vertical direction at an early stage, turning the dislocations in horizontal directions, inducing collisions of dislocations and reducing the dislocations by the collisions. The ELO method has an advantage of reducing the dislocations by the twice changes to the extending direction of the dislocations. The ELO method enabled the inventors to make a thick (about 100 μm) GaN single crystal.

⑥ Japanese Patent Laying Open No. 2001-102307 (Japanese Patent Application No. 11-273882)

GaN facet growth was proposed in the document ⑥ by the same inventors as the present invention. All the known GaN growing methods had been C-plane growth maintaining a smooth, flat C-plane as a surface of c-axis growing GaN. ⑥ denied the conventional C-plane growth and advocated a new idea of facet growth which grows GaN, makes facets on a growing GaN, forms pits of the facets, maintains the facets and pits without burying pits, pulls dislocations into the facets, attracts the dislocations into the pits, reduces dislocations outside of the pit bottoms and obtains low dislocation density GaN crystals.

FIG. 1 to FIG. 3 show our previous facet growth of GaN. FIG. 1 is an enlarged view of a facet pit on a surface of a GaN crystal during the facet growth. In FIGS. 1($a$) and 1($b$), a GaN crystal 2 is growing in a c-axis direction in average. The GaN crystal 2 has a C-plane top surface 7. Crystallographical planes inclining to the C-plane are called facets 6. The facet growth forms facets 6 and maintains the facets 6 without burying. In the example of FIG. 1, six facets 6 appear and form a polygonal reverse cone pit 4 dug on the C-plane surface 7. The pits 4 built by the facets 6 are hexagonal cones or dodecagonal cones. Hexagonal pits 4 are formed by the six-fold rotation symmetric facets 6 of either $\{11\text{-}2\,m\}$ or $\{1\text{-}10\,m\}$ (m: integer). Dodecagonal pits are composed of $\{11\text{-}2\,m\}$ and $\{1\text{-}10\,m\}$ (m: integer). Although FIG. 1($a$) and FIG. 1($b$) show the hexagonal pit, dodecagonal pits appear prevalently.

To form facet pits, to maintain pits and not to bury pits are the gist of the facet growth. The facet 6 moves in a direction normal to the facet 6. A dislocation extends along a growing direction. A dislocation extending along a c-axis and attaining the facet 6 turns its extending direction in a horizontal direction parallel to the facet 6 and reaches a crossing line 8. The crossing lines 8 include many dislocations. As the top surface 7 moves upward, the dislocations gathering on the crossing lines 8 make defect gathering planes which meet with each other at 60 degrees. Planar defect assemblies 10 are formed below the crossing lines 8 (FIG. 1($b$)). The planar defect assemblies 10 are in a stable state. Some dislocations attaining to the crossing lines 8 turn their extending directions again inward, move inward along the rising slanting crossing lines 8 and fall into a multiple point D (FIG. 2) at a pit bottom. Dislocations substantially run inward in the horizontal directions. A linear defect assembly 11 is formed along the multiple point D at the pit bottom. The linear defect assembly 11 is less stable than the planar defect assemblies 10. FIG. 3 (1) demonstrates the function of the facet pit gathering dislocations. A C-plane surface 17 has a facet pit 14 composed of facets 16. When the C-plane surface 17 and the facets 16 rise, dislocations are attracted into the facet pit 14, pulled into the bottom of the pit 14 and captivated into a bundle 15 of dislocations at the bottom of the pit 14. But the bundle 15 of dislocations is not everlasting. The dislocations once gathering to the bottom again disperse outward. Then dislocations are released. FIG. 3 (2) demonstrates the dispersion of dislocations 15 in radial directions into surrounding portions 12.

The dislocation density rises again in the surroundings of the pits 14. ⑥ was still incompetent to make thick low dislocation AlInGaN crystals.

SUMMARY OF THE INVENTION

This invention proposes a method of making an $Al_xIn_yGa_{1-x-y}N$ ($0 \leq x \leq 1$, $0 \leq y \leq 1$, $0 < x+y \leq 1$) mixture crystal substrate and an $Al_xIn_yGa_{1-x-y}N$ ($0 \leq x \leq 1$, $0 \leq y \leq 1$, $0 < x+y \leq 1$) mixture crystal substrate of low dislocation density. The expression of $Al_xIn_yGa_{1-x-y}N$ includes InN (x=0) and AlN (y=1) but excludes GaN (x=0, y=0, x+y=0). An $Al_xIn_yGa_{1-x-y}N$ crystal having a high x and high bandgap energy has a probability for a starting substrate of making ultraviolet ray LEDs or LDs. Another $Al_xIn_yGa_{1-x-y}N$ having a high y and low bandgap energy has another probability of making new infrared InGaN type LEDs or LDs. There is no prior art for making thick $Al_xIn_yGa_{1-x-y}N$ mixture crystal substrates as explained before.

This invention produces low dislocation density $Al_xIn_yGa_{1-x-y}N$ mixture crystal substrates by preparing an undersubstrate, forming regularly aligning parallel masks and parallel extra exposed parts on the undersubstrate, growing $Al_xIn_yGa_{1-x-y}N$ mixture crystals on the parallel linear masked undersubstrate, forming facet groove bottoms and voluminous defect accumulating regions (H) upon the parallel linear masks, forming single low dislocation density single crystal regions (Z) and extra single crystal regions (Y) on the extra exposed parts, attracting dislocations in the (Z) and (Y) regions via the facets into the voluminous defect accumulating regions (H), arresting the dislocations in the voluminous defect accumulating regions (H) and reducing dislocation densities in the (Z) and (Y) regions.

The present invention succeeds in obtaining a low dislocation density $Al_xIn_yGa_{1-x-y}N$ crystal substrate by forming parallel striped masks on an undersubstrate, growing $Al_xIn_yGa_{1-x-y}N$ crystals on the stripe masked undersubstrate, making parallel facet V-grooves having bottoms just upon the parallel stripe masks, maintaining the facet V-grooves without burying the facet V-grooves by the facet growth, producing voluminous defect accumulating regions (H) at the bottoms of the V-grooves just above the stripe masks, depriving other parts of dislocations by the facets, gathering the dislocations to the voluminous defect accumulating regions (H) at the valleys (bottoms) of the V-grooves and annihilating/accumulating the dislocations in the voluminous defect accumulating regions (H) permanently. The formation of the stripe masks on the undersubstrate enables the present invention to form the voluminous defect accumulating regions (H) just upon the pre-formed stripe masks and to decrease dislocations in the other parts except the voluminous defect accumulating regions.

The present invention can make a low dislocation density $Al_xIn_yGa_{1-x-y}N$ crystal substrate by controlling the positions of the voluminous defect accumulating regions (H) by the linear parallel striped masks. The extra exposed parts produce other portions (Z) and (Y) of the $Al_xIn_yGa_{1-x-y}N$ substrate. The voluminous defect accumulating regions (H) attract and accumulate dislocations which have inherently been in other parts (Z) and (Y). The other parts (Z) and (Y) are low dislocation density single crystals. The dislocations are arrested in the narrow, linearly restricted portions (H) aligning regularly and periodically. The other linear wide portions are low-dislocation density crystals suitable for active layers of LDs or LEDs. The $Al_xIn_yGa_{1-x-y}N$ substrates are suitable for low dislocation substrates for fabricating laser diodes from ultraviolet rays to infrared light.

The present invention employs a vapor phase growth for making $Al_xIn_yGa_{1-x-y}N$, for example, an HVPE method, an MOCVD method, an MOC method and a sublimation method. These methods are described thereinafter.

[1. HVPE method (Hydride Vapor Phase Epitaxy)]

HVPE employs metal aluminum (Al), metal indium (In) and metal gallium (Ga) as aluminum, indium and gallium sources unlike MOCVD or MOC. A nitrogen source is ammonia gas. The HVPE apparatus contains a vertical hot-wall furnace, Al-, In- and Ga-boats sustained at upper spots in the furnace, a susceptor installed at a lower spot in the furnace, top gas inlets, a gas exhausting tube and a vacuum pump. An undersubstrate (sapphire etc.) is put on the susceptor. Metal aluminum solids are supplied to the Al-boat. Metal indium solids are supplied to the In-boat. Metal Ga solids are supplied to the Ga-boat. The furnace is closed and is heated. The Al, In and Ga solids are heated into melts. Hydrogen gas ($H_2$) and hydrochloric acid gas (HCl) are supplied to the Al, In and Ga-melts. Aluminum chloride ($AlCl_3$), indium chloride ($InCl_3$) and gallium chloride (GaCl) are produced. Gaseous $AlCl_3$, $InCl_3$ and GaCl are carried by the hydrogen gas downward to the heated undersubstrate. Hydrogen gas ($H_2$) and ammonia gas ($NH_3$) are supplied to the gaseous $AlCl_3$, $InCl_3$ and GaCl above the susceptor. $Al_xIn_yGa_{1-x-y}N$ is synthesized and is piled upon the undersubstrate for making an $Al_xIn_yGa_{1-x-y}N$ film. The HVPE has an advantage of immunity from carbon contamination, because the Al, In and Ga sources are metallic Al, In and Ga and $AlC_3$, $InCl_3$ and GaCl are once synthesized as intermediates.

[2. MOCVD method (Metallorganic Chemical Vapor Deposition)]

An MOCVD method is the most frequently utilized for growing GaN thin films on sapphire substrates. An MOCVD apparatus includes a cold wall furnace, a susceptor installed in the furnace, a heater contained in the susceptor, gas inlets, a gas exhaustion hole and a vacuum pump. Materials for Al, In and Ga are metallorganic compounds. Usually trimethyl aluminum (TMA) or triethyl aluminum (TEA) is employed as an Al source. Usually trimethyl indium (TMI) or triethyl indium (TEI) is employed as an In source. Usually trimethyl gallium (TMG) or triethyl gallium (TEG) is employed as a Ga source. The material for nitrogen is ammonia gas. A substrate is placed upon the susceptor in the furnace. TMA, TMI and TMG gases, $NH_3$ gas and $H_2$ gas are supplied to the substrate on the heated susceptor. Reaction of ammonia with the TMA, TMI and TMG gases make $Al_xIn_yGa_{1-x-y}N$. $Al_xIn_yGa_{1-x-y}N$ piles upon the substrate. An $Al_xIn_yGa_{1-x-y}N$ film is grown on the substrate. The growing speed is low. If thick $Al_xIn_yGa_{1-x-y}N$ crystals are made by the MOCVD, some problems occur. One is low speed of growth. Another problem is low gas utility rate, which is not a problem for making thin films by consuming small amounts of material gases. The MOCVD requires a large valueme of ammonia gas. High rates of ammonia/TMA, ammonia/TMI and ammonia/TMG raise gas cost in the case of bulk crystal production due to a large consumption of gases. The low gas utility rate causes a serious problem in the case of making a thick $Al_xIn_yGa_{1-x-y}N$ crystal. Another serious problem is carbon contamination. The TMA (Al-material), TMI (In-material) and TMG (Ga-material) include carbon atoms. The carbon atoms contaminate a growing $Al_xIn_yGa_{1-x-y}N$ crystal. The carbon contamination degrades the grown $Al_xIn_yGa_{1-x-y}N$ crystal, because carbon makes deep donors which lower electric conductivity. The carbon contamination changes an inherently transparent $Al_xIn_yGa_{1-x-y}N$ crystal to be yellowish one.

[3. MOC Method (Metallorganic Chloride Method)]

Al, In and Ga materials are metallorganic materials, for example, TMA (trimethylaluminum), TMI (trimethylindium) and TMG (trimethylgallium) like the MOCVD. In the MOC, however, TMA, TMI and TMG do not react directly with ammonia. TMA, TMI and TMG react with HCl gas in a hot wall furnace. The reaction yields aluminum chloride ($AlCl_3$), indium chloride ($InCl_3$) and gallium chloride (GaCl) once. Gaseous $AlCl_3$, $InCl_3$ and GaCl are carried to a heated substrate. $AlCl_3$, $InCl_3$ and GaCl react with ammonia supplied to the substrate and $Al_xIn_yGa_{1-x-y}N$ is synthesized and piled on the substrate. Since $AlCl_3$, $InCl_3$ and GaCl are made at the beginning step, this invention enjoys a small carbon contamination. This method, however, cannot overcome the difficulty of excess gas consumption.

[4. Sublimation Method]

A sublimation method does not utilize gas materials but solid materials. The starting material is $Al_xIn_yGa_{1-x-y}N$ polycrystals. The sublimation method makes an $Al_xIn_yGa_{1-x-y}N$ thin film on an undersubstrate by placing polycrystalline $Al_xIn_yGa_{1-x-y}N$ solid at a place and an undersubstrate at another place in a furnace, heating the furnace, yielding a temperature gradient in the furnace, subliming the solid $Al_xIn_yGa_{1-x-y}N$ into $Al_xIn_yGa_{1-x-y}N$ vapor, transferring the $Al_xIn_yGa_{1-x-y}N$ vapor to the substrate at a lower temperature, and piling $Al_xIn_yGa_{1-x-y}N$ on the substrate.

BRIEF DESCRIPTION OF THE DRAWINGS

FIG. 1(a) exhibits that dislocations are swept inward by growing inclining facets and are stored at the bottom of the pit. FIG. 1(b) shows that mutual repulsion causes six radial planar defects hanging from the corner lines.

FIG. 3(1) demonstrates a bundle of dislocations which are formed with dislocations gathered by the facet growth. FIG. 3(2) demonstrates that the dislocation bundle is not closed but open and strong repulsion releases the once gathered dislocations outward into hazy dislocation dispersion.

FIG. 4(1) indicates that the facet growth concentrates dislocations to the voluminous defect accumulating region (H) at the bottom of the valley. FIG. 4(2) shows the voluminous defect accumulating region (H) at the bottom absorb dislocations by the upward growth.

FIG. 5(a) shows a single facet case having sets of steep slope facets without shallow facets. FIG. 5(b) shows a double facet case having sets of steep slope facets followed by sets of shallow facets.

FIG. 6(a) is a CL plan view of a sample having a stripe mask on an undersubstrate. FIG. 6(b) is a CL plan view of an $Al_xIn_yGa_{1-x-y}N$ crystal having a ZHZYZHZYZ . . . structure of repetitions of a set of a voluminous defect accumulating region (H), a low dislocation single crystal region (Z) and a C-plane growth region (Y).

FIG. 9(a) is a CL plan view of the mirror polished $Al_xIn_yGa_{1-x-y}N$ crystal having a ZHZYZHZYZ . . . periodic structure which is made by forming a stripe mask in parallel to a <1-100> direction of $Al_xIn_yGa_{1-x-y}N$ on an undersubstrate and growing an $Al_xIn_yGa_{1-x-y}N$ crystal epitaxially on the masked undersubstrate. FIG. 9(b) is a CL plan view of the mirror polished $Al_xIn_yGa_{1-x-y}N$ crystal having a ZHZYZHZYZ . . . periodic structure which is made by forming a stripe mask in parallel to a <11-20> direction of $Al_xIn_yGa_{1-x-y}N$ on an undersubstrate and growing an $Al_xIn_yGa_{1-x-y}N$ crystal epitaxially on the masked undersubstrate.

FIG. 10(1) shows a sapphire undersubstrate. FIG. 10(2) denotes a sample having an $Al_{0.8}Ga_{0.2}N$ epi-layer formed on the sapphire undersubstrate. FIG. 10(3) illustrates a stripe mask formed on the $Al_{0.8}Ga_{0.2}N$ epi-layer. FIG. 10(4) shows a CL section of an as-grown $Al_{0.8}Ga_{0.8}N$ sample having a facetted surface with valleys, voluminous defect accumulating regions (H) following the valleys, low dislocation single crystal regions (Z) under the facets and C-plane growth regions (Y) under the flat tops. FIG. 10(5) shows a section of a mirror polished $Al_{0.8}Ga_{0.2}N$ substrate having an HZYZHZYZH . . . structure composed of the voluminous defect accumulating regions (H), low dislocation single crystal regions (Z) and the C-plane growth regions (Y).

FIG. 11(1) shows a sapphire undersubstrate. FIG. 11(2) denotes a sample having an $In_{0.9}Ga_{0.1}N$ epi-layer formed on the sapphire udersubstrate. FIG. 11(3) illustrates a stripe mask formed on the $In_{0.9}Ga_{0.1}N$ epi-layer. FIG. 11(4) shows a CL section of an as-grown $In_{0.9}Ga_{0.1}N$ sample having a facet surface with valleys, voluminous defect accumulating regions (H) following the valleys, low dislocation single crystal regions (Z) under the facets and C-plane growth regions (Y) under the flat tops. FIG. 11(5) shows a section of a mirror polished $In_{0.9}Ga_{0.1}N$ substrate having an HZYZHZYZH . . . structure composed of the voluminous defect accumulating regions (H), low dislocation single crystal regions (Z) and the C-plane growth regions (Y).

FIG. 12(1) shows a foreign material undersubstrate with a stripe mask. FIG. 12(2) denotes a CL section of an as-grown $Al_{0.3}In_{0.3}Ga_{0.4}N$ sample having a facet surface with valleys, voluminous defect accumulating regions (H) following the valleys, low dislocation single crystal regions (Z) under the facets and C-plane growth regions (Y) under the flat tops. FIG. 12(3) shows a section of a mirror polished $Al_{0.3}In_{0.3}Ga_{0.4}N$ substrate having an HZYZHZYZH . . . structure composed of the voluminous defect accumulating regions (H), low dislocation single crystal regions (Z) and the C-plane growth regions (Y).

FIG. 13(1) is a section of the prepared $Al_xIn_yGa_{1-x-y}N$ undersubstrate having an inherent structure . . . HZYZHZYZH . . . , which is observable in a CL image. FIG. 13(2) is a CL-observed section of a thick-grown $Al_xIn_yGa_{1-x-y}N$ ingot having H, Z and Y grown on the H, Z and Y regions of the parent $Al_xIn_yGa_{1-x-y}N$ substrate. FIG. 13(3) is CL-observed sections of a plurality of $Al_xIn_yGa_{1-x-y}N$ wafers sliced from the tall $Al_xIn_yGa_{1-x-y}N$ ingot.

DETAILED DESCRIPTION OF THE PREFERRED EMBODIMENTS

Figure 7:
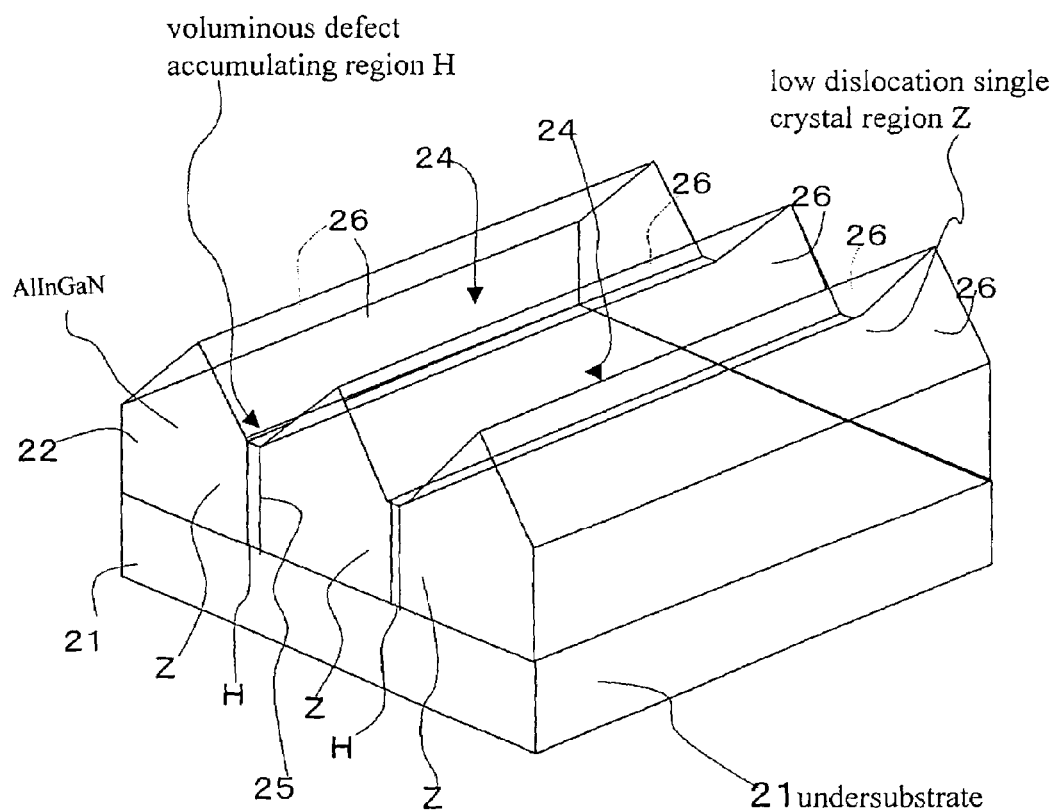
FIG. 7 is an oblique view of a rack-shaped as-grown $Al_xIn_yGa_{1-x-y}N$ crystal having a ZHZHZ . . . periodic structure of repetitions of a set of a voluminous defect accumulating region (H) and a low dislocation single crystal region (Z) which are made by forming a stripe mask on an undersubstrate and growing an $Al_xIn_yGa_{1-x-y}N$ crystal epitaxially on the masked undersubstrate.
Figure 8:
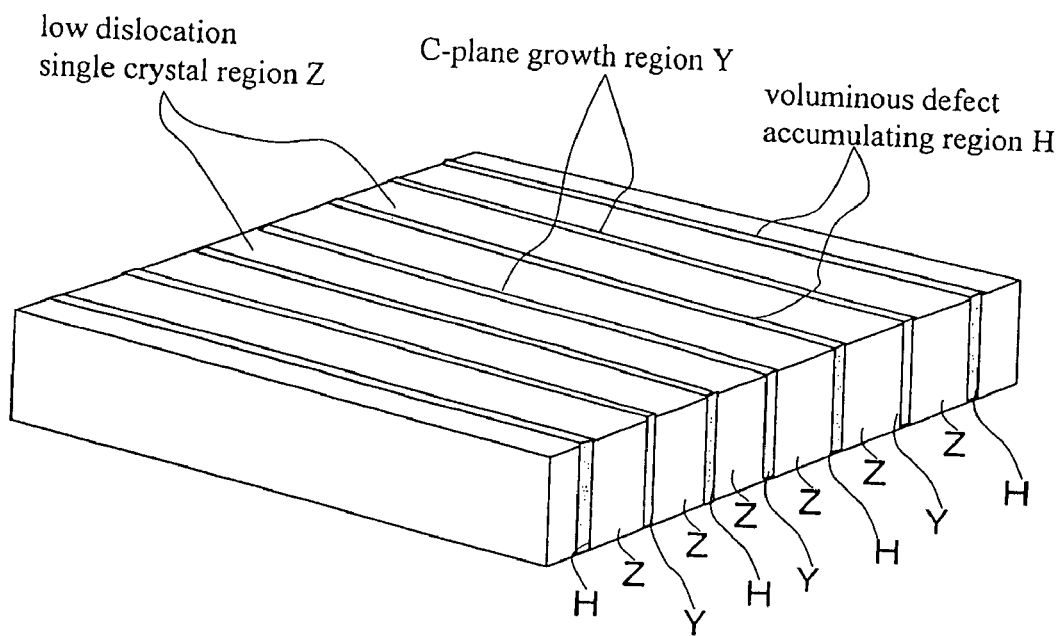
FIG. 8 is a perspective CL view of a mirror polished $Al_xIn_yGa_{1-x-y}N$ crystal having a ZHZYZHZYZ . . . periodic structure of repetitions of a set of a voluminous defect accumulating region (H), a low dislocation single crystal region (Z) and a C-plane growth region (Y) which are made by forming a stripe mask on an undersubstrate and growing an $Al_xIn_yGa_{1-x-y}N$ crystal epitaxially on the masked undersubstrate.

The present invention includes various versions. The present invention grows an $Al_xIn_yGa_{1-x-y}N$ ($0 \leq x \leq 1$, $0 \leq y \leq 1$, $0 < x+y \leq 1$) crystal by making a parallel linear stripe mask on an undersubstrate, growing $Al_xIn_yGa_{1-x-y}N$ ($0 \leq x \leq 1$, $0 \leq y \leq 1$, $0 < x+y \leq 1$) crystals in vapor phase on the stripe-masked undersubstrate, forming linear V-grooves (valleys and hills) made of pairs of facets, maintaining the valleys and hills, inducing voluminous defect accumulating regions (H) under the valleys (bottoms) and making low dislocation single crystal regions (Z) under the facets (except bottoms) as illustrated in FIG. 7. Interfaces (K) or cores (S) of the voluminous defect accumulating regions (H) attract dislocations from the low dislocation single crystal regions (Z), annihilate parts of dislocations, and accumulate other dislocations.

The present invention reduces dislocations by making use of the interface (K) or the core (S) as a dislocation annihilation/accumulation place.

The present invention gives a method of growing an $Al_xIn_yGa_{1-x-y}N$ crystal by making linear voluminous defect accumulating regions (H), producing low dislocation single crystal regions (Z) in contact with the voluminous defect accumulating regions (H), utilizing interfaces (K) or cores (S) of the voluminous defect accumulating regions (H) as dislocation annihilation/accumulation places, and reducing dislocations in the other parts except the voluminous defect accumulating regions (H).

The present invention gives a method of growing an $Al_xIn_yGa_{1-x-y}N$ crystal by making linear voluminous defect accumulating regions (H), producing facet slopes in contact with the voluminous defect accumulating regions (H), maintaining the facet slopes, utilizing interfaces (K) or cores (S) of the voluminous defect accumulating regions (H) as dislocation annihilation/accumulation places, and reducing dislocations in the other parts except the voluminous defect accumulating regions (H).

For clarifying the relation between the facet slopes and the voluminous defect accumulating regions (H), the present invention is defined as a method of growing an $Al_xIn_yGa_{1-x-y}N$ crystal by making linear voluminous defect accumulating regions (H), producing facet slopes with valleys, the valleys being in contact with the voluminous defect accumulating regions (H), maintaining the facet slopes, utilizing interfaces (K) or cores (S) of the voluminous defect accumulating regions (H) as dislocation annihilation/accumulation places, and reducing dislocations in the other parts except the voluminous defect accumulating regions (H).

$Al_xIn_yGa_{1-x-y}N$ crystals grow in practice with a plurality of linear voluminous defect accumulating regions (H). The method is defined by making a plurality of linear voluminous defect accumulating regions (H), producing linear facet slopes neighboring the voluminous defect accumulating regions (H), maintaining the facet slopes, and reducing dislocations in the other parts except the voluminous defect accumulating regions (H).

For clarifying the relation between the facet slopes and the voluminous defect accumulating regions (H), the present invention is defined as a method of growing an $Al_xIn_yGa_{1-x-y}N$ crystal by making a plurality of linear voluminous defect accumulating regions (H), producing linear facet slopes with valleys, the valleys being in contact with the voluminous defect accumulating regions (H), and reducing dislocations in the other parts except the voluminous defect accumulating regions (H).

Pairs of linearly parallel extending facets make valleys, which leads the voluminous defect accumulating regions (H). The shape of parallel valleys looks like lying prisms. Sometimes the prism-shaped facet slopes are optically symmetric.

The symmetric lying prism-shaped facet slopes have flat tops between the pairing slopes.

When the voluminous defect accumulating regions (H) extend in a <1-100> and in a <0001> direction, the facets are denoted by {kk-2kn} (k,n integers).

Most prevalent facets are {11-22} planes in the case. The voluminous defect accumulating regions (H) can otherwise extend in <11-20> direction and in a <1-100> direction. When the voluminous defect accumulating regions (H) extend in a <11-20> and in a <0001> direction, the facets are denoted by {k-k0n} (k,n integers).

Most prevalent facets are {1-101} planes in the case.

In the case of the symmetric prism-shaped facet slopes having flat tops, the extending direction of voluminous defect accumulating regions (H) is either a <1-100> direction or a <11-20> direction. The facets are {11-22} planes, {1-101} planes, {kk-2kn} or {k-k0n} (n, k; integers). The flat tops are (0001) planes and sometimes vary the width and the edge lines.

Voluminous defect accumulating regions (H) are the most significant parts in the present invention. The voluminous defect accumulating regions (H) are parallel continual planes with a definite width and extend both in a vertical direction and in a horizontal direction parallel to the mask stripes. Excess thick grown $Al_xIn_yGa_{1-x-y}N$ or anomalously grown $Al_xIn_yGa_{1-x-y}N$ has sometimes intermittent, dotted, discontinuous defect accumulating regions (H) with a fluctuating thickness. Since the width is fluctuating, the word "voluminous" should be improper.

Voluminous defect accumulating regions (H) have variations. One of the variations of the voluminous defect accumulating regions (H) is a polycrystalline voluminous defect accumulating region (H).

Otherwise the voluminous defect accumulating regions (H) are single crystals. A set of milder inclining facets appears at valleys, following steeper facets. The voluminous defect accumulating regions (H) grow just under the milder facets.

In this case, the voluminous defect accumulating region (H) has vertical interfaces (K) and (K) which coincide with the boundaries between the milder facets (on H) and the steeper facets (on Z).

Some voluminous defect accumulating regions (H) grow with vertical interfaces (K) composed of planar defects.

Some voluminous defect accumulating regions (H) grow as single crystals having an orientation slightly slanting to an orientation of the neighboring low dislocation single crystal regions (Z).

Some voluminous defect accumulating regions (H), which are formed by milder facets, coincide with an area of the milder facets at the top. Some voluminous defect accumulating regions (H) grow with the same orientation as the milder facets.

Some voluminous defect accumulating regions (H) grow with planar defects under the milder facets.

A very miracle phenomenon sometimes occurs in some voluminous defect accumulating regions (H). It is inversion of polarity (c-axis). The c-axis of the voluminous defect accumulating regions (H) turns over into an inverse direction. As mentioned before, an $Al_xIn_yGa_{1-x-y}N$ crystal lacks inversion symmetry. $Al_xIn_yGa_{1-x-y}N$ has (anisotropic) polarity at a [0001] axis. A (0001) plane has a different property from a (000-1) plane. It is interesting that the polarity inversion happens in the voluminous defect accumulating regions (H). In this inversion case, the voluminous defect accumulating regions (H) grow with a c-axis antiparallel to the c-axis of the neighboring steeper facets leading the low dislocation single crystal regions (Z).

In the inversion case, the voluminous defect accumulating regions (H) grow with a [000-1] axis, but the neighboring steeper facets (on Z) grow with a [0001] axis.

When the extension of the voluminous defect accumulating regions (H) is a <1-100> direction, the milder facets (on H) are {11-2-5} planes or {11-2-6} planes. A minus n index means the polarity inversion.

If no inversion takes place, the milder (shallower) facets (on H) are {11-25} planes or {11-26} planes for the voluminous defect accumulating regions (H) extending in a <1-100> direction.

Optimum ranges of parameters are described. The width (h) of a voluminous defect accumulating region (H) is available in the range of 1 µm to 200 µm.

The least width h of a voluminous defect accumulating region (H) is 1 µm. Width (h) under 1 µm are inoperative. The upper limit is 200 µm. Widths more than 200 µm induce disorder of a crystal structure. The width (z) of a low dislocation single crystal region (Z) is suitable in the range of 10 µm to 2000 µm.

Widths z less than 10 µm are inoperative. Widths more than 2000 µm induce distortion of facets or crystal defects.

Practical utility as an $Al_xIn_yGa_{1-x-y}N$ wafer requires regularly and periodically aligning voluminous defect accumulating regions (H) for allowing low dislocation single crystal regions (Z) to regularly and periodically align therebetween.

The optimum range of a pitch p of the voluminous defect accumulating regions (H) is 20 µm to 2000 µm. Pitches longer than 2000 µm induce distortion of facets and crystal defects.

Low dislocation single crystal regions (Z) are made by the fundamental process of making a mask having stripes on an undersubstrate, growing voluminous defect accumulating regions (H) on the stripes, and growing low dislocation single crystal regions (Z) on unmasked parts.

The seed mask is composed of a plurality of parallel linear stripes deposited upon an undersubstrate.

The seed mask induces different behavior of growing an $Al_xIn_yGa_{1-x-y}N$ crystal. Steeper facets grow on unmasked undersubstrate, leading $Al_xIn_yGa_{1-x-y}N$ crystals. Milder facets grow on mask seeds, leading voluminous defect accumulating regions (H).

Candidates for a material of the seed mask are described. The mask can be made of silicon dioxide ($SiO_2$) or silicon nitride ($Si_3N_4$). Otherwise, the mask is made of platinum (Pt) or tungsten (W).

Alternatively, the mask is made of polycrystalline aluminum nitride (AlN) or polycrystalline gallium nitride ($Al_xIn_yGa_{1-x-y}N$).

Further, the mask can be made of $SiO_2$ covered with polycrystalline $Al_xIn_yGa_{1-x-y}N$ on the surface. All of the masks are useful for making voluminous defect accumulating regions (H).

There are variations of methods of making the masks. One method is to make a mask by piling an $Al_xIn_yGa_{1-x-y}N$ epi-layer on an undersubstrate, depositing a mask layer on the $Al_xIn_yGa_{1-x-y}N$ epi-layer, patterning the mask layer into a suitable mask shape at positions predetermined for producing voluminous defect accumulating regions (H) by photolithography, and growing $Al_xIn_yGa_{1-x-y}N$ on the masked $Al_xIn_yGa_{1-x-y}N$ epi-layer.

Another method is to make a mask by directly depositing a mask layer on an undersubstrate, patterning the mask layer into a suitable mask shape at positions predetermined for producing voluminous defect accumulating regions (H) by photolithography, and growing $Al_xIn_yGa_{1-x-y}N$ on the masked $Al_xIn_yGa_{1-x-y}N$ epi-layer. In the latter case, there are two versions for the $Al_xIn_yGa_{1-x-y}N$ growth. One version is to grow a buffer layer at a lower temperature on the masked undersubstrate and to grow a thick $Al_xIn_yGa_{1-x-y}N$ layer at a higher temperature on the buffer layer. The other is to grow a thick $Al_xIn_yGa_{1-x-y}N$ layer at a higher temperature directly on the masked undersubstrate.

In addition to the stripe mask as a seed for generating a voluminous defect accumulating region (H), an ELO (epitaxial lateral overgrowth) mask can be made on an undersubstrate at the same time. An $Al_xIn_yGa_{1-x-y}N$ crystal is grown on an undersubstrate covered with both the ELO mask and the stripe seed mask. The co-operation of the ELO mask and the stripe seed mask can be also applied to the aforementioned processes.

Seed masks of the present invention should have parameters within favorable ranges. The optimum ranges of the width h of the linear voluminous defect accumulating region (H) are 10 µm to 250 µm.

Mask stripes align in parallel with each other with an equal pitch. Pitches are 20 µm to 2000 µm.

An $Al_xIn_yGa_{1-x-y}N$ crystal substrate is made from a grown $Al_xIn_yGa_{1-x-y}N$ crystal by the following processes. An $Al_xIn_yGa_{1-x-y}N$ crystal grows with many parallel linear voluminous defect accumulating regions (H), linear low dislocation single crystal regions (Z) and linear C-plane growth regions (Y). Dislocations in the low dislocation single crystal regions (Z) and the C-plane growth regions (Y) are reduced by making the best use of the voluminous defect accumulating regions (H) as dislocation annihilation/accumulation places. An as-grown $Al_xIn_yGa_{1-x-y}N$ crystal substrate with low dislocation density single crystal regions (Z) and the C-plane growth regions (Y) is obtained. The as-grown $Al_xIn_yGa_{1-x-y}N$ substrate is treated by mechanical processing (slicing, lapping or grinding). The $Al_xIn_yGa_{1-x-y}N$ substrate is finished by polishing into an $Al_xIn_yGa_{1-x-y}N$ mirror wafer with a smooth flat surface.

The present invention makes a flat, smooth $Al_xIn_yGa_{1-x-y}N$ substrate by forming parallel facet-building valleys on a growing $Al_xIn_yGa_{1-x-y}N$ crystal, yielding voluminous defect accumulating regions (H) at the valleys, absorbing dislocations in surrounding low dislocation single crystal regions (Z) and C-plane growth regions (Y), annihilating and accumulating the dislocations in the voluminous defect accumulating regions (H), processing an as-grown $Al_xIn_yGa_{1-x-y}N$ crystal by mechanical processing, and polishing surfaces of the $Al_xIn_yGa_{1-x-y}N$ crystal.

The mechanical processing includes at least one of slicing, grinding, or lapping processing.

The undersubstrate is an $Al_xIn_yGa_{1-x-y}N$, sapphire, SiC, spinel, GaAs or Si substrate.

An $Al_xIn_yGa_{1-x-y}N$ crystal substrate of the present invention has a surface including linear low dislocation single crystal regions (Z) with interfaces (K) on both side and parallel linear voluminous defect accumulating regions (H) in contact with the low dislocation single crystal regions (Z) via the interface (K). This means that the $Al_xIn_yGa_{1-x-y}N$ crystal substrate has a surface having an "HKZKH" structure. Since the interfaces intervene between (H) and (Z), the symbol (K) will be omitted in symbolized expression of structures. The surface of the $Al_xIn_yGa_{1-x-y}N$ is denoted simply by a single "HZH" structure. $Al_xIn_yGa_{1-x-y}N$ is defined by the attribute of a surface.

An $Al_xIn_yGa_{1-x-y}N$ crystal substrate of the present invention has a surface including a plurality of regular, periodical repetitions of parallel linear low dislocation single crystal regions (Z) with interfaces on both side and parallel linear voluminous defect accumulating regions (H) in contact with the low dislocation single crystal regions (Z) via the interfaces. This means an $Al_xIn_yGa_{1-x-y}N$ crystal substrate of a surface having an indefinite number of an "HZHZHZ . . . " structure. The structure can be abbreviated to a-(HZ)$^m$-structure. $Al_xIn_yGa_{1-x-y}N$ is defined by an attribute of a surface.

An $Al_xIn_yGa_{1-x-y}N$ crystal substrate of the present invention includes planar low dislocation single crystal regions (Z) extending also in a thickness direction with planar interfaces (K) on both side and parallel planar voluminous defect accumulating regions (H) in contact with the planar low dislocation single crystal regions (Z) via the planar interfaces (K). This means that the $Al_xIn_yGa_{1-x-y}N$ crystal substrate has a voluminous HZH structure in three dimensions. $Al_xIn_yGa_{1-x-y}N$ is defined by the attribute of a voluminous structure.

An $Al_xIn_yGa_{1-x-y}N$ crystal substrate of the present invention includes a plurality of regular, periodical repetitions of planar parallel low dislocation single crystal regions (Z) with planar interfaces on both side and parallel planar voluminous defect accumulating regions (H) in contact with the low dislocation single crystal regions (Z) via the interfaces. This means that the $Al_xIn_yGa_{1-x-y}N$ crystal substrate has an indefinite number of a voluminous "HZHZHZ . . . " structure. The structure can be abbreviated to a-(HZ)$^m$-structure. $Al_xIn_yGa_{1-x-y}N$ is defined by the attribute of a voluminous structure.

An $Al_xIn_yGa_{1-x-y}N$ crystal substrate of the present invention has a surface including linear C-plane growth regions (Y) of high resistivity, two linear low dislocation single crystal regions (Z) sandwiching the C-plane growth regions (Y) and parallel linear voluminous defect accumulating regions (H) in contact with the low dislocation single crystal regions (Z). Electric resistivity of the low dislocation single crystal regions (Z) is lower than that of the C-plane growth regions (Y). This means that the $Al_xIn_yGa_{1-x-y}N$ crystal substrate has a surface having an "HZYZH" structure. $Al_xIn_yGa_{1-x-y}N$ is defined by the attribute of a surface.

Polarity inversion of the voluminous defect accumulating regions (H) enables the voluminous defect accumulating regions (H) to control the shape of facets. The reason is that the polarity inversion delays the growing speed of the voluminous defect accumulating regions (H).

An $Al_xIn_yGa_{1-x-y}N$ crystal substrate of the present invention has a surface including a plurality of regular, periodical repetitions of a linear C-plane growth region (Y) of high resistivity, two linear low dislocation single crystal regions (Z) sandwiching the C-plane growth region (Y) and parallel linear voluminous defect accumulating regions (H) in contact with the low dislocation single crystal regions (Z). Electric resistivity of the low dislocation single crystal regions (Z) is lower than that of the C-plane growth regions (Y). This means that the $Al_xIn_yGa_{1-x-y}N$ crystal substrate has a surface having a " . . . HZYZHZYZHZYZ . . . " structure. The surface of the $Al_xIn_yGa_{1-x-y}N$ is denoted simply by an indefinite number of " . . . HZYZHZ . . . " structure. The abbreviated expression is -(HZYZ)$^m$-. $Al_xIn_yGa_{1-x-y}N$ is defined by the attribute of a surface.

The C-plane growth regions (Y), which accompany flat tops, have electric resistance higher than the other parts (Z) growing with {11-22} planes. The variance originates from the difference of doping rates through different index planes. The C-plane is plagued by a poor doping rate. The facets are rich in the ability of absorbing dopants. The facet-guided low dislocation single crystal regions (Z) are endowed with high conductivity.

The low dislocation single crystal regions (Z) and the C-plane growth regions (Y), which have the same orientation, have different conductivities resulting from the growing plane difference.

An $Al_xIn_yGa_{1-x-y}N$ crystal substrate of the present invention includes a planar C-plane growth region (Y) of high resistivity, two parallel planar low dislocation single crystal regions (Z) sandwiching the C-plane growth region (Y) and parallel planar voluminous defect accumulating regions (H) in contact with the low dislocation single crystal regions (Z). Electric resistivity of the low dislocation single crystal regions (Z) is lower than that of the C-plane growth regions (Y). This means that the $Al_xIn_yGa_{1-x-y}N$ crystal substrate has a voluminous HKZYZKH structure. The surface of the $Al_xIn_yGa_{1-x-y}N$ is denoted simply by a single "HZYZH" structure by omitting K. $Al_xIn_yGa_{1-x-y}N$ is defined by the attribute of a voluminous structure.

An $Al_xIn_yGa_{1-x-y}N$ crystal substrate of the present invention includes a plurality of regular, periodical repetitions of a planar C-plane growth region (Y) of high resistivity, two parallel planar low dislocation single crystal regions (Z) sandwiching the C-plane growth region (Y) and parallel planar voluminous defect accumulating regions (H) in contact with the low dislocation single crystal regions (Z). This means that the $Al_xIn_yGa_{1-x-y}N$ crystal substrate has a . . . HKZYZKH-KZYZKHKZYZKH . . . structure. The surface of $Al_xIn_y$ $Ga_{1-x-y}N$ is denoted simply by an indefinite number of " . . . HZYZHZ . . . " structure by omitting K. The abbreviated expression is $-(HZYZ)_m-$. $Al_xIn_yGa_{1-x-y}N$ is defined by the attribute of a voluminous structure.

In the $Al_xIn_yGa_{1-x-y}N$ substrate of the present invention, the voluminous defect accumulating regions (H) and the low dislocation single crystal regions (Z) penetrate the substrate from the surface to the bottom.

The $Al_xIn_yGa_{1-x-y}N$ having the intermittent, discontinuous defect accumulating regions (H), which enjoys low dislocation density of the low dislocation single crystal regions (Z), is included within the scope of the present invention.

Variations and attributes of the voluminous defect accumulating regions (H) are described. A voluminous defect accumulating region (H) is a polycrystal. A crystal boundary (K) as an interface intervenes between the polycrystalline voluminous defect accumulating region (H) and the surrounding low dislocation single crystal region (Z).

In many cases, however, a voluminous defect accumulating region (H) is a single crystal enclosed by planar defects as an interface (K). The planar defect intervenes between the single crystal voluminous defect accumulating regions (H) and the low dislocation single crystal region (Z).

A voluminous defect accumulating region (H) is a single crystal including threading dislocation bundles.

A voluminous defect accumulating region (H) is a single crystal including threading dislocations and planar defects.

A voluminous defect accumulating region (H) is a single crystal having an orientation slightly slanting to the orientation of the surrounding low dislocation single crystal regions (Z).

A voluminous defect accumulating region (H) is a single crystal having threading dislocations and planar defects and being shielded by the planar defects as an interface from the surrounding low dislocation single crystal regions (Z).

A voluminous defect accumulating region (H) is a single crystal having planar defects extending in the length direction and being shielded by the planar defects as an interface from the surrounding low dislocation single crystal regions (Z).

An $Al_xIn_yGa_{1-x-y}N$ substrate has a surface of a (0001) plane (C-plane).

A voluminous defect accumulating region (H) is a single crystal having a c-axis antiparallel (inverse) to the c-axis of the surrounding low dislocation single crystal regions (Z). Namely, the voluminous defect accumulating regions (H) have an inverse polarity to the surrounding regions (Y) and (Z).

A voluminous defect accumulating region (H) is a single crystal having a c-axis antiparallel (inverse) to the c-axis of the surrounding low dislocation single crystal regions (Z) and being shielded by planar defects from the low dislocation single crystal regions (Z).

A voluminous defect accumulating region (H) is a single crystal including threading dislocations in an inner core (S) and having a c-axis antiparallel (inverse) to the c-axis of the surrounding low dislocation single crystal regions (Z).

A voluminous defect accumulating region (H) is a single crystal including threading dislocations in an inner core (S) and having a c-axis antiparallel (inverse) to the c-axis of the surrounding low dislocation single crystal regions (Z).

A voluminous defect accumulating region (H) is a single crystal having a c-axis slightly slanting to a direction antiparallel (inverse) to the c-axis of the surrounding low dislocation single crystal regions (Z).

A voluminous defect accumulating region (H) is a single crystal including threading dislocations and planar defects, having a c-axis antiparallel (inverse) to the c-axis of the surrounding low dislocation single crystal regions (Z) and being shielded by the planar defects as an interface from the low dislocation single crystal regions (Z).

A voluminous defect accumulating region (H) is a single crystal including planar defects extending in the length direction, having a c-axis antiparallel (inverse) to the c-axis of the surrounding low dislocation single crystal regions (Z) and being shielded by the planar defects as an interface from the low dislocation single crystal regions (Z).

A voluminous defect accumulating region (H) is a single crystal having a c-axis antiparallel (inverse) to the c-axis of the surrounding low dislocation single crystal regions (Z). The surrounding low dislocations regions (Z) and (Y) have surfaces of a (0001) Ga plane. But, the voluminous defect accumulating regions (H) have surfaces of a (000-1)N plane.

An extending direction of superficial parallel low dislocation single crystal regions (Z) and superficial parallel voluminous defect accumulating regions (H) appearing on an $Al_xIn_yGa_{1-x-y}N$ crystal is either a <1-100> direction or a <11-20> direction.

Planar low dislocation single crystal regions (Z) and planar voluminous defect accumulating regions (H) are parallel to both a <1-100> direction and a <0001> direction.

Planar low dislocation single crystal regions (Z) and planar voluminous defect accumulating regions (H) are parallel to both a <11-20> direction and a <0001> direction.

The low dislocation single crystal region (Z) has a range from 10 µm to 2000 µm. An annotation is required. When no C-plane growth region (Y) exists, the above width (10 µm-2000 µm) signifies just the width z of the low dislocation single crystal region (Z). But, when a C-plane (Y) intervenes between two neighboring low dislocation single crystal regions (Z), the above width (10 µm-2000 µm) means the sum (2z+y) of widths of two low dislocation single crystal regions (Z) and a C-plane growth region (Y).

The width of a low dislocation single crystal region (Z) is preferable in the range from 100 µm to 800 µm. A similar annotation is required. When no C-plane growth region (Y) exists, the above width (100 µm-800 µm) signifies just the width z of the low dislocation single crystal region (Z). But, when a C-plane (Y) intervenes between two neighboring low dislocation single crystal regions (Z), the above width (100 µm-800 µm) means the sum (2z+y) of widths of two low dislocation single crystal regions (Z) and a C-plane growth region (Y).

The width of a voluminous defect accumulating region (H) is in the range from 1 µm to 200 µm.

The width of a voluminous defect accumulating region (H) is 10 µm to 80 µm.

The average of dislocation density of low dislocation single crystal regions (Z) is less than $5 \times 10^6$ cm$^{-2}$.

The dislocation density is less than $3 \times 10^7$ cm$^{-2}$ at points distanced by 30 µm from the voluminous defect accumulating regions (H) within the low dislocation single crystal regions (Z).

Dislocation density of low dislocation single crystal regions (Z) is highest in the vicinity of the interface and decreases as a function of the distance from the interface.

A surface of an $Al_xIn_yGa_{1-x-y}N$ substrate has cavities formed at the voluminous defect accumulating regions (H).

The depth of the cavities of the voluminous defect accumulating regions (H) is less than 1 µm.

A voluminous defect accumulating region (H) is a single crystal having a c-axis antiparallel (inverse) to the c-axis of the surrounding low dislocation single crystal regions (Z). The low dislocation single crystal regions (Z) and the C-plane growth regions (Y) have (000-1) planes ((000-1) N planes)

and the voluminous defect accumulating regions (H) have (0001) planes (0001)Ga plane.

A surface of an $Al_xIn_yGa_{1-x-y}N$ substrate has cavities formed at the low dislocation single crystal regions (Z).

The $Al_xIn_yGa_{1-x-y}N$ substrate includes parallel planar voluminous defect accumulating regions (H) periodically and regularly aligning with a pitch p and parallel single crystal regions (Z or Z&Y) sandwiched by two neighboring voluminous defect accumulating regions (H). The parallel single crystal regions are either only low dislocation single crystal regions (Z) or a set ZYZ of two low dislocation single crystal regions (Z) and a C-plane growth region (Y).

Parallel planar voluminous defect accumulating regions (H) align at a constant pitch "p" on an $Al_xIn_yGa_{1-x-y}N$ crystal. The pitch p is allowable in the range from 20 μm to 2000 μm.

The pitch p of the voluminous defect accumulating regions (H) is preferable in the range from 100 μm to 1200 μm.

The $Al_xIn_yGa_{1-x-y}N$ crystal substrate enables makers to produce on- $Al_xIn_yGa_{1-x-y}N$, $Al_xIn_yGa_{1-x-y}N$ laser diodes.

Most frequently appearing facets on a surface of a facet-grown $Al_xIn_yGa_{1-x-y}N$ crystal are {11-22} planes and {1-101} planes. The lengths of an a-axis and a c-axis are denoted by "a" and "c" respectively. A slanting angle $\Theta_a$ of a {11-22} plane to a C-plane is given by $\Theta_a = \tan^{-1}(3^{1/2}a/2c)$. Another slanting angle $\Theta_m$ of a {1-101} plane to a C-plane is given by $\Theta_m = \tan^{-1}(a/c)$.

An $Al_xIn_yGa_{1-x-y}N$ crystal has an a axis of a=0.31892 nm and a c-axis of c=0.51850 nm. A slanting angle $\Theta_a$ of a {11-22} plane to a C-plane is $\Theta_a = \tan^{-1}(3^{1/2}a/2c) = 28.043$ degrees.

A slanting angle H) $\Theta_m$ of a {1-101} plane to a C-plane is $\Theta_m = \tan^{-1}(a/c) = 31.594$ degrees.

Figure 9:
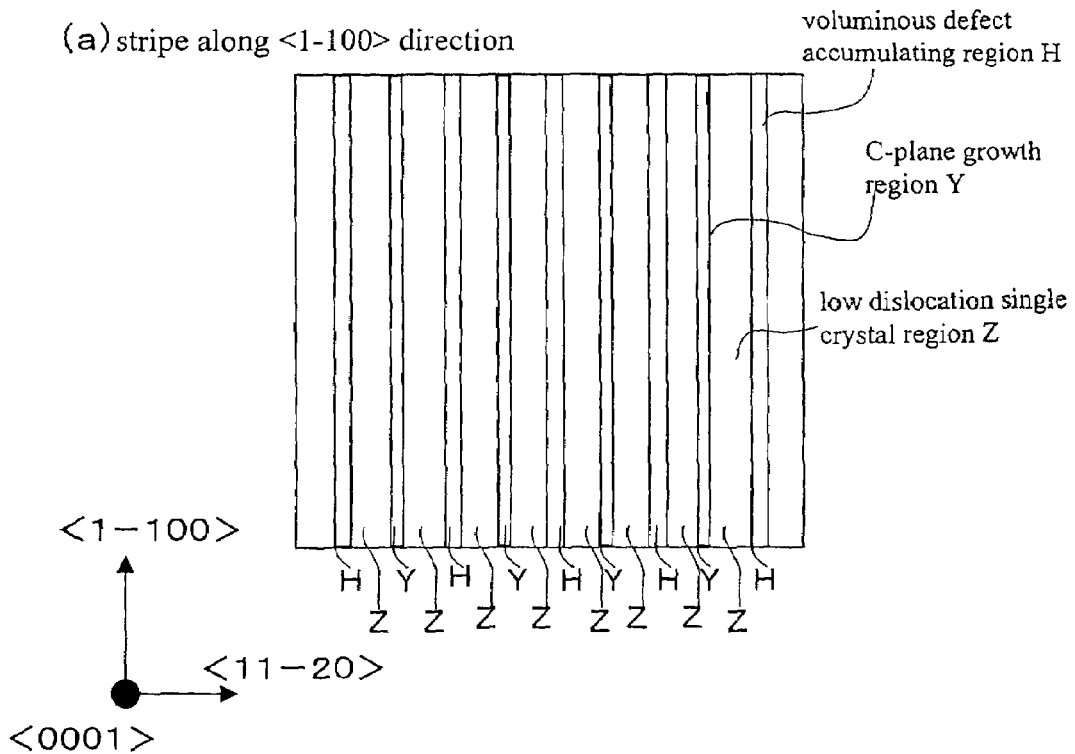
FIGS. 9(a) and 9(b) are CL plan views of mirror polished $Al_xIn_yGa_{1-x-y}N$ crystals having a ZHZYZHZYZ . . . periodic structure of repetitions of a set of a voluminous defect accumulating region (H), a low dislocation single crystal region (Z) and a C-plane growth region (Y) which are made by forming a stripe mask on an undersubstrate and growing an $Al_xIn_yGa_{1-x-y}N$ crystal epitaxially on the masked undersubstrate.
Figure 9:
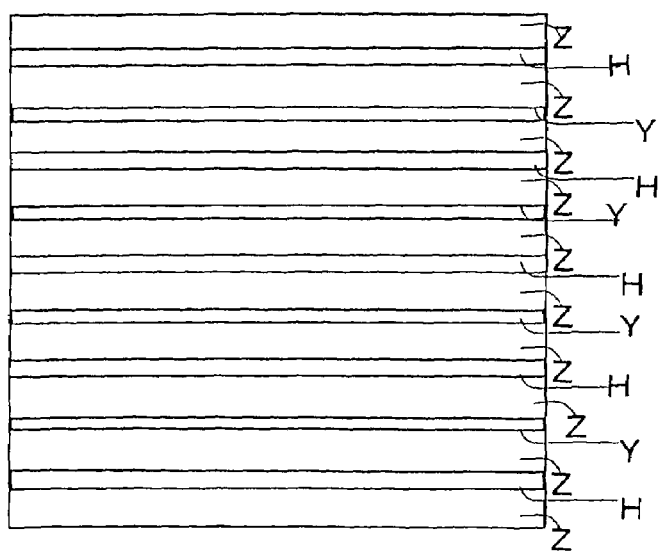

When a <1-100> extending parallel stripe mask is formed upon an undersubstrate as shown in FIG. 9(a), the facet growth makes V-grooves composed of (11-22) facets and (-1-122) facets. A slanting angle of the facets to a C-axis is 28.043 degrees.

The depth of a v-groove is denoted by "V". The width of a voluminous defect accumulating region (H) is designated by "h". The width of a pair of (11-22) and (-1-122) facets is given by $V_{cosec} \Theta_a$. A projection of the facets, which is equal to a width of a low dislocation single crystal region (Z), is given by $z = V \cot \Theta_a$.

A pitch (spatial period) of periodically aligning voluminous defect accumulating regions (H) or C-plane growth regions (Y) is denoted by "p". The pitch (spatial period) is the sum of a voluminous defect accumulating region (H) width h, twice of a facet width z and a C-plane growth region (Y) width y.

$$p = h + y + 2z = h + y + 2V \cot \Theta_a$$

A width s of the stripe mask rules the width h of the voluminous defect accumulating regions (H). The pitch p of the stripe mask is predetermined. The width h and pitch p of the voluminous defect accumulating regions (H) are programmable on the design of the stripe mask. The width h of the voluminous defect accumulating region (H) is in the range from 1 μm to 200 μm. The pitch p of the stripe mask is 20 μm to 2000 μm. The total width (y+2z) of the single crystal regions Z+Y is 10 μm to 2000 μm.

The stripe mask width s and the pitch p determine the width h of the voluminous defect accumulating region (H). The repetition period of a "... HZYZHZYZ..." structure is equal to the mask stripe pitch p.

A small depth of the V-groove gives a definite width y to the C-plane growth region (Y). The deeper the V-groove is, the narrower the C-plane growth region (Y) becomes. When the depth V of the V-groove exceeds a critical depth $V_c$, the C-plane growth region (Y) vanishes. For $V < V_c$, $y \neq 0$. For $V > V_c$, $y = 0$. The critical depth $V_c$ is given by the following, (In the case of a <1-100> extending V-groove)

Critical depth $V_c = (p-h) \tan \Theta_a/2 = 0.307(p-h)$ (In the case of a <11-20> extending V-groove)

Critical depth $V_c = (p-h) \tan \Theta_m/2 = 0.266(p-h)$

Since the pitch p and the stripe width s are predetermined by the mask pattern, the depth V of the V-grooves determines the width y of the C-plane growth region (Y).

If the facet growth maintained $V > V_c$, the facet growth would make a rack-shaped surface without a flat top (y=0). All the embodiments described hereafter have flat tops and C-plane growth regions (Y) with a definite width y.

In Sample A of Embodiment 1, s=50 μm, h=40 μm, p=400 μm, y=30 μm, and thickness T=1250 μm. For the values, the depth V of the V-groove is V=100, μm and the critical V-groove depth $V_c$ is $V_c = 110$ μm. The width z of the accompanying low dislocation single crystal region (Z) is z=165 μm.

Even if a grown $Al_xIn_yGa_{1-x-y}N$ crystal has a depth T which is larger than the critical thickness $V_c$, the depth V does not exceed the critical depth $V_c$.

Another purpose of the present invention is to propose a low cost method of producing $Al_xIn_yGa_{1-x-y}N$ crystal substrates. Such a low cost method reduces the cost by making a thick (tall) $Al_xIn_yGa_{1-x-y}N$ crystal ingot, slicing the thick ingot into a plurality of as-cut $Al_xIn_yGa_{1-x-y}N$ wafers, and mechanically processing the as-cut wafers into a plurality of $Al_xIn_yGa_{1-x-y}N$ mirror wafers. The single epitaxial growth for a plurality of $Al_xIn_yGa_{1-x-y}N$ wafers reduces the cost for one wafer. Another low cost method obtains a plurality of $Al_xIn_yGa_{1-x-y}N$ mirror wafers by forming a striped mask on a foreign material undersubstrate, growing an $Al_xIn_yGa_{1-x-y}N$ crystal upon the masked foreign material undersubstrate, forming linearly extending ribbon-shaped slanting facets, making facet hills and facet valleys which coincide with the stripes, producing voluminous defect accumulating regions (H) under the valleys of facets above the stripes, yielding low dislocation single crystal regions (Z) under the facets, making C-plane growth regions (Y) at flat tops between neighboring reciprocal facets, maintaining the facets, the voluminous defect accumulating regions (H), the low dislocation single crystal regions (Z) and the C-plane growth regions (Y), attracting dislocations from the low dislocation single crystal regions (Z) and the C-plane growth regions (Y) into the voluminous defect accumulating regions (H), reducing dislocations in the low dislocation single crystal regions (Z) and the C-plane growth regions (Y), making a thick tall $Al_xIn_yGa_{1-x-y}N$ crystal ingot, slicing the tall $Al_xIn_yGa_{1-x-y}N$ crystal into a plurality of as-cut wafers, and polishing the as-cut wafers into $Al_xIn_yGa_{1-x-y}N$ mirror wafers.

An $Al_xIn_yGa_{1-x-y}N$ crystal substrate, which was made by the present invention, can be a promising candidate of a seed undersubstrate without stripe mask for growing an $Al_xIn_yGa_{1-x-y}N$ crystal. Namely, the present invention is utilized twice. The $Al_xIn_yGa_{1-x-y}N$ substrate made by the present invention has an inherent structure ... HZHZHZ ... or ... HZYZHZYZHZYZ.... It was discovered that the repetitions of the fundamental components play the same role as striped masks. The $Al_xIn_yGa_{1-x-y}N$ substrate dispenses with a stripe mask. When an $Al_xIn_yGa_{1-x-y}N$ film crystal is grown upon a seed $Al_xIn_yGa_{1-x-y}N$ substrate made by the present invention on a facet growth condition, the $Al_xIn_yGa_{1-x-y}N$ film transcribes the voluminous defect accumulating regions (H)

exactly. Voluminous defect accumulating regions (H) grow just upon the inherent voluminous defect accumulating regions (H) of the substrate $Al_xIn_yGa_{1-x-y}N$. Either low dislocation single crystal regions (Z) or C-plane growth regions (Y) grow on either the inherent low dislocation single crystal regions (Z) or the inherent C-plane growth regions (Y) of the substrate $Al_xIn_yGa_{1-x-y}N$. A child linear voluminous defect accumulating region (H) precisely succeeds a parent linear voluminous defect accumulating region (H) with the same width and the same direction as the parent (H). A film H transcribes a substrate H. H is a heritable feature. The property of a growing voluminous defect accumulating region (H) succeeding a substrate voluminous defect accumulating region (H) is called "H-H succession." The H—H succession is perfect. Positions and sizes of the C-plane growth regions (Y) do not always coincide with parent inherent C-plane growth regions (Y) of the substrate $Al_xIn_yGa_{1-x-y}N$. The sum of growing Z and Y, however, coincides with the sum of substrates Z and Y Z-Z succession is not perfect. Y-Y succession is not perfect. But, (Y+Z)-(Y+Z) succession is perfect. The voluminous defect accumulating region (H) has a different orientation (in the case of single crystal) or a different property (in the case of polycrystal) from surrounding single crystal parts. And the voluminous defect accumulating region (H) is encapsulated by an interface (K). Clear distinctions enable a film voluminous defect accumulating region (H) to succeed a substrate voluminous defect accumulating region (H). But, there is a poor distinction between a low dislocation single crystal region (Z) and a C-plane growth region (Y). Both Z and Y are single crystals having the same orientation. Crystallographically speaking, Z and Y are identical. Only dopant concentrations are different. The low dislocation single crystal regions (Z) are rich in an n-type dopant, which gives higher electric conductivity to Z. The C-plane growth regions (Y) are poor in the n-type dopant, which gives lower electric conductivity to Y. An $Al_xIn_yGa_{1-x-y}N$ substrate made by the present invention has inherently two roles as an undersubstrate and as a stripe mask. The $Al_xIn_yGa_{1-x-y}N$ substrate can be an undersubstrate for growing a child $Al_xIn_yGa_{1-x-y}N$ crystal in accordance with the teaching of the present invention.

Another low cost method obtains a plurality of $Al_xIn_yGa_{1-x-y}N$ mirror wafers by preparing a maskless $Al_xIn_yGa_{1-x-y}N$ mirror polished wafer made by the present invention as an undersubstrate, growing an $Al_xIn_yGa_{1-x-y}N$ crystal upon the maskless $Al_xIn_yGa_{1-x-y}N$ undersubstrate, forming linearly extending ribbon-shaped slanting facets, making facet hills and facet valleys which coincide with the inherent voluminous defect accumulating regions (H) of the parent $Al_xIn_yGa_{1-x-y}N$ undersubstrate, producing voluminous defect accumulating regions (H) under the valleys of facets above the parent voluminous defect accumulating regions (H), yielding low dislocation single crystal regions (Z) under the facets, making C-plane growth regions (Y) at flat tops between neighboring reciprocal facets, maintaining the facets, the voluminous defect accumulating regions (H), the low dislocation single crystal regions (Z) and the C-plane growth regions (Y), attracting dislocations from the low dislocation single crystal regions (Z) and the C-plane growth regions (Y) into the voluminous defect accumulating regions (H), reducing dislocations in the low dislocation single crystal regions (Z) and the C-plane growth regions (Y), making a thick tall $Al_xIn_yGa_{1-x-y}N$ crystal ingot, slicing the tall $Al_xIn_yGa_{1-x-y}N$ crystal into a plurality of as-cut wafers, and polishing the as-cut wafers into $Al_xIn_yGa_{1-x-y}N$ mirror wafers.

Another low cost method obtains a plurality of $Al_xIn_yGa_{1-x-y}N$ mirror wafers by preparing a maskless $Al_xIn_yGa_{1-x-y}N$ mirror polished wafer made by the present invention, growing an $Al_xIn_yGa_{1-x-y}N$ crystal upon the maskless $Al_xIn_yGa_{1-x-y}N$ undersubstrate, forming linearly extending ribbon-shaped slanting facets, making facet hills and facet valleys which coincide with the inherent voluminous defect accumulating regions (H) of the parent $Al_xIn_yGa_{1-x-y}N$ undersubstrate, forming less inclining shallow facets just on the valleys, producing voluminous defect accumulating regions (H) under the valley shallow facets above the parent voluminous defect accumulating regions (H), yielding low dislocation single crystal regions (Z) and C-plane growth regions (Y) upon the parent inherent low dislocation single crystal regions (Z) and the C-plane growth regions (Y), maintaining the facets, the voluminous defect accumulating regions (H), the low dislocation single crystal regions (Z) and the C-plane growth regions (Y), attracting dislocations from the low dislocation single crystal regions (Z) and the C-plane growth regions (Y) into the voluminous defect accumulating regions (H), reducing dislocations in the low dislocation single crystal regions (Z) and the C-plane growth regions (Y), making a thick tall $Al_xIn_yGa_{1-x-y}N$ crystal ingot, slicing the tall $Al_xIn_yGa_{1-x-y}N$ crystal into a plurality of as-cut wafers, and polishing the as-cut wafers into $Al_xIn_yGa_{1-x-y}N$ mirror wafers. Further, it is possible to grow an $Al_xIn_yGa_{1-x-y}N$ ingot by using one of the $Al_xIn_yGa_{1-x-y}N$ substrates as a seed crystal which have been sliced from the $Al_xIn_yGa_{1-x-y}N$ ingot made by the method described above. It enables makers to produce low cost $Al_xIn_yGa_{1-x-y}N$ substrates.

Embodiment 1

Figure 10:
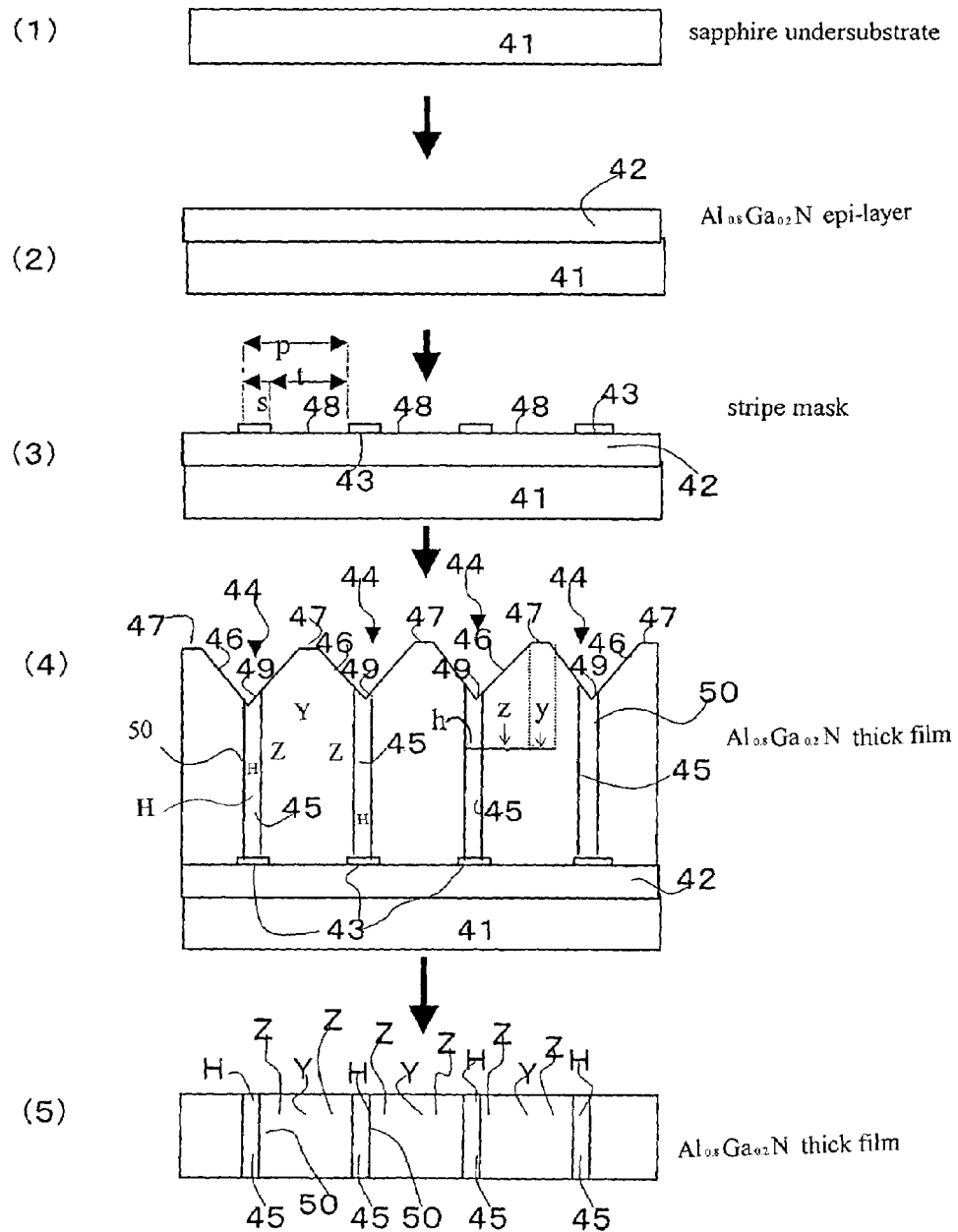
FIGS. 10(1) to 10(5) are sectional views of a sample at various steps for demonstrating the steps of Embodiment 1 of the present invention of making a linearly extending stripe mask on an undersubstrate, growing an $Al_{0.8}Ga_{0.2}N$ crystal on the masked sapphire undersubstrate, producing linear facets on the stripe mask, producing voluminous defect accumulating regions (H) under valleys of the facets, growing low dislocation single crystal regions (Z) neighboring the voluminous defect accumulating regions (H), grinding a rugged faceted surface, eliminating the undersubstrate for separating an $Al_{0.8}Ga_{0.2}N$ substrate, and lapping and polishing the $Al_{0.8}Ga_{0.2}N$ substrate.

$Al_{0.8}Ga_{0.2}N$ (x=0.8,y=0): Sapphire Undersubstrate; FIG. 10

FIG. 10 shows the steps of Embodiment 1 for making an $Al_{0.8}Ga_{0.2}N$ mixture crystal substrate of the present invention. A sapphire single crystal is employed as an undersubstrate of a C-plane top surface. FIG. 10 (1) denotes a C-plane surface sapphire undersubstrate 41. Sapphire belongs to trigonal symmetry system without three-fold rotation symmetry. $Al_{0.8}Ga_{0.2}N$ belongs to hexagonal symmetry system.

A 2 μm thick $Al_{0.8}Ga_{0.2}N$ epi-layer 42 is grown on the sapphire undersubstrate 41 heteroepitaxially by an MOCVD method. FIG. 10(2) shows the $Al_{0.8}Ga_{0.2}N$ epi-layer 42 covering the sapphire undersubstrate 41. The top of the $Al_{0.8}Ga_{0.2}$ epi-layer 42 is a C-plane (0001).

A 100 nm $SiO_2$ film is deposited uniformly upon the $Al_{0.8}Ga_{0.2}N$ epi-layer 42. Parts of the $SiO_2$ film are etched away except parallel stripes 43 by photolithography. A set of the parallel $SiO_2$ stripes 43 is called a stripe mask. An individual masked part is called a "stripe" 43. FIG. 10(3) shows a section of a mask patterned $Al_{0.8}Ga_{0.2}N$ epi-layer upon sapphire. The $SiO_2$ stripe 43 has a width s. The stripes 43 align in parallel at a definite pitch p. Parts of the $Al_{0.8}Ga_{0.2}N$ epi-layers between the neighboring stripes 43 are exposed. An exposed part 48 has a width t. The sum of the exposed part width t and the stripe width s is the pitch p (period). Five different patterns A, B, C, D and E of masks with different widths and pitches are prepared for comparing functions of the masks. Stripe directions are parallel to an $Al_{0.8}Ga_{0.2}N<1-100>$ direction in Patterns A, B, C and D. Namely, the stripes are parallel to a {11-20} plane (A-plane) in Patterns A to D. Pattern E has a unique stripe direction parallel to a <11-20> direction which is parallel to a {1-100} plane (M-plane). As mentioned before, the stripe width s and the exposure width t satisfy an equation of p=s+t.

Pattern A; stripe width s=50 μm, pitch p=400 μm, exposure width t=350 μm

Pattern B; stripe width s=200 μm, pitch p=400 μm, exposure width t=200 μm

Pattern C; stripe width s=2 μm, pitch p=20 μm, exposure width t=18 μm

Pattern D; stripe width s=300 μt m, pitch p=2000 μm, exposure width t=1700 μm

Pattern E; stripe width s=50 μt m, pitch p=400 μm, exposure width t=350 μm

Undersubstrates having Patterns A, B, C, D and E are called Undersubstrates A, B, C, D and E. Crystals grown upon Undersubstrates A, B, C, D and E are called Samples A, B, C, D and E.

(1) Growth of Sample A and Sample B $Al_{0.8}Ga_{0.2}N$ mixture crystals are grown on Undersubstrate A of Pattern A and on Undersubstrate B of Pattern B by an HVPE method in an HVPE apparatus. The HVPE apparatus has a vertically long hot wall furnace, $H_2$—, HCl— and $AlCl_3$ gas inlets at the top of the furnace, a Ga boat containing Ga metal at a higher spot, a susceptor for supporting a substrate at a lower spot, and a heater for heating the susceptor and the Ga boat. Undersubstrate A and Undersubstrate B of the A- and B-patterned sapphire undersubstrates are laid upon the susceptor. $Al_{0.8}Ga_{0.2}N$ crystals are grown on Samples A and B on the same condition.

The Ga boat is supplied with hydrogen gas ($H_2$) and hydrochloric acid gas (HCl) from outer gas cylinders via the gas inlets at the top of the furnace. Hydrogen gas is a carrier gas. The susceptor is supplied with hydrogen gas ($H_2$) and ammonia gas ($NH_3$) via other gas inlets on the top.

Maintaining the furnace at atmospheric pressure, Embodiment 1 (Samples A and B) heats the Ga boat at a temperature higher than 800° C. and heats the A- and B-patterned sapphire undersubstrates at 1050° C. Reaction of Ga with HCl synthesizes gallium chloride GaCl once at an upper portion in the vicinity of the Ga boat in the furnace. GaCl vapor falling toward the susceptor reacts with the introduced $AlCl_3$ gas and ammonia gas ($NH_3$). Aluminum gallium nitride ($Al_{0.8}Ga_{0.2}N$) is piled upon the exposures 48 and mask stripes 43 of Samples A and B on the susceptor.

Conditions of epitaxial growth of $Al_{0.8}Ga_{0.2}N$ are;

| | |
|---|---|
| Growth temperature | 1030° C. |
| $NH_3$ partial pressure | 0.3 atm (30 kPa) |
| HCl partial pressure | 0.01 atm (1 kPa) |
| $AlCl_3$ partial pressure | 0.04 atm (4 kPa) |
| Growth time | 20 hours |
| Thickness | 1200 μm |

The above HVPE process produces 1200 μm thick $Al_{0.8}Ga_{0.2}N$ epi-layers on Undersubstrates A and B having Patterns A and B. FIG. 10(4) shows a sectional view of the $Al_{0.8}Ga_{0.2}N$-grown samples. $Al_{0.8}Ga_{0.2}N$ crystals grown on the Undersubstrates A and B are named Samples A and B.

[SEM, TEM and CL Observation of Sample A]

A surface of Sample A is observed by a microscope. Sample A has a rack-shaped surface composed of many parallel V-grooves 44 (hills/valleys) aligning with a definite pitch. Each V-groove 44 is built by a pair of inner slanting facets 46 and 46. Namely, the surface looks like an assembly of lying triangle prisms on an image in the microscope. Sometimes, there are flat tops 47 between neighboring V-grooves 44. The flat tops 47 are parallel to a C-plane. The flat tops and regions just under the flat tops are called now "C-plane growth regions". Valleys (bottom lines) 49 of the V-grooves 44 coincide in the vertical direction with the stripes 43 of the mask initially formed. The positions of the valleys (bottom lines) 49 are exactly predetermined by the positions of the stripes 43 of the initially made mask. Facets 46 and C-plane growth regions 47 are made upon the exposure 48 on the $Al_{0.8}Ga_{0.2}N$ epi-layer 42. The mask rules the positions and sizes of the valleys 49 of the V-grooves 44.

The V-grooves 44 of Sample A align in parallel with each other with a definite pitch of 400 μm. The 400 μm groove pitch is equal to the stripe mask pitch p=400 μm. The rack-shaped surface is controlled by the initially prepared mask. A valley lies just above a stripe. Valleys and stripes have one-to-one correspondence. The surface is constructed by repetitions of 400 μm pitch wide hills and valleys. Many of the facets building the V-grooves 44 are {11-22} plane facets. Since the stripes have been prepared in parallel to a <1-100> direction which is parallel with a {11-20} plane, the facets are yielded in parallel to the extension of the stripes.

Sometimes the neighboring facets 46 and 46 have an intermediate flat top 47. The flat top is parallel to a C-plane (0001) and a mirror flat plane. The width of the C-plane growth region is about 30 μm. Shallower (less inclining) facets exist at valleys of the V-grooves, following lower ends of the facet 46. A V-groove has two step facets of a pair of steeper facets and a pair of milder facets. Sample A is cleaved in cleavage plane {1-100}. Cleaved sections are observed by a scanning electron microscope (SEM), cathode luminescence (CL) and fluorescence microscope.

The observation reveals special regions 45 which extend in a c-axis direction and have a definite thickness at valleys 49 of the V-grooves 44. The valley-dangling, c-extending regions 45 are discernible from other regions. The c-axis extending region 45 has a width of about 40 μm in Sample A. The CL image gives the valley-dangling regions darker contrast and other regions brighter contrast. The valley dangling regions 45 are clearly discernible in the CL picture. Cleaving Sample A at various spots reveals a fact that the c-axis extending, valley-dangling region 45 has a three-dimensional volume with a definite thickness. Thus, the region 45 is a planar region extending both in the thickness direction and in the mask stripe direction. The planar regions 45 align in parallel with a definite pitch.

Sample A is further examined by the CL and the TEM (transmission electron microscope) for clarifying the valley-hanging regions. Behavior of dislocations of the valley-hanging region turns out to be entirely different from other regions. Dark interfaces 50 intervene between the valley-hanging regions 45 and the other regions. The valley-dangling region 45 enclosed by the interfaces 50 contains a high density of dislocations of $10^8$ cm$^{-2}$ to $10^9$ cm$^{-2}$. Thus, the valley-dangling region 45 is a concentrated assembly of dislocations. The CL observation teaches us that the interfaces 50 are also assemblies of dislocations. The interfaces 50 are somewhere planar dislocation assemblies and elsewhere linear assemblies. No difference of crystal orientations is found between inner parts (valley-dangling region) of the interfaces and outer parts of the interfaces. Namely, the valley-dangling region is a single crystal having the same orientation as the surrounding single crystal regions in Sample A. The valley-dangling dislocation-rich region 45 is called a "voluminous defect accumulating region (H)."

Outer regions (Z and Y) outside of the interfaces 50 which appear as dark contrast in the CL picture have low dislocation density. The regions just below the facet are called "low dislocation single crystal regions (Z)". Dislocation density shows conspicuous contrast between the inner part and the outer part of the interface 50. In the close vicinity of the interfaces, there are transient regions having a medium dislocation density of $10^6$ cm$^{-2}$ to $10^7$ cm$^{-2}$. The dislocation density falls rapidly in proportion to a distance from the interface in the low dislocation single crystal regions (Z). At a point distanced from the interface by 100 μm, the dislocation density reduces to $10^4$ cm$^{-2}$~$10^5$ cm$^{-2}$. Some points close to the interface have a similar low dislocation density of $10^4$ cm$^{-2}$ to $10^5$ cm$^{-2}$. Dislocation density falls outside of the interfaces 50 as a function of the distance from the valleys of the V-grooves. Electric conductivity is high in the low dislocation single crystal regions (Z).

In Sample A, the tops 47 of facets are flat surfaces which are parallel to a C-plane. The regions (Y) just below the C-plane have low dislocation density. The region is called a "C-plane growth region (Y)". The C-plane growth region (Y) is a low dislocation density single crystal with high electric resistance. Three different regions are defined. The first is a voluminous defect accumulating region (H) hanging from a valley of a V-groove. The second one is a low dislocation single crystal region (Z) following a facet and sandwiching the voluminous defect accumulating region (H). The third one is C-plane growth region (Y) following a C-plane top. All the three regions are planar regions extending in parallel to the mask stripes. Thus, H, Y and Z are all parallel to the stripes. The structure is designated by repetitions of . . . YZHZYZHZYZHZYZHZYZH . . . . It is briefly represented by -(HZYZ)$_m$-.

The low dislocation single crystal regions (Z) and C-plane growth regions (Y) contain a small number of dislocations. Almost all of the dislocations extend in parallel to a C-plane in the surrounding regions (Z) and (Y). The C-plane parallel extending dislocations run centripetally toward the voluminous defect accumulating regions (H). The dislocation density in the surrounding regions (Z) and (Y) is slightly high at an early stage of the growth. The dislocation density in (Z) and (Y) decreases with the progress of growth. It is confirmed that the surrounding regions (Z) and (Y) are single crystals.

These results of this examination signify a dislocation reduction function that the facet growth sweeps dislocations outside of the interfaces into the valleys of the V-grooves and the swept dislocations are accumulated within the interfaces 50 and the inner voluminous defect accumulating regions 45(H). Thus, the dislocation density is low in the low dislocation single crystal regions (Z) and the C-plane growth regions (Y) but the dislocation density is high in the voluminous defect accumulating regions (H).

An inner part between two parallel neighboring interfaces is the voluminous defect accumulating region 45 (H) containing many dislocations. An outer part of two parallel neighboring interfaces is a single crystal with few dislocations. The outer part consists of two discernible portions. One is a part transfixed by progressing facets 46 and is defined as a locus of facets. The part is a low dislocation single crystal region (Z). The other is a part left untouched by the progressing facets 46 but is a locus of a rising flat C-plane. The other is a C-plane growth region (Y).

The C-plane growth regions (Y) just under the flat tops (parallel to C-plane) are also ordered single crystals with dislocation density lower than the low dislocation single crystal regions (Z). The C-plane growth region (Y) is not a part which facets have passed though. But, the C-plane growth regions (Y) are upgraded by the function of the voluminous defect accumulating regions (H). Though almost all the surface of a growing Al$_{0.8}$Ga$_{0.2}$N crystal is covered with facets and V-grooves, some portions which are uncovered with the facets happen. The facet-uncovered regions are C-plane growth region (Y) following the flat tops of C-planes. It is confirmed that the C-plane growth regions (Y) are low dislocation density single crystals. But, electric resistivity is high in the C-plane growth regions (Y).

Three regions H, Z and Y should be discriminated from each other. The low dislocation single crystal regions (Z) and the voluminous defect accumulating regions (H) have final C-plane surfaces as a top, when Al$_{0.8}$Ga$_{0.2}$N is mechanically processed. Growing surfaces of the voluminous defect accumulating regions (H) and the low dislocation single crystal regions (Z) are not a C-plane but a facet plane. The facets allow a dopant to invade into the growing Al$_{0.8}$Ga$_{0.2}$N crystal. The C-plane forbids the dopant from infiltrating into the Al$_{0.8}$Ga$_{0.2}$N crystal. The low dislocation single crystal regions (Z) and the voluminous defect accumulating regions (H) are endowed with high electric conductivity. The C-plane growth regions (Y) have poor electric conduction. The low dislocation single crystal regions (Z) and the C-plane growth region (Y) are favored with low dislocation density in common.

What is important is the relation between the voluminous defect accumulating regions (H) and the facets appearing in the V-groove. Prevalent (steeper) facets appearing in the prism-shaped V-groove are {11-22} planes. The bottoms (valleys) have milder slanting facets having a larger fourth index n. The milder facets lead and cover the voluminous defect accumulating regions (H).

Milder slanting (shallow) facets form the voluminous defect accumulating regions (H) in Sample A. The voluminous defect accumulating region (H) is formed by piling many milder facets. The voluminous defect accumulating regions (H) are enclosed by the milder slanting facets 49 and side vertical interfaces 50 and 50 and are led by the milder facets growing in the vertical direction.

The tops of the milder slanting facets join the bottoms 49 of the steeper facets. The joint lines form a closed loop in the facets. The milder slanting facets meet at a definite obtuse angle at the lowest bottom 49, which has the maximum dislocation density in the voluminous defect accumulating regions (H).

The observation indicates that the steeper facets {11-22} gather dislocations into the valleys 44 and the voluminous defect accumulating regions (H) arrest the dislocations with high density therein.

The present invention reduces dislocations in the single crystal regions (Z) and (Y) surrounding the voluminous defect accumulating region (H) by maintaining facets 46 and facet valleys 44 on a growing surface, making voluminous defect accumulating regions (H) following bottoms of the valleys 44 formed by the facets 46, attracting dislocations of peripheral regions into the voluminous defect accumulating regions (H), annihilating and accumulating the attracted dislocations in the voluminous defect accumulating regions (H), and making the best use of the voluminous defect accumulating regions (H) as dislocation annihilating/accumulating regions.

[SEM, TEM, and CL Observation of Sample B]

Surfaces and cleavage planes of Sample B are observed by SEM (scanning electron microscope), TEM (transmission electron microscope) and CL (cathode luminescence). The results are similar to Sample A.

What is different from Sample A is the width h of the voluminous defect accumulating region (H) at a valley of a V-groove. In Sample A, the closed defect accumulating region (H) has a narrow width of h$_A$=40 μm. In Sample B, the closed defect accumulating region (H) has a wide width of $h_B=190$ μm. The widths of (H) correspond to the widths of the mask stripes ($S_A=50$ μm, $S_B=200$ μm). The fact implies that the stripe mask makes a striped voluminous defect accumulating region (H) of a similar size. The positions and the sizes of voluminous defect accumulating region (H) are predetermined by the striped mask. Thus the sizes and positions of the voluminous defect accumulating region (H) are programmable and controllable by the mask.

The voluminous defect accumulating regions (H) of Sample A are homogeneous. The voluminous defect accumulating region (H) of Sample B is linear on the surface but inhomogeneous in inner parts. The surfaces of the voluminous defect accumulating regions (H) of Sample B have a plenty of shallow facets and polycrystalline hillocks beside the normal facets which form normal V-grooves.

The turbulent voluminous defect accumulating regions (H) of Sample A are scrutinized. It is found that there are single crystals in a closed defect accumulating region (H) whose orientations are slightly inclining to the orientation of the surrounding single crystal regions (Z) and (Y). The common orientation of the low dislocation single crystal regions (Z) and the C-plane growth regions (Y) is named a "basic" orientation. It is further found that there are several partial grains in the voluminous defect accumulating region (H) having orientations different from the basic orientation. A further discovery is that the voluminous defect accumulating regions (H) of Sample B include linear defects, planar defects and crystal grains slightly slanting to the basic orientation.

[Processing of Sample A and Sample B]

As-grown samples have rugged top surfaces and bottom undersubstrates. Bottoms of Samples A and B are ground for eliminating the undersubstrates. Top surfaces are also ground for removing the facetted rugged surfaces. Both surfaces are polished into flat, smooth surfaces. About 1 inch φAl$_{0.8}$Ga$_{0.2}$N substrate wafers are obtained for Sample A and Sample B, as shown in FIG. 10(5).

The finished Al$_{0.8}$Ga$_{0.2}$N substrates are (0001) surface (C-surface) wafers. The obtained Al$_{0.8}$Ga$_{0.2}$N wafers are uniformly transparent for human eyesight. CL observation enables parts of the Al$_{0.8}$Ga$_{0.2}$N wafers to clarify the differences of growth history as a difference of contrast.

CL examination by irradiating Samples A and B by a 360 nm wavelength light which is close to the bandgap of Al$_{0.8}$Ga$_{0.2}$N shows a set of parallel linear voluminous defect accumulating regions (H) regularly aligning with a pitch of 400 μm. The 400 μm pitch of the voluminous defect accumulating region (H) is exactly equal to the pitch of the stripe mask 43.

Voluminous defect accumulating regions (H) give dark contrast on the CL image in many cases. Some voluminous defect accumulating regions (H) exhibit bright contrast on the same CL image. Contrast of voluminous defect accumulating regions (H) depends upon positions in the Al$_{0.8}$Ga$_{0.2}$N crystal.

"Dark" or "bright" contrast appears only on the CL picture. Al$_{0.8}$Ga$_{0.2}$N is entirely uniform and transparent for eye sight. Differences of Z, Y and H are not detected even with an optical microscope. The CL observation can discern Z, Y and H.

Low dislocation single crystal regions (Z) following the facets 44 appear as parallel bright contrast ribbons extending in a direction on the CL picture. Dark contrast strings are found just at the middles of the bright ribbons of the low dislocation single crystal regions (Z). The dark contrast strings are C-plane growth regions (Y). Parallel bright-dark-bright ribbons turn out to be parallel "ZYZ" stripes.

In the CL picture, facet regions grown with {11-22} facets look bright. C-plane regions grown with (0001) planes (C-plane) look dark. For three CL-discernible regions, the CL gives different contrasts;

| | |
|---|---|
| voluminous defect accumulating regions (H) | bright (partly dark) |
| low dislocation single crystal regions (Z) | bright |
| C-plane growth regions (Y) | dark. |

The voluminous defect accumulating region (H) is a planar region having a definite thickness and extends in parallel with a c-axis direction and an LD stripe direction. The voluminous defect accumulating regions (H) are vertical to a surface of the substrate and penetrate the substrate from the top to the bottom.

The voluminous defect accumulating regions (H), low dislocation single crystal regions (Z) and C-plane growth regions (Y) are all invisible to eye-sight but are discernible by the CL.

A polished Al$_{0.8}$Ga$_{0.2}$N crystal is a flat, smooth substrate without facets as shown in FIG. 10(5). Dislocation density is measured on the sample substrates. CL, etching and TEM can discern threading dislocations. The CL observation is most suitable for examining dislocation density.

A threading dislocation looks like a dark dot in the CL picture. Samples A and B reveal highly concentrated dislocations in the voluminous defect accumulating regions (H). Interfaces (K) enclosing the voluminous defect accumulating regions (H) appear as linear arrays of dislocations.

The interfaces (K) are three-dimensional planar defects. Dark contrast clearly discriminates the interface (K) 50 from bright Z and bright H. The interface (K) is composed of planar defects or dislocation bundles.

Sample A carrying a 50 μm width mask reveals the occurrence of parallel striped voluminous defect accumulating regions (H) having a 40 μm width. Sample B with a 200 μm width mask reveals the occurrence of parallel striped voluminous defect accumulating regions (H) having a 190 μm width. The initial mask stripe width rules the width of the voluminous defect accumulating regions (H). The width of H is equal to or slightly smaller than the width of stripes.

Sample A and Sample B reveal low dislocation density in the low dislocation single crystal regions (Z) and the C-plane growth regions (Y). Dislocations decrease in proportion to a distance from the voluminous defect accumulating region (H). Somewhere in the low dislocation single crystal regions (Z), dislocations decrease rapidly and discontinuously just outside of the interfaces. The average of dislocation density is less than $5\times10^6$ cm$^{-2}$ in the low dislocation single crystal regions (Z) and the C-plane growth regions (Y) of Samples A and B.

In the low dislocation single crystal regions (Z) and the C-plane growth regions (Y), dislocations run centripetally toward the central voluminous defect accumulating regions (H) in parallel to the C-plane in Samples A and B. Dislocations are gathered, annihilated and accumulated in the voluminous defect accumulating regions (H). The voluminous defect accumulating regions (H) lower dislocation density in the other regions (Z) and (Y) by annihilating/accumulating dislocations. The Al$_{0.8}$Ga$_{0.2}$N substrates of Samples A and B are mixture crystals with dislocations decreased by the action of the voluminous defect accumulating regions (H).

The $Al_{0.8}Ga_{0.2}N$ substrates of Samples A and B are etched in a heated KOH (potassium hydroxide) solution. The KOH etchant has anisotropic etching rates. An AlGa-plane ((0001) AlGa) is difficult to etch. But, an N-plane ((000-1)N) is easy to etch. Anisotropy shows whether individual parts are an N-plane or an AlGa-plane on an $Al_{0.8}Ga_{0.2}N$ (0001) surface.

The low dislocation single crystal regions (Z) and the C-plane growth regions (Y) are unetched. The voluminous defect accumulating regions (H) are partly etched but partly unetched.

The etching test means that the voluminous defect accumulating regions (H) have (000-1)N planes as well as (0001) AlGa plane. The low dislocation single crystal regions (Z) and the C-plane growth regions (Y) have all (0001)AlGa planes. Namely, the surrounding portions (Z) and (Y) are (0001) single crystals.

Some parts of the voluminous defect accumulating regions (H) are single crystals having the same polarity as (Z) and (Y). But, other parts of the voluminous defect accumulating regions (H) are single crystals having a polarity reverse to the surrounding regions (Z) and (Y). The reversed portion having (000-1)N-planes is deeply etched by KOH.

Sample A of a 50 μm wide stripe mask and Sample B of a 200 μm wide stripe mask reveal similar properties. Width h of the voluminous defect accumulating regions (H) is an exception. Sample A shows 40 μm wide voluminous defect accumulating regions (H) ($h_A$=40 μm). Sample B shows 190 μm wide voluminous defect accumulating regions (H) ($h_B$=190 μm). The result confirms that the widths h of the voluminous defect accumulating regions (H) can be uniquely determined by the widths of mask stripes implanted on the undersubstrate.

Efficient exploitation of the substrate area requires narrower voluminous defect accumulating regions (H), wider low dislocation single crystal regions (Z) and wider C-plane growth regions (Y). Excess large voluminous defect accumulating regions (H) are undesirable, because they have a tendency of including abnormal intrinsic defects. The above two reasons favor narrower voluminous defect accumulating regions (H).

The reduction of voluminous defect accumulating regions (H) requires the decrement of a stripe width s. Yielding facets requires a definite width s for mask stripes. Too narrow stripes, however, can produce neither facets nor voluminous defect accumulating regions (H). Without facets, neither voluminous defect accumulating regions (H), nor low dislocation single crystal regions (Z) nor C-plane growth regions (Y) happen. A lower limit of the stripe width s is searched by following Sample C.

[Growth of Sample C (Stripe Width s=2 μm, Pitch p=20 μm)]

Sample C starts from an undersubstrate of Pattern C having a set of parallel 2 μm stripes 43 aligning with a 20 μm pitch (s=2 μm, p=20 μm). An $Al_{0.8}Ga_{0.2}N$ film is grown on the masked undersubstrate of Sample C by the same facet growth based on the HVPE method as Samples A and B.

The 2 μm stripes 43 of an $SiO_2$ mask are buried with $Al_{0.8}Ga_{0.2}N$ by the HVPE. Although facets occur on a growing surface, valleys of V-grooves happen accidentally and contingently here and there without definite relation with implanted mask stripes. The stripes cannot be seeds of valleys of V-grooves. Random distributing facets cover a surface of Sample C. The HVPE cannot control the positions of the valleys of V-grooves. The HVPE turns out to be inadequate for Pattern C which has a too narrow width s and a too narrow pitch p.

Then, instead of the HVPE, an $Al_{0.8}Ga_{0.2}N$ crystal is grown by an MOCVD method at a low speed. Reduction of the growing speed aims at making parallel V-grooves having valleys at the stripe masks ($SiO_2$) 43.

The MOCVD method employs metallorganic materials for Ga and Al sources, for example, trimethylgallium or triethylgallium (TMG, TEG) and trimethylaluminum or triethylaluminum (TMA, TEA) instead of metal gallium Ga and $AlCl_3$ gas. Here, trimethylaluminum (TMA) and trimethylgallium (TMG) are supplied as Al and Ga sources. Other gas source materials are ammonia gas ($NH_3$ gas: group 5 gas) and hydrogen gas ($H_2$; carrier gas).

An $Al_{0.8}Ga_{0.2}N$ crystal is grown in a furnace of an MOCVD apparatus by laying Undersubstrate C on a susceptor of the furnace, heating Undersubstrate C up to 1030° C., and supplying material gases in volume ratios of TMG: TMA: $NH_3$=2:8:25000 to Undersubstrate C. The growing speed is 3 μm/h. The growth time is 30 hours. A 90 μm thick $Al_{0.8}Ga_{0.2}N$ crystal having V-grooved facets is obtained. This is called Sample C. In the growth, an $Al_{0.8}Ga_{0.2}N$ crystal having parallel valleys 49 of V-grooves 44 just above the stripe masks 43 is made. Positions of the facet valleys 49 coincide with the positions of the striped masks 43. This means that the positions of the masks 43 enable the positions of the V-grooves to be controllable. Further, voluminous defect accumulating regions (H) are found to grow under bottoms 49 of V-grooves.

Undersubstrate C has a very small mask width of s=2 μm. In accordance with the tiny mask width, parallel V-grooves produce thin voluminous defect accumulating regions (H) having a 1 μm width at bottoms. This fact means that the width of mask rules the width of voluminous defect accumulating region (H). 2 μm is the lowest limit of mask width and 1 μm is the least width of the voluminous defect accumulating region (H). Low dislocation density realized in the surrounding single crystal regions (Z) and (Y) is confirmed by the TEM observation. Sample C features smallness of the voluminous defect accumulating regions (H). It is confirmed that the MOCVD enables a narrow width stripe mask to make narrow parallel voluminous defect accumulating regions (H). The MOCVD of a low growing speed is suitable for making the narrow width voluminous defect accumulating regions (H) instead of the HVPE of a high growing speed.

[Growth of Sample D (Stripe Width s=300 μm, Pitch p=2000 μm)]

Sample D grows an $Al_{0.8}Ga_{0.2}N$ crystal on Undersubstrate D with a stripe mask having many parallel 300 μm wide stripes aligning in a vertical direction with a 2000 μm pitch (Pattern D). Pattern D is an example of a large width s and a large pitch p (spatial period) for examining the upper limit of s and p. Sample D grows $Al_{0.8}Ga_{0.2}N$ by the HVPE method like Sample A and Sample B on the following conditions.

| | |
|---|---|
| Growth temperature | 1050° C. |
| $NH_3$ partial pressure | 0.3 atm (30 kPa) |
| HCl partial pressure | 0.01 atm (1 kPa) |
| $AlCl_3$ partial pressure | 0.04 atm (4 kPa) |
| Growth time | 40 hours |
| Thickness | 3500 μm |

The HVPE method produces a 3.5 mm thick $Al_{0.8}Ga_{0.2}N$ crystal. Sample D shows a rack-shaped (V-grooved) surface having parallel valleys and hills made by facets extending in parallel to mask stripes. Plenty of parallel voluminous defect accumulating regions (H) accompany parallel valleys 49 of V-grooves 44 with the same pitch p=2000 μm. Positions of the voluminous defect accumulating region (H) exactly coincide with the positions of initially-prepared stripes 43. This fact means that the stripes induce the voluminous defect accumulating regions (H) above them.

Some of the facets 46 building the V-grooves 44 deform. Tiny pits and small hillocks appear on some of hills composed of facets aligning parallelly and regularly in accordance with the mask stripes.

Parallel voluminous defect accumulating regions (H) occur with a period of 2000 μm which is equal to the pitch p=2000 μm of the mask stripes. Hills and valleys maintain a regular rack-shape constructed by parallel lying prism-like columns. But, some parts are distorted. Some ends of V-grooves are defaced. Some facets have different index facets partially. The area of C-plane growth parts on the tops between neighboring V-grooves has fluctuation.

In spite of the irregularity of facets and V-grooves, voluminous defect accumulating regions (H) lie at the predetermined lines just above the mask stripes. The width of the voluminous defect accumulating region (H) is about 250 μm. Sample D shows a tendency to decrease the width of the voluminous defect accumulating region (H) in the proceeding of growth.

An excess large width h tends to incur abnormal-shaped polycrystalline regions in the large voluminous defect accumulating regions (H) in Sample D. The abnormal-shaped polycrystalline regions induce disorder of dislocations which overrun the voluminous defect accumulating regions (H) into the surrounding low dislocation single crystal regions (Z) and C-plane growth regions (Y).

The voluminous defect accumulating region (H), even if distorted, produces the low dislocation single crystal regions and C-plane growth regions on both sides. The average of dislocation density in the surrounding low dislocation single crystal regions (Z) and C-plane growth regions (Y) is less than $5 \times 10^6$ cm$^{-2}$. The fact signifies that even deforming voluminous defect accumulating region (H) has the function of dislocation reduction.

There are regions having bundles of dislocations outside of the voluminous defect accumulating regions (H), where shapes of facets are seriously distorted.

Examinations of Samples A, B, C and D clarify the fact that the width h of the voluminous defect accumulating region (H) is in the range from 2 μm to 200 μm, the width s of the stripes of a mask is in the range from 2 μm to 300 μm, and the pitch p of the voluminous defect accumulating region (H) is in the range from 20 μm to 2000 μm, for accomplishing the purposes of the present invention.

[Growth of Sample E (Stripe Direction <11-20>; Stripe Width s=50 μm, Pitch p=400 μm)]

Sample E grows an $Al_{0.8}Ga_{0.2}N$ crystal on Undersubstrate E which is covered with a mask of Pattern E having parallel <11-20> extending 50 μm wide stripes aligning with a 400 μm pitch. Mask pattern E is similar to Mask pattern A in a 50 μm width and a 400 μm pitch. But, Pattern E is different from Pattern A in extending directions. Pattern E has stripes extending in <11-20>. Stripes of Pattern A extend in <1-100>. Extension of the stripes of Undersubstrate E is parallel to cleavage planes {1-100}.

Other conditions of Sample E except the stripe direction are similar to Sample A. An $Al_{0.8}Ga_{0.2}N$ crystal is grown on Undersubstrate E by the HVPE method on the following conditions.

| | |
|---|---|
| Growth temperature | 1030° C. |
| NH$_3$ partial pressure | 0.3 atm (30 kPa) |
| HCl partial pressure | 0.01 atm (1 kPa) |
| AlCl$_3$ partial pressure | 0.04 atm (4 kPa) |
| Growth time | 20 hours |
| Thickness | 900 μm |

Growth on Pattern E is slow. Twenty hours of growth brings about 900 μm thick $Al_{0.8}Ga_{0.2}N$ film. Unification of stripe-shaped crystals is difficult on Pattern E. Thus, the growing speed is low. A 900 μm $Al_{0.8}Ga_{0.2}N$ crystal is obtained for Sample E on Pattern E by the twenty hour growth.

Somewhere no unification of crystals occurs in Sample E and deep gaps separate neighboring grains. Thicknesses of Sample E are not uniform but have large fluctuation. Random facets appear in Sample E without dominant facets.

Somewhere crystals are unified and have uniform surfaces. Slightly deformed voluminous defect accumulating regions (H) are formed at valleys of facets. At the regions where linear voluminous defect accumulating regions (H) align, the positions of the voluminous defect accumulating regions (H) coincide with the predetermined positions of the mask stripes.

Crystallographical property is analyzed. In Sample E, the voluminous defect accumulating regions (H) turn out to be polycrystalline. Sample E is different from the former Samples A, B, C and D at the polycrystalline voluminous defect accumulating regions (H).

Dislocation distribution in Sample E is examined by a TEM. The TEM confirms that dislocation density is very low in the low dislocation single crystal regions (Z) and the C-plane growth regions (Y) outside of the polycrystalline voluminous defect accumulating regions (H). A spot quite close to the voluminous defect accumulating regions (H) shows $7 \times 10^6$ cm$^{-2}$ in dislocation density. Dislocation density decreases in proportion to a distance from (H). The average of the dislocation density is less than $5 \times 10^6$ cm$^{-2}$ in the low dislocation single crystal regions (Z) and the C-plane growth regions (Y). The least dislocation density is $5 \times 10^5$ cm$^{-2}$.

Sample E ensures that even a <11-20> direction of stripes takes effect in the present invention. The <11-20> stripe direction of Sample E has still drawbacks in comparison with the <1-100> stripe direction employed in Samples A, B, C and D. The drawbacks, however, will be overcome in near future.

Embodiment 2

Figure 11:
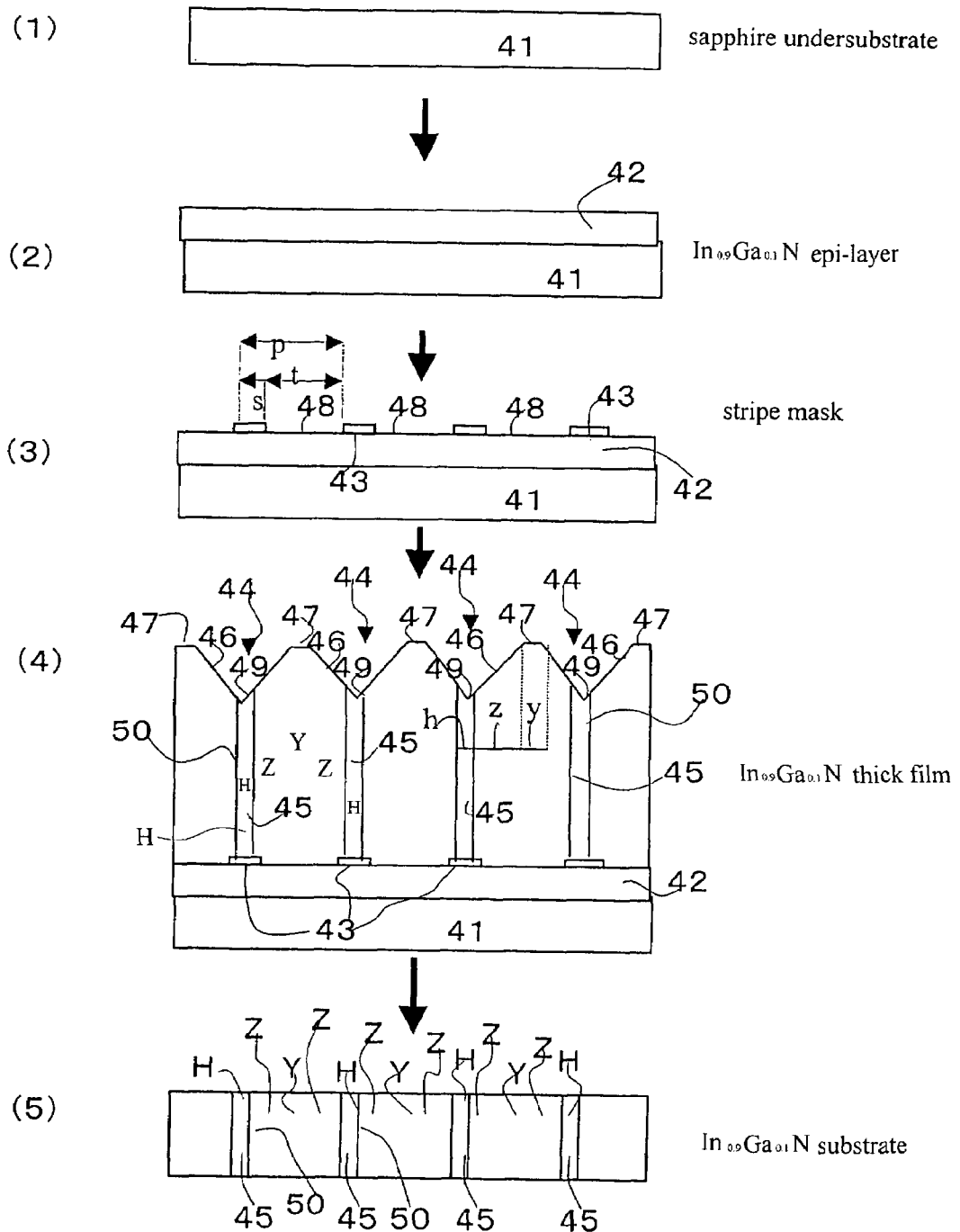
FIGS. 11(1) to 11(5) are sectional views of a sample at various steps for demonstrating the steps of Embodiment 2 of the present invention of making a linearly extending stripe mask on an undersubstrate, growing an $In_{0.9}Ga_{0.9}N$ crystal on the masked undersubstrate, producing linear facets on the stripe mask, producing voluminous defect accumulating regions (H) under valleys of the facets, growing low dislocation single crystal regions (Z) neighboring the voluminous defect accumulating regions (H), grinding a rugged faceted surface, eliminating the undersubstrate for separating an $In_{0.9}Ga_{0.1}N$ substrate, and lapping and polishing the $In_{0.9}Ga_{0.1}N$ substrate.

$In_{0.9}Ga_{0.1}N$ (x=0, y=0.9): Sapphire Undersubstrate; FIG. 11

FIG. 11 shows the steps of Embodiment 2 for making an $In_{0.9}Ga_{0.1}N$ mixture crystal substrate of the present invention. A sapphire single crystal is employed as an undersubstrate of a C-plane top surface. FIG. 11 (1) denotes a C-plane surface sapphire undersubstrate 41. Sapphire belongs to trigonal symmetry system without three-fold rotation symmetry. $In_{0.9}Ga_{0.1}N$ belongs to hexagonal symmetry system.

A 2 μm thick $In_{0.9}Ga_{0.1}N$ epi-layer 42 is grown on the sapphire undersubstrate 41 heteroepitaxially by an MOCVD method. FIG. 11(2) shows the $In_{0.9}Ga_{0.1}N$ epi-layer 42 covering the sapphire undersubstrate 41. The top of the $In_{0.9}Ga_{0.1}N$ epi-layer 42 is a C-plane (0001).

A 100 nm $SiO_2$ film is deposited uniformly upon the $In_{0.9}Ga_{0.1}N$ epi-layer 42. Parts of the $SiO_2$ film are etched away except parallel stripes 43 by photolithography. A set of the parallel $SiO_2$ stripes 43 is called a stripe mask. An individual masked part is called a "stripe" 43. FIG. 11(3) shows a section of a mask patterned $In_{0.9}Ga_{0.1}N$ epi-layer upon sapphire. The $SiO_2$ stripe 43 has a width s. The stripes 43 align in parallel with a definite pitch p. Parts of the $In_{0.9}Ga_{0.1}N$ epi-layers between the neighboring stripes 43 are exposed. An exposed part 48 has a width t. The sum of the exposed part width t and the stripe width s is a pitch p (period). Five different patterns A, B, C, D and E of masks with different widths and pitches are prepared for comparing functions of the masks. Stripe directions are parallel to an $In_{0.9}Ga_{0.1}N$<1-100> direction in Patterns A, B, C and D. Namely, the stripes are parallel to a {11-20} plane (A-plane) in Patterns A to D. Pattern E has a unique stripe direction parallel to a <11-20> direction which is parallel to a {1-100} plane (M-plane). As mentioned before, the stripe width s and the exposure width t satisfy an equation of p=s+t.

Pattern A; stripe width s=50 μm, pitch p=400 μm, exposure width t=350 μm

Pattern B; stripe width s=200 μm, pitch p=400 μm, exposure width t=200 μm

Pattern C; stripe width s=2 μm, pitch p=20 μm, exposure width t=18 μm

Pattern D; stripe width s=300 μm, pitch p=2000 μm, exposure width t=1700 μm

Pattern E; stripe width s=50 μm, pitch p=400 μm, exposure width t=350 μm

Undersubstrates having Patterns A, B, C, D and E are called Undersubstrates F, G, I, J and K. Crystals grown upon Undersubstrates F, G, I, J and K are called Samples F, G, I, J and K.

(1) Growth of Sample F and Sample G $In_{0.9}Ga_{0.1}N$ mixture crystals are grown on Undersubstrate F of Pattern A and on Undersubstrate G of Pattern B by an HVPE method in an HVPE apparatus. The HVPE apparatus has a vertically long hot wall furnace, $H_2$— and HCl— gas inlets at the top of the furnace, an In boat containing In metal and a Ga boat containing Ga metal at higher spots, a susceptor for supporting a substrate at a lower spot, and a heater for heating the susceptor and the In and Ga boats. Undersubstrate F and Undersubstrate G of the A- and B-patterned sapphire undersubstrates are laid upon the susceptor. $In_{0.9}Ga_{0.1}N$ crystals are grown on Undersubstrates F and G on the same conditions.

The Ga boat and the In boat are supplied with hydrogen gas ($H_2$) and hydrochloric acid gas (HCl) from outer gas cylinders via the gas inlets at the top of the furnace. Hydrogen gas is a carrier gas. The susceptor is supplied with hydrogen gas ($H_2$) and ammonia gas ($NH_3$) via other gas inlet tubes on the top.

Maintaining the furnace at atmospheric pressure, Embodiment 2 (Samples F and G) heats the Ga and In boats at a temperature higher than 800° C. and heats the A- and B-patterned sapphire Undersubstrates F and G at 680° C. Reaction of In and Ga with HCl synthesizes indium chloride $InCl_3$ and gallium chloride GaCl once at upper portions in the vicinity of the In and Ga boats in the furnace. Falling toward the susceptor, $InCl_3$ and GaCl vapors react with the introduced ammonia gas ($NH_3$). Indium gallium nitride ($In_{0.9}Ga_{0.1}N$) is synthesized. $In_{0.9}Ga_{0.1}N$ is piled upon the exposures 48 and the mask stripes 43 of Undersubstrates F and G on the susceptor.

Conditions of epitaxial growth of $In_{0.9}Ga_{0.1}N$ are;

| | |
|---|---|
| Growth temperature | 680° C. |
| $NH_3$ partial pressure | 0.25 atm (25 kPa) |
| HCl partial pressure (In boat) | 0.02 atm (2 kPa) |
| HCl partial pressure (Ga boat) | 0.002 atm (200 Pa) |
| Growth time | 35 hours |
| Thickness | 800 μm |

The above HVPE process produces 800 μm thick $In_{0.9}Ga_{0.1}N$ epi-layers on Undersubstrates F and G having Patterns A and B. FIG. 11(4) shows a sectional view of the $In_{0.9}Ga_{0.1}N$-grown samples. $In_{0.9}Ga_{0.1}N$ crystals grown on the Undersubstrates F and G are named Samples F and G.

[SEM, TEM and CL Observation of Sample F]

A surface of Sample F is observed by a microscope. Sample F has a rack-shaped surface composed of many parallel V-grooves 44 (hills/valleys) aligning with a definite pitch. Each V-groove 44 is built by a pair of inner slanting facets 46 and 46. Namely, the surface looks like an assembly of lying triangle prisms on an image in the microscope. Sometimes, there are flat tops 47 between neighboring V-grooves 44. The flat tops 47 are parallel to a C-plane. The flat tops and regions just under the flat tops are called now "C-plane growth regions". Valleys (bottom lines) 49 of the V-grooves 44 coincide in the vertical direction with the stripes 43 of the mask initially formed. The positions of the valleys (bottom lines) 49 are exactly predetermined by the positions of the stripes 43 of the initially made mask. Facets 46 and C-plane growth regions 47 are made upon the exposure 48 on the $In_{0.9}Ga_{0.1}N$ epi-layer 42. The mask rules the positions and sizes of the valleys 49 of the V-grooves 44.

The V-grooves 44 of Sample F align in parallel with each other with a definite pitch of 400 μm. The 400 μm groove pitch is equal to the stripe mask pitch p=400 μm. The rack-shaped surface is controlled by the initially prepared mask. A valley lies just above a stripe. Valleys and stripes have one-to-one correspondence. The surface is constructed by repetitions of 400 μm pitch wide hills and valleys. Many of the facets building the V-grooves 44 are {11-22} plane facets. Since the stripes have been prepared in parallel to a <1-100> direction which is parallel with a {11-20} plane, the facets are yielded in parallel to the extension of the stripes.

Sometimes the neighboring facets 46 and 46 have an intermediate flat top 47. The flat top is parallel to a C-plane (0001) and a mirror flat plane. The width of the C-plane growth region is about 30 μm. Shallower (less inclining) facets exist at valleys of the V-grooves, following lower ends of the facet 46. A V-groove has two step facets of a pair of steeper facets and a pair of milder facets. Sample F is cleaved in cleavage plane {1-100}. Cleaved sections are observed by a scanning electron microscope (SEM), cathode luminescence (CL) and fluorescence microscope.

The observation reveals special regions 45 which extend in a c-axis direction and have a definite thickness at valleys 49 of the V-grooves 44. The valley-dangling, c-extending regions 45 are discernible from other regions. The c-axis extending region 45 has a width of about 40 μm in Sample F. The CL image gives the valley-dangling regions darker contrast and other regions brighter contrast. The valley dangling regions 45 are clearly discernible in the CL picture. Cleaving Sample F at various spots reveals the fact that the c-axis extending, valley-dangling region 45 has a three-dimensional volume with a definite thickness. Thus, the region 45 is a planar region extending both in the thickness direction and in the mask stripe direction. The planar regions 45 align in parallel with a definite pitch.

Sample F is further examined by the CL and the TEM (transmission electron microscope) for clarifying the valley-hanging regions. Behavior of dislocations of the valley-hanging region turns out to be entirely different from other regions. Dark interfaces 50 intervene between the valley-hanging regions 45 and the other regions. The valley-dangling region 45 enclosed by the interfaces 50 contains a high density of dislocations of $10^8$ cm$^{-2}$ to $10^9$ cm$^{-2}$. Thus, the valley-dangling region 45 is a concentrated assembly of dislocations. The CL observation teaches us that the interfaces 50 are also an assembly of dislocations. Some interfaces 50 are planar dislocation assemblies and others are linear assemblies. No difference of crystal orientations is found between inner parts (valley-dangling region) of the interfaces and outer parts of the interfaces. Namely, the valley-dangling region is a single crystal having the same orientation as the surrounding single crystal regions in Sample F. The valley-dangling dislocation-rich region 45 is called a "voluminous defect accumulating region (H)."

Outer regions (Z and Y) outside of the interfaces 50 which appear as dark contrast in the CL picture have low dislocation density. The regions just below the facet are called "low dislocation single crystal regions (Z)". Dislocation density shows conspicuous contrast between the inner part and the outer part of the interface 50. In the close vicinity of the interfaces, there are transient regions having a medium dislocation density of $10^6$ cm$^{-2}$ to $10^7$ cm$^{-2}$. The dislocation density falls rapidly in proportion to a distance from the interface in the low dislocation single crystal regions (Z). At a point distanced from the interface by 100 μm, the dislocation density reduces to $10^4$ cm$^{-2}$~$10^5$ cm$^{-2}$. Some points close to the interface have a similar low dislocation density of $10^4$ cm$^{-2}$ to $10^5$ cm$^{-2}$. Dislocation density falls outside of the interfaces 50 as a function of the distance from the valleys of the V-grooves. Electric conductivity is high in the low dislocation single crystal regions (Z).

In Sample F, the tops 47 of facets are flat surfaces which are parallel to a C-plane. The regions (Y) just below the C-plane 47 have low dislocation density. The region is called a "C-plane growth region (Y)". The C-plane growth region (Y) is a low dislocation density single crystal with high electric resistance. Three different regions are defined. The first is a voluminous defect accumulating region (H) hanging from a valley of a V-groove. The second one is a low dislocation single crystal region (Z) following a facet and sandwiching the voluminous defect accumulating region (H). The third one is C-plane growth region (Y) following a C-plane top. All the three regions are planar regions extending in parallel to the mask stripes. Thus, H, Y and Z are all parallel to the stripes. The structure is designated by repetitions of . . . YZHZYZHZYZHZYZHZYZH . . . . It is briefly represented by -(HZYZ)$_m$-.

The low dislocation single crystal regions (Z) and C-plane growth regions (Y) contain a small number of dislocations. Almost all of the dislocations extend in parallel to a C-plane in the surrounding regions (Z) and (Y). The C-plane parallel extending dislocations run centripetally toward the voluminous defect accumulating regions (H). The dislocation density in the surrounding regions (Z) and (Y) is slightly high at an early stage of the growth. The dislocation density in (Z) and (Y) decreases with the progress of growth. It is confirmed that the surrounding regions (Z) and (Y) are single crystals.

These results of this examination signify that the facet growth sweeps dislocations outside of the interfaces into the valleys of the V-grooves and the swept dislocations are accumulated within the interfaces 50 and the inner voluminous defect accumulating regions 45(H). Thus, the dislocation density is low in the low dislocation single crystal regions (Z) and the C-plane growth regions (Y) but the dislocation density is high in the voluminous defect accumulating regions (H).

An inner part between two parallel neighboring interfaces is the voluminous defect accumulating region 45 (H) containing many dislocations. An outer part of two parallel neighboring interfaces is a single crystal with few dislocation. The outer part consists of two discernible portions. One is a part transfixed by progressing facets 46 and is defined as a locus of facets. The part is a low dislocation single crystal region (Z). The other is a part left untouched by the progressing facets 46 but is a locus of a rising flat C-plane. The other is a C-plane growth region (Y).

The C-plane growth regions (Y) just under the flat tops (parallel to C-plane) are also ordered single crystals with dislocation density lower than the low dislocation single crystal regions (Z). The C-plane growth region (Y) is not a part which facets have passed through. But, the C-plane growth regions (Y) are upgraded by the function of the voluminous defect accumulating regions (H). Though almost all the surface of a growing In$_{0.9}$Ga$_{0.1}$N crystal is covered with facets and V-grooves, some portions which are uncovered with the facets happen. The facet-uncovered regions are C-plane growth regions (Y) following the flat tops of C-planes. It is confirmed that the C-plane growth regions (Y) are low dislocation density single crystals. But, electric resistivity is high in the C-plane growth regions (Y).

Three regions H, Z and Y should be discriminated from each other. The low dislocation single crystal regions (Z) and the voluminous defect accumulating regions (H) have final C-plane surfaces as a top, when In$_{0.9}$Ga$_{0.1}$N is mechanically processed. Growing surfaces of the voluminous defect accumulating regions (H) and the low dislocation single crystal regions (Z) are not a C-plane but a facet plane. The facets allow a dopant to invade into the growing In$_{0.9}$Ga$_{0.9}$N crystal. The C-plane forbids the dopant from infiltrating into the In$_{0.9}$Ga$_{0.1}$N crystal. The low dislocation single crystal regions (Z) and the voluminous defect accumulating regions (H) are endowed with high electric conductivity. The C-plane growth regions (Y) have poor electric conduction. The low dislocation single crystal regions (Z) and the C-plane growth regions (Y) are favored with low dislocation density in common.

What is important is the relation between the voluminous defect accumulating regions (H) and the facets appearing in the V-groove. Prevalent (steeper) facets appearing in the prism-shaped V-groove are {11-22} planes. The bottoms (valleys) have milder slanting facets having a larger fourth index n. The milder facets lead and cover the voluminous defect accumulating regions (H).

Milder slanting (shallow) facets form the voluminous defect accumulating regions (H) in Samples F. The voluminous defect accumulating region (H) is formed by piling many milder facets. The voluminous defect accumulating regions (H) are enclosed by the milder slanting facets 49 and side vertical interfaces 50 and 50 and are led by the milder facets growing in the vertical direction.

The tops of the milder slanting facets join the bottoms 49 of the steeper facets. The joint line forms a closed loop in the facets. The milder slanting facets meet at a definite obtuse angle at the lowest bottom 49, which has the maximum dislocation density in the voluminous defect accumulating regions (H).

The observation indicates that the steeper facets {11-22} gather dislocations into the valleys 44 and the voluminous defect accumulating regions (H) arrest the dislocations with high density therein.

The present invention reduces dislocations in the single crystal regions (Z) and (Y) surrounding the voluminous defect accumulating region (H) by maintaining facets 46 and facet valleys 44 on a growing surface, making voluminous defect accumulating regions (H) following bottoms of the valleys 44 formed by the facets 46, attracting dislocations of peripheral regions into the voluminous defect accumulating regions (H), annihilating and accumulating the attracted dislocations in the voluminous defect accumulating regions (H) and making the best use of the voluminous defect accumulating regions (H) as dislocation annihilating/accumulating regions.

[SEM, TEM, and CL Observation of Sample G]

Surfaces and cleavage planes of Sample G are observed by SEM (scanning electron microscope), TEM (transmission electron microscope) and CL (cathode luminescence). The result is similar to Sample F.

What is different from Sample F is the width h of the voluminous defect accumulating region (H) at a valley of a V-groove. In Sample F, the closed defect accumulating region (H) has a narrow width $h_A=40$ μm. In Sample G, the closed defect accumulating region (H) has a wide width $h_B=190$ μm. The widths of (H) correspond to the widths of the mask stripes ($S_A=50$ μm, $s_B=200$ μm). The fact implies that the stripe mask makes a similar size of striped voluminous defect accumulating region (H). The positions and the sizes of voluminous defect accumulating region (H) are predetermined by the striped mask. Thus the sizes and positions of the voluminous defect accumulating region (H) are programmable and controllable by the mask.

The voluminous defect accumulating regions (H) of Sample F are homogeneous. The voluminous defect accumulating region (H) of Sample G is linear on the surface but inhomogeneous in inner parts. The surfaces of the voluminous defect accumulating regions (H) of Sample G have a plenty of shallow facets and polycrystalline hillocks besides the normal facets which form normal V-grooves.

The turbulent voluminous defect accumulating regions (H) of Sample G are scrutinized. It is found that there are single crystals in a closed defect accumulating region (H) whose orientations are slightly inclining to the orientation of the surrounding single crystal regions (Z) and (Y). The common orientation of the low dislocation single crystal regions (Z) and the C-plane growth regions (Y) is named a "basic" orientation. It is further found that there are several partial grains in the voluminous defect accumulating region (H) having orientations different from the basic orientation. A further discovery is that the voluminous defect accumulating regions (H) of Sample G include linear defects, planar defects and crystal grains slightly slanting to the basic orientation.

[Processing of Sample F and Sample G]

As-grown samples have rugged top surfaces and bottom undersubstrates. Bottoms of Samples F and G are ground for eliminating the undersubstrates. Top surfaces are also ground for removing the facetted rugged surfaces. Both surfaces are polished into flat, smooth surfaces. About 1 inch φ$In_{0.9}Ga_{0.1}N$ mixture crystal substrate wafers are obtained for Sample F and Sample G, as shown in FIG. 11(5).

The finished $In_{0.9}Ga_{0.1}N$ substrates are (0001) surface (C-surface) wafers. The obtained $In_{0.9}Ga_{0.1}N$ wafers are uniformly transparent for human eyesight. CL observation enables parts of the $In_{0.9}Ga_{0.1}N$ wafers to clarify the differences of growth history as a difference of contrast.

CL examination by irradiating Samples F and G with 360 nm wavelength light which is close to the bandgap of $In_{0.9}G_{0.1}N$ shows a set of parallel linear voluminous defect accumulating regions (H) regularly aligning with a pitch of 400 μm. The 400 μm pitch of the voluminous defect accumulating region (H) is exactly equal to the pitch of the stripe mask 43.

Voluminous defect accumulating regions (H) give dark contrast on the CL image in many cases. Some voluminous defect accumulating regions (H) exhibit bright contrast on the same CL image. Contrast of voluminous defect accumulating regions (H) depends upon positions in the $In_{0.9}Ga_{0.1}N$ crystal. "Dark" or "bright" contrast appears only on the CL picture. $In_{0.9}Ga_{0.1}N$ is entirely uniform and transparent for eye sight. Differences between Z, Y and H can not be detected even with an optical microscope. The CL observation can discern Z, Y and H.

Low dislocation single crystal regions (Z) following the facets 44 appear as parallel bright contrast ribbons extending in a direction on the CL picture. Dark contrast strings are found just at the middles of the bright ribbons of the low dislocation single crystal regions (Z). The dark contrast strings are C-plane growth regions (Y). Parallel bright-dark-bright ribbons turn out to be parallel "ZYZ" stripes.

In the CL picture, facet regions grown with {11-22} facets look bright. C-plane regions grown with (0001) planes (C-plane) look dark. For three CL-discernible regions, the CL gives different contrasts;

| | |
|---|---|
| voluminous defect accumulating regions (H) | bright (partly dark) |
| low dislocation single crystal regions (Z) | bright |
| C-plane growth regions (Y) | dark. |

The voluminous defect accumulating region (H) is a planar region having a definite thickness and extends in parallel with a c-axis direction and an LD stripe direction. The voluminous defect accumulating regions (H) are vertical to a surface of a substrate and penetrate the substrate from the top to the bottom.

The voluminous defect accumulating regions (H), low dislocation single crystal regions (Z) and C-plane growth regions (Y) are all invisible to eye-sight but are discernible by the CL.

A polished $In_{0.9}Ga_{0.1}N$ crystal is a flat, smooth substrate without facets as shown in FIG. 11(5). Dislocation density is measured on the sample substrates. CL, etching and TEM can discern threading dislocations. The CL observation is most suitable for examining dislocation density.

A threading dislocation looks like a dark dot in the CL picture. Samples F and G reveal highly concentrated dislocations in the voluminous defect accumulating regions (H). Interfaces (K) enclosing the voluminous defect accumulating regions (H) appear as linear arrays of dislocations.

The interfaces (K) are three-dimensional planar defects. Dark contrast clearly discriminates the interface (K) 50 from bright Z and bright H. The interface (K) is composed of planar defects or dislocation bundles.

Sample F carrying a 50 μm width mask reveals the occurrence of parallel striped voluminous defect accumulating regions (H) with a 40 μm width. Sample G with a 200 μm width mask reveals the occurrence of parallel striped voluminous defect accumulating regions (H) with a 190 μm width. The initial mask stripe width rules the width of the voluminous defect accumulating regions (H). The width of H is equal to or slightly smaller than the width of stripes.

Sample F and Sample G reveal low dislocation density in the low dislocation single crystal regions (Z) and the C-plane growth regions (Y). Dislocations decreases in proportion to a distance from the voluminous defect accumulating region (H). Somewhere in the low dislocation single crystal regions (Z), dislocations decreases rapidly and discontinuously just outside of the interfaces. The average of dislocation density is less than $5\times10^6$ cm$^{-2}$ in the low dislocation single crystal regions (Z) and the C-plane growth regions (Y) of Samples F and G.

In the low dislocation single crystal regions (Z) and the C-plane growth regions (Y), dislocations run centripetally toward the central voluminous defect accumulating regions (H) in parallel to the C-plane in Samples F and G. Dislocations are gathered, annihilated and accumulated in the voluminous defect accumulating regions (H). The voluminous defect accumulating regions (H) lower dislocation density in the other regions (Z) and (Y) by annihilating/accumulating dislocations. The $In_{0.9}Ga_{0.1}N$ substrates of Samples F and G are mixture crystals with dislocations decreased by the action of the voluminous defect accumulating regions (H).

The $In_{0.9}Ga_{0.1}N$ substrates of Samples F and G are etched in a heated KOH (potassium hydroxide) solution. The KOH etchant has anisotropic etching rates. An InGa-plane ((0001) InGa) is difficult to etch. But, an N-plane ((000-1)N) is easy to etch. Anisotropy shows whether individual parts are an N-plane or an InGa-plane on an $In_{0.9}Ga_{0.1}N$ (0001) surface.

The low dislocation single crystal regions (Z) and the C-plane growth regions (Y) are unetched. The voluminous defect accumulating regions (H) are partly etched but partly unetched.

The etching test means that the voluminous defect accumulating regions (H) have (000-1)N planes as well as (0001) InGa planes. The low dislocation single crystal regions (Z) and the C-plane growth regions (Y) have all (0001)InGa planes. Namely, the surrounding portions (Z) and (Y) are (0001) single crystals.

Some parts of the voluminous defect accumulating regions (H) are single crystals having the same polarity as (Z) and (Y) and other parts of the voluminous defect accumulating regions (H) are single crystals having a polarity reverse to the surrounding regions (Z) and (Y). The reversed portion having (000-1)N-planes is deeply etched by KOH.

Sample F with a 50 μm wide stripe mask and Sample G with a 200 μm wide stripe mask reveal similar properties. The exception is widths h of the voluminous defect accumulating regions (H). Sample F shows 40 μm wide voluminous defect accumulating regions (H) ($h_A$=40 μm). Sample G shows 190 μm wide voluminous defect accumulating regions (H) ($h_B$=190 μm). The result confirms that the width h of the voluminous defect accumulating regions (H) can be uniquely determined by the widths of mask stripes implanted on the undersubstrate.

Efficient exploitation of the substrate area requires narrower voluminous defect accumulating regions (H), wider low dislocation single crystal regions (Z) and wider C-plane growth regions (Y). Excess large voluminous defect accumulating regions (H) are undesirable, because they have a tendency to include abnormal intrinsic defects. The above two reasons favor narrower voluminous defect accumulating regions (H).

The reduction of voluminous defect accumulating regions (H) requires to decrease a stripe width s. Yielding facets requires a definite width s for mask stripes. Too narrow stripes, however, can produce neither facets nor voluminous defect accumulating regions (H). Without facets, neither voluminous defect accumulating regions (H), nor low dislocation single crystal regions (Z) nor C-plane growth regions (Y) happen. A lower limit of the stripe width s is searched by the following Sample I.

[Growth of Sample I (Stripe Width s=2 μm, Pitch p=20 μm)]

Sample I starts from Undersubstrate I of Pattern C having a set of parallel 2 μm stripes 43 aligning with a 20 μm pitch (s=2 μm, p=20 μm). An $In_{0.9}Ga_{0.1}N$ film is grown on the masked Undersubstrate I by the same facet growth based on the HVPE method as Samples F and G.

The 2 μm stripes 43 of an $SiO_2$ mask are buried with $In_{0.9}Ga_{0.1}N$ by the HVPE. Although facets occur on a growing surface, valleys of V-grooves happen accidentally and contingently here and there without definite relation with implanted mask stripes. The stripes cannot be seeds of valleys of V-grooves. Random distributing facets cover a surface of Sample I. The HVPE cannot control the positions of the valleys of V-grooves. The HVPE turns out to be inadequate for Pattern C which has a too narrow width s and a too narrow pitch p.

Then, instead of the HVPE, an $In_{0.9}Ga_{0.1}$. N crystal is grown by an MOCVD method at a low speed. Reduction of the growing speed aims at making parallel V-grooves having valleys at the stripe masks ($SiO_2$) 43.

The MOCVD method employs metallorganic materials for In and Ga sources, for example, trimethylgallium or triethylgallium (TMG, TEG) and trimethylindium or triethylindium (TMI, TEI) instead of metal Ga and metal In. Here, trimethylindium (TMI) and trimethylgallium (TMG) are supplied as In and Ga sources. Other gas source materials are ammonia gas ($NH_3$ gas: group 5 gas) and hydrogen gas ($H_2$; carrier gas).

An $In_{0.9}Ga_{0.1}N$ crystal is grown in a furnace of an MOCVD apparatus by laying Undersubstrate I on a susceptor of the furnace, heating Undersubstrate I up to 680° C., and supplying material gases in volume ratios of TMI: TMG: $NH_3$=9:1: 30000 to Undersubstrate I. The growing speed is 1 μm/h. The growth time is 48 hours. A 50 μm thick $In_{0.9}Ga_{0.1}N$ crystal having V-grooved facets is obtained. This is called Sample I.

In the growth, an $In_{0.9}Ga_{0.1}N$ crystal having parallel valleys 49 of V-grooves 44 just above the stripe masks 43 is made. Positions of the facet valleys 49 coincide with the positions of the striped masks 43. This means that the positions of the masks 43 enable the positions of the V-grooves to be controllable. Further, voluminous defect accumulating regions (H) are found to grow under the bottoms 49 of the V-grooves 44.

Undersubstrate I has a very small mask width of s=2 μm. In accordance with the tiny mask width, parallel V-grooves produce thin voluminous defect accumulating regions (H) with a 1 μm width at the bottoms. This fact means that the width of mask rules the width of voluminous defect accumulating region (H). 2 μm is the lowest limit of mask width and 1 μm is the least width of the voluminous defect accumulating region (H). Low dislocation density realized in the surrounding single crystal regions (Z) and (Y) is confirmed by the TEM observation. Sample I features smallness of the voluminous defect accumulating regions (H). It is confirmed that the MOCVD enables a narrow width stripe mask to make narrow parallel voluminous defect accumulating regions (H). The MOCVD of a small growing speed is suitable for making the narrow width voluminous defect accumulating regions (H) instead of the HVPE of a high growing speed.

[Growth of Sample J (Stripe Width s=300 μm, Pitch p=2000 μm)]

Sample J grows an $In_{0.9}Ga_{0.1}N$ crystal on Undersubstrate J with a stripe mask having many parallel 300 μm wide stripes aligning in a vertical direction with a 2000 μm pitch (Pattern D). Pattern D is an example of a large width s and a large pitch p (spatial period) for examining the upper limits of s and p.

Sample J grows $In_{0.9}Ga_{0.1}N$ by the HVPE method like Sample F and Sample G on the following conditions.

| | |
|---|---|
| Growth temperature | 650° C. |
| NH₃ partial pressure | 0.3 atm (30 kPa) |
| HCl partial pressure (In boat) | 0.02 atm (2 kPa) |
| HCl partial pressure (Ga boat) | 0.002 atm (200 Pa) |
| Growth time | 140 hours |
| Thickness | 2900 μm |

The HVPE method produces a 2.9 mm thick $In_{0.9}Ga_{0.1}N$ mixture crystal. Sample J shows a rack-shaped (V-grooved) surface having parallel valleys and hills made by facets extending in parallel to mask stripes. Plenty of parallel voluminous defect accumulating regions (H) accompany parallel valleys 49 of V-grooves 44 with the same pitch p=2000 μm. Positions of the voluminous defect accumulating region (H) exactly coincide with the positions of initially-prepared stripes 43. This fact means that the stripes induce the voluminous defect accumulating regions (H) above them.

Some of the facets 46 building the V-grooves 44 deform. Tiny pits and small hillocks appear on some of hills composed of facets aligning parallely and regularly in accordance with the mask stripes.

Parallel voluminous defect accumulating regions (H) occur with a period of 2000 μm which is equal to the pitch p=2000 μm of the mask stripes. Hills and valleys maintain a regular rack-shape constructed by parallel lying prism-like columns. But, some parts are distorted. Some ends of the V-grooves are defaced. Some facets have different index facets partially. The area of C-plane growth parts on the tops between neighboring V-grooves has fluctuation.

In spite of the irregularity of facets and V-grooves, voluminous defect accumulating regions (H) lie at the predetermined lines just above the mask stripes. The width of the voluminous defect accumulating region (H) is about 250 μm. Sample J shows a tendency to decrease the width of the voluminous defect accumulating region (H) in the proceeding of growth.

An excess large width h tends to incur abnormal-shaped polycrystalline regions in the large voluminous defect accumulating regions (H) in Sample J. The abnormal-shaped polycrystalline regions induce disorder of dislocations which overrun the voluminous defect accumulating regions (H) into the surrounding low dislocation single crystal regions (Z) and C-plane growth regions (Y).

The voluminous defect accumulating region (H), even if distorted, produces the low dislocation single crystal regions and C-plane growth regions on both sides. The average of dislocation density in the surrounding low dislocation single crystal regions (Z) and C-plane growth regions (Y) is less than $5 \times 10^6$ cm$^{-2}$. The fact signifies that even deforming voluminous defect accumulating region (H) has the function of dislocation reduction.

There are regions having bundles of dislocations outside of the voluminous defect accumulating regions (H), where shapes of facets are seriously distorted.

Examinations of Samples F, G, I and J clarify the fact that the width h of the voluminous defect accumulating region (H) is in the range from 2 μm to 200 μm, the width s of the stripes of a mask is in the range from 2 μm to 300 μm, and the pitch p of the voluminous defect accumulating region (H) is in the range from 20 μm to 2000 g m, for accomplishing the purposes of the present invention.

[Growth of Sample K (Stripe Direction <11-20>; Stripe Width s=50 μm, Pitch p=400 μm)]

Sample K grows an $In_{0.9}Ga_{0.1}N$ mixture crystal on Undersubstrate K which is covered with a mask of Pattern E having parallel <11-20> extending 50 μm wide stripes aligning with a 400 μm pitch. Mask pattern E is similar to Mask pattern A with a 50 μm width and with a 400 μm pitch. But, Pattern E is different from Pattern A in extending directions. Pattern E has stripes extending in <11-20>. Stripes of Pattern A extend in <1-100>. Extension of the stripes of Undersubstrate K is parallel to cleavage planes {1-100}.

Other conditions of Sample K except the stripe direction are similar to Sample F. An $In_{0.9}Ga_{0.1}N$ crystal is grown on Undersubstrate K by the HVPE method on the following conditions.

| | |
|---|---|
| Growth temperature | 680° C. |
| NH₃ partial pressure | 0.25 atm (25 kPa) |
| HCl partial pressure (In boat) | 0.02 atm (2 kPa) |
| HCL partial pressure (Ga boat) | 0.002 atm (200 Pa) |
| Growth time | 35 hours |
| Thickness | 600 μm |

Growth on Pattern E is slow. Thirty five hour-growth brings about a 600 μm thick $In_{0.9}Ga_{0.1}N$ film. Unification of stripe-shaped crystals is difficult on Pattern E. Thus, the growing speed is low. A 600 μm $In_{0.9}Ga_{0.1}N$ crystal is obtained for Sample K on Pattern E by the thirty-five hour growth.

Somewhere no unification of crystals occurs in Sample K and deep gaps separate neighboring grains. Thicknesses of Sample K are not uniform but have large fluctuation. Random facets appear in Sample K without dominant facets.

Somewhere crystals are unified and have uniform surfaces. Slightly deformed voluminous defect accumulating regions (H) are formed at valleys of facets. At the regions where linear voluminous defect accumulating regions (H) align, the positions of the voluminous defect accumulating regions (H) coincide with the predetermined positions of the mask stripes.

Crystallographical property is analyzed. In Sample K, the voluminous defect accumulating regions (H) turn out to be polycrystalline. Sample K is different from the former Samples F, G, I and J in the polycrystalline voluminous defect accumulating regions (H).

Dislocation distribution in Sample K is examined by a TEM. The TEM confirms that dislocation density is very low in the low dislocation single crystal regions (Z) and the C-plane growth regions (Y) outside of the polycrystalline voluminous defect accumulating regions (H). A spot quite close to the voluminous defect accumulating regions (H) shows $7 \times 10^6$ cm$^{-2}$ in dislocation density. Dislocation density decreases in proportion to a distance from (H). The average of the dislocation density is less than $5 \times 10^6$ cm$^{-2}$ in the low dislocation single crystal regions (Z) and the C-plane growth regions (Y). The least dislocation density is $5 \times 10^5$ cm$^{-2}$.

Sample K ensures that even a <11-20> direction of stripes takes effect of the present invention. The <11-20> stripe direction of Sample K has still drawbacks in comparison with the <1-100> stripe direction employed in Samples F, G, I and J. The drawbacks, however, will be overcome in near future.

Embodiment 3

Figure 12:
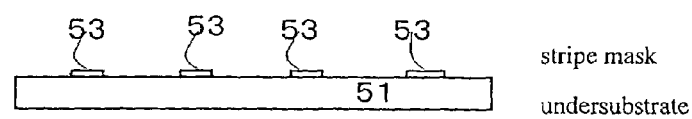
FIGS. 12(1) to 12(3) are sectional views of a sample at various steps for demonstrating the steps of Embodiment 3 of the present invention of making a lineary extending stripe mask on an undersubstrate, growing an $Al_{0.3}In_{0.3}Ga_{0.4}N$ crystal on masked undersubstrate, producing linear facets on the stripe mask, producing voluminous defect accumulating regions (H) under valleys of the facets, growing low dislocation single crystal regions (Z) neighboring the voluminous defect accumulating regions (H), grinding a rugged faceted surface, eliminating the undersubstrate for separating an $Al_{0.3}In_{0.3}Ga_{0.4}N$ substrate, and lapping and polishing the $Al_{0.3}In_{0.3}Ga_{0.4}N$ substrate.
Figure 12:
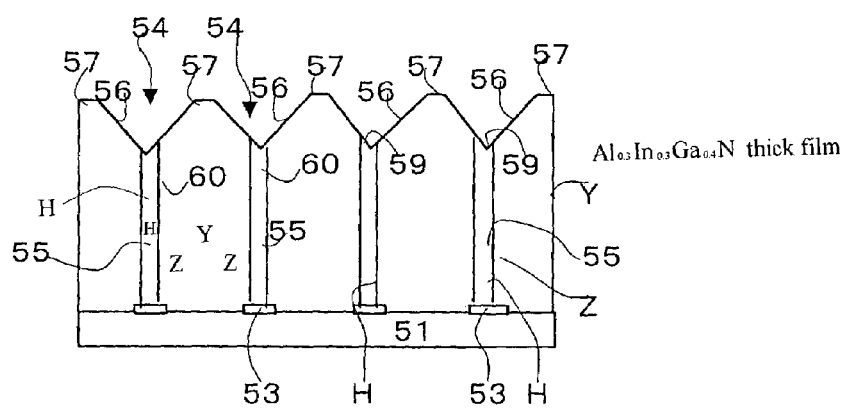
Figure 12:
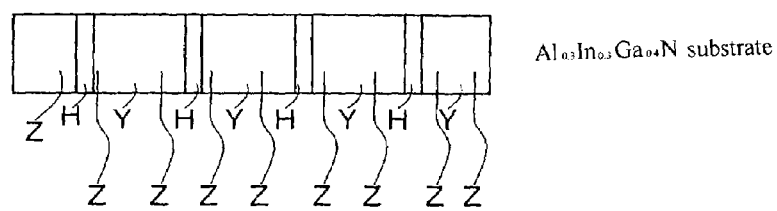

$Al_{0.9}In_{0.3}Ga_{0.4}N$ (x=0.3,y=0.3: GaAs, Si, Sapphire Undersubstrate; Pattern A, H(A+ELO); FIG. 12

Embodiment 3 prepares three different undersubstrates;
α. GaAs (111)A-surface undersubstrate,
β. sapphire C-plane (0001) undersubstrate, γ. Si(111) undersubstrate Silicon (Si) is a diamond (C) type cubic symmetry crystal. Gallium arsenide (GaAs) is a zinc blende type (ZnS) cubic symmetry crystal. $Al_{0.3}In_{0.3}Ga_{0.4}N$ is a wurtzite type (ZnS) hexagonal symmetry crystal. A C-plane of the wurtzite type has three-fold rotation symmetry. In cubic symmetry, only a (111) plane has three-fold rotation symmetry. In the case of Si, a (111) surface crystal is available for an undersubstrate. In the case of GaAs, a (111) plane has two discernible types due to lack of inversion symmetry. One (111) is a surface covered with dangling Ga atoms, which is denoted by (111)A plane. The other (111) is a surface covered with dangling As atoms, which is designated by (111)B plane. "A" means group 3 element. "B" means group 5 element. A GaAs (111)A surface crystal can be a candidate for an undersubstrate. Sapphire belongs to a trigonal symmetry group. Sapphire lacks three-fold rotation symmetry. In the case of sapphire, a (0001) C-plane wafer is a candidate for an undersubstrate for growing an $Al_{0.3}In_{0.3}Ga_{0.4}N$ crystal.

FIGS. 12(1) to 12(3) show steps of making an $Al_{0.3}In_{0.3}Ga_{0.4}N$ crystal upon foreign material undersubstrates of Embodiment 3. Embodiments 1 and 2 preparatorily form intermediate films on the undersubstrates. Without an intermediate film, Embodiment 3 directly makes a stripe mask 53 on an undersubstrate 51. A mask of Pattern A is prepared by covering the undersubstrate with a 0.1 μm mask material of $SiO_2$ and making parallel seed stripes by photolithography.

Embodiment 3 employs a new Pattern U besides Pattern A. Pattern U has an ELO (epitaxial lateral overgrowth) mask in addition to Pattern A (U=A+ELO). The ELO mask is complementarily formed on parts uncovered with the stripes of Pattern A. The ELO mask is a hexagonal symmetric pattern arranging 2 μmϕ round windows at corner points of plenty of equilateral triangles having a 4 μm side aligning indefinitely in hexagonal symmetry. The direction of the ELO mask is determined by adjusting a side of the unit triangle in parallel to the stripe extension of the stripe mask. The ELO pattern, in general, has a smaller pitch than the stripe mask. Pattern U is a hybrid pattern containing the stripe mask and the ELO mask.

Pattern A: stripe width s=50 μm, pitch p=400 μm
Pattern U: Pattern A (s=50 μm, p=400 μm)+ELO mask (2 μm×4 μm; 6-fold symmetry)

Since the mask is formed upon an undersubstrate without $Al_{0.3}In_{0.3}Ga_{0.4}N$, the direction of the mask cannot be defined with reference to an $Al_{0.3}In_{0.3}Ga_{0.4}N$ crystal. The direction must be defined by the orientation of the undersubstrate crystal. In the case of a GaAs undersubstrate, the stripe direction is adjusted to be parallel to a <11-2> direction of the GaAs undersubstrate. In the case of a sapphire undersubstrate, the stripe direction is determined to be parallel to a <11-20> direction of the sapphire undersubstrate. In the case of a silicon undersubstrate, a <11-2> direction of silicon is the stripe direction. Four masked undersubstrates are prepared with different patterns and different materials.

Undersubstrate L: a (111) GaAs undersubstrate having a Pattern A mask
Undersubstrate M: a (0001) sapphire undersubstrate having a Pattern A mask
Undersubstrate N: a (111) Si undersubstrate having a Pattern A mask
Undersubstrate O: a (111) GaAs undersubstrate having a Pattern U (A+ELO) mask FIG. 12(1) demonstrates an undersubstrate 51 with mask stripes 53. Similarly to Embodiment 1, an HVPE apparatus grows $Al_{0.3}In_{0.3}Ga_{0.4}N$ layers on the masked undersubstrate 51 of Samples L to O in Embodiment 3. The HVPE apparatus has a hot wall tall furnace, an In-boat and a Ga-boat sustained at upper spots in the furnace, a susceptor positioned at a lower spot in the furnace, $H_2$—, HCl—, $NH_3$— and $AlCl_3$-gas inlets for supplying $H_2$, HCl and $NH_3$ gases, a gas exhausting outlet, a heater and a vacuum pump. Supplying $H_2$ and HCl gases via the gas inlets to the Ga-boat produces gallium chloride (GaCl) by a reaction of $2HCl+2Ga\rightarrow 2GaCl+H_2$. Supplying $H_2$ and HCl gases via the gas inlets to the In-boat produces indium chloride ($InCl_3$) by another reaction of $6HCl+2In\rightarrow 2InCl_3+3H_2$. Falling down toward the heated susceptor, $InCl_3$ and GaCl gasses react with ammonia ($NH_3$). $Al_{0.3}In_{0.3}Ga_{0.4}N$ is synthesized. Synthesized $Al_{0.3}In_{0.3}Ga_{0.4}N$ piles upon the masked undersubstrates. Two step growth produces a thin $Al_{0.3}In_{0.3}Ga_{0.4}N$ buffer layer at a lower temperature and a thick $Al_{0.3}In_{0.3}Ga_{0.4}N$ epi-layer at a higher temperature upon the undersubstrates.

(1. Growth of an $Al_{0.3}In_{0.3}Ga_{0.4}N$ Buffer Layer)

A thin $Al_{0.3}In_{0.3}Ga_{0.4}N$ buffer layer is grown on an undersubstrate of GaAs, sapphire or Si by an HVPE method under the following conditions.

| | |
|---|---|
| Ammonia ($NH_3$) partial pressure | 0.3 atm (30 kPa) |
| $AlCl_3$ partial pressure | 0.002 atm (200 Pa) |
| HCl partial pressure (In boat) | 0.002 atm (200 Pa) |
| HCl partial pressure (Ga boat) | 0.001 atm (100 Pa) |
| Growth temperature | 350° C. |
| Growth time | 20 minutes |
| Thickness | 30 nm |

(2. Growth of an $Al_{0.3}In_{0.3}Ga_{0.4}N$ Epi-Layer)

The HVPE method produces an $Al_{0.3}In_{0.3}Ga_{0.4}N$ epitaxial layer on the low-temperature grown $Al_{0.3}In_{0.3}Ga_{0.4}N$ buffer layer at a high temperature under the following conditions.

| | |
|---|---|
| Ammonia ($NH_3$) partial pressure | 0.3 atm (30 kPa) |
| $AlCl_3$ partial pressure | 0.03 atm (3 kPa) |
| HCl partial pressure (In boat) | 0.03 atm (3 kPa) |
| HCl partial pressure (Ga boat) | 0.01 atm (1 kPa) |
| Growth temperature | 700° C. |
| Growth time | 65 hours |
| Thickness | about 900 μm (0.9 mm) |

Samples L to O all yield transparent 0.9 mm thick $Al_{0.3}In_{0.3}Ga_{0.4}N$ crystals. Appearances are similar to the samples of Embodiment 1. The transparent $Al_{0.3}In_{0.3}Ga_{0.4}N$ crystals look like a glass plate. The surfaces are occupied by assemblies of facets.

Samples L to O have {11-22} planes as the most prevailing facets 56. Mirror flat tops 57 appear on hills between the neighboring {11-22} facets 56. The mirror flat tops 57 have a 20 to 40 μm width. Shallower facets appear at bottoms between the neighboring {11-22} facets. A double facet structure occurs also in Samples L to O. Embodiment 3 is similar to Embodiment 1 in appearance.

Four samples L to O are mechanically processed. Grinding eliminates the undersubstrates of GaAs, Si or sapphire from the bottoms of the grown-substrates. Lapping removes the rugged morphology on the top surfaces. Mechanical processing of the GaAs undersubstrates (Samples L and O) and the Si undersubstrate (Sample N) is more facile than the sapphire undersubstrate (Sample M). Following polishing makes flat mirror $Al_{0.3}In_{0.3}Ga_{0.4}N$ substrates of a 2 inch diameter. FIG. 12(3) demonstrates the section of the mirror polished wafer.

The grown $Al_{0.3}In_{0.3}Ga_{0.4}N$ crystals of Samples L to O are (0001) C-plane substrates. The substrate crystals are transparent, flat and smooth. Top surfaces are covered with linear voluminous defect accumulating regions (H) regularly and periodically aligning in parallel. The width of the voluminous defect accumulating regions (H) is 40 µm. Low dislocation single crystal regions (Z) and C-plane growth regions (Y) align in parallel between the neighboring voluminous defect accumulating regions (H). Samples L to O carry a cyclic structure of "ZHZYZHZYZH . . . " repeating in a direction perpendicular to the extending direction of the voluminous defect accumulating regions (H).

Dislocation density is small in the low dislocation single crystal regions (Z) and the C-plane growth regions (Y). Dislocations decrease in proportion to a distance from the interface (K) in the low dislocation single crystal regions (Z). Somewhere dislocations rapidly decrease by a quite short distance from the interface in the low dislocation single crystal regions (Z). Averages of the dislocation density in the low dislocation single crystal regions (Z) and the C-plane growth regions (Y) are less than $5\times10^6$ $cm^{-2}$ for all the samples L, M, N and O. The averages of the samples are;

| | |
|---|---|
| Sample L (GaAs undersubstrate): | $2 \times 10^6$ $cm^{-2}$ |
| Sample M (sapphire undersubstrate): | $1 \times 10^6$ $cm^{-2}$ |
| Sample N (Si undersubstrate): | $3 \times 10^6$ $cm^{-2}$ |
| Sample O (GaAs undersubstrate): | $9 \times 10^5$ $cm^{-2}$. |

Sample O, which is based upon the ELO-including hybrid mask, is endowed with the least dislocation density ($0.9\times10^6$ $cm^{-2}$). The state of the voluminous defect accumulating regions (H) of Samples L to O is similar to Sample A of Embodiment 1. The voluminous defect accumulating regions (H) stand just upon the mask stripes 53 in Samples L, M, N, and O. Linear facets 56 with a definite width grow into grooves on both sides of valleys 59 lying upon the voluminous defect accumulating regions (H). Growth of the facets gathers dislocations on the facets into the valley-hanging voluminous defect accumulating regions (H) in all the samples L to O.

Fluorescence microscope observes the voluminous defect accumulating regions (H) appearing on the surface of Samples L to O. It is confirmed that the voluminous defect accumulating regions (H) penetrate the substrate from the top to the bottom in all the samples L to O.

The ELO-carrying Sample O is further examined. Etching Sample O at 200° C. with a mixture of sulfuric acid ($H_2SO_4$) and nitric acid ($HNO_3$) produces parallel striped cavities just upon the voluminous defect accumulating regions (H) on the top surface. Other portions (Z and Y) are unetched on the top surface.

On the bottom surface, the voluminous defect accumulating regions (H) are left unetched but the other portions (Z and Y) are etched into cavities. The etchant ($H_2SO_4+HNO_3$) has selectivity of etching. A (0001)Ga plane has strong resistance but a (000-1)N plane has weak resistance against the etchant. Selective etching examination signifies that the voluminous defect accumulating regions (H) are single crystals having a c-axis antiparallel (inverse) to the c-axis of the other (Z and Y) portions.

In Sample O, the shallower facets leading the voluminous defect accumulating regions (H) should have inverse facet planes (11-2-5) or (11-2-6) and should have grown in a -c-axis direction <000-1>.

Two specimens L1 and L2 are made for Sample L having a (111) GaAs undersubstrate. Specimen L1 is a good $Al_{0.3}In_{0.3}Ga_{0.4}N$ crystal. Specimen L2 shows some defaults.

Specimen L2 contains parts having neither V-grooves nor linear facets upon the stripes. Instead of V-grooves, an array of inverse dodecagonal pits aligns on the stripes in L2.

L2 contains prism-shaped facets 56 having V-grooves on other parts. But, the CL observation reveals that no voluminous defect accumulating region (H) exists under valleys of the facet grooves. The facet grooves are vacant. The voluminous defect accumulating regions (H) should be produced under the valleys of facets in the teaching of the present invention. L2 deviates from the scope of the present invention. The reason why such vacant V-grooves are formed in L2 is not clarified yet.

Some reason prevents voluminous defect accumulating regions (H) from occurring on the stripes. Lack of the linear voluminous defect accumulating region (H) prohibits linear facets from happening. Extinction of the linear voluminous defect accumulating regions (H) induces conical round pits of facets instead of V-grooves. Appearance of unexpected discrete facet pits contradicts the purpose of the present invention. Why are undesired discrete conical facet pits produced instead of liner parallel V-grooves?

Specimen L2 of Sample L requires a detailed examination. The areas bearing many discrete facet pits are plagued with dispersion of once-converged dislocations in a wide range. Dislocation density of L2 (Sample L) is $7\times10^6$ $cm^{-2}$ which is higher than other samples having voluminous defect accumulating regions (H) following the valleys of facet V-grooves.

Figure 1:
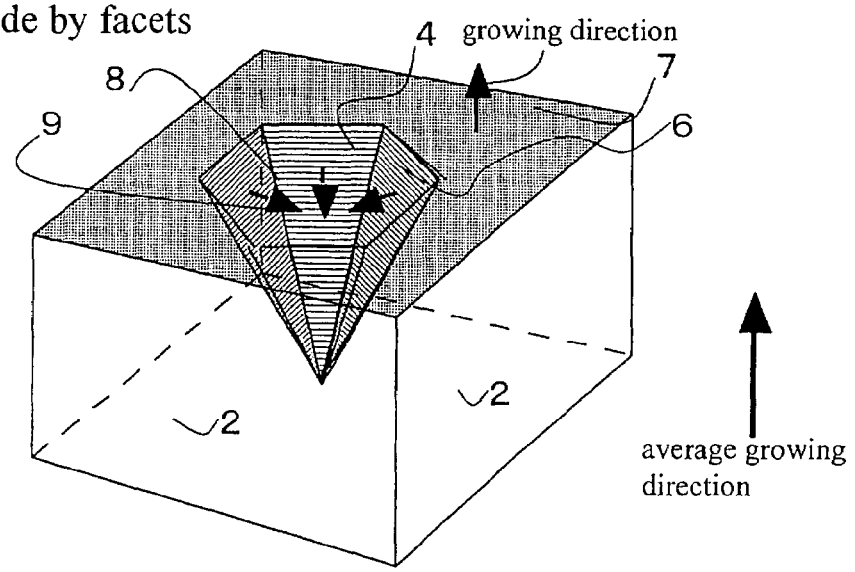
FIGS. 1(a) and 1(b) are perspective views of a pit composed of facets which have been produced by the facet growth method, which was proposed in the previous Japanese Patent Laying Open No. 2001-102307 invented by the inventors of the present invention, for growing a GaN crystal with maintaining facets on a growing surface, and for clarifying that facets grow slantingly inward and gather dislocations to corner lines.
Figure 1:
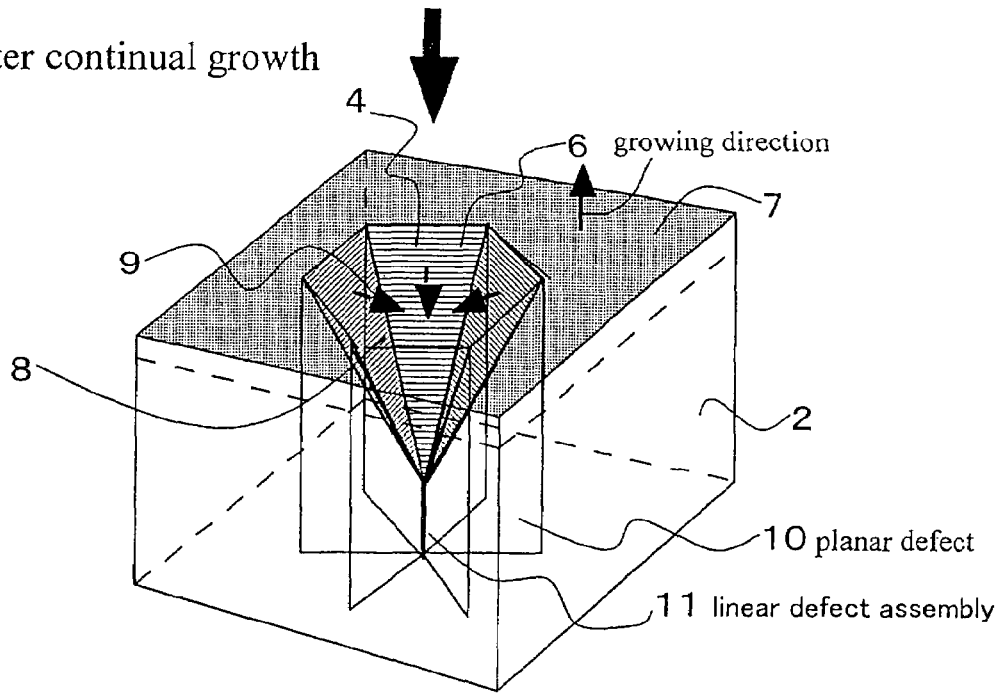
Figure 2:
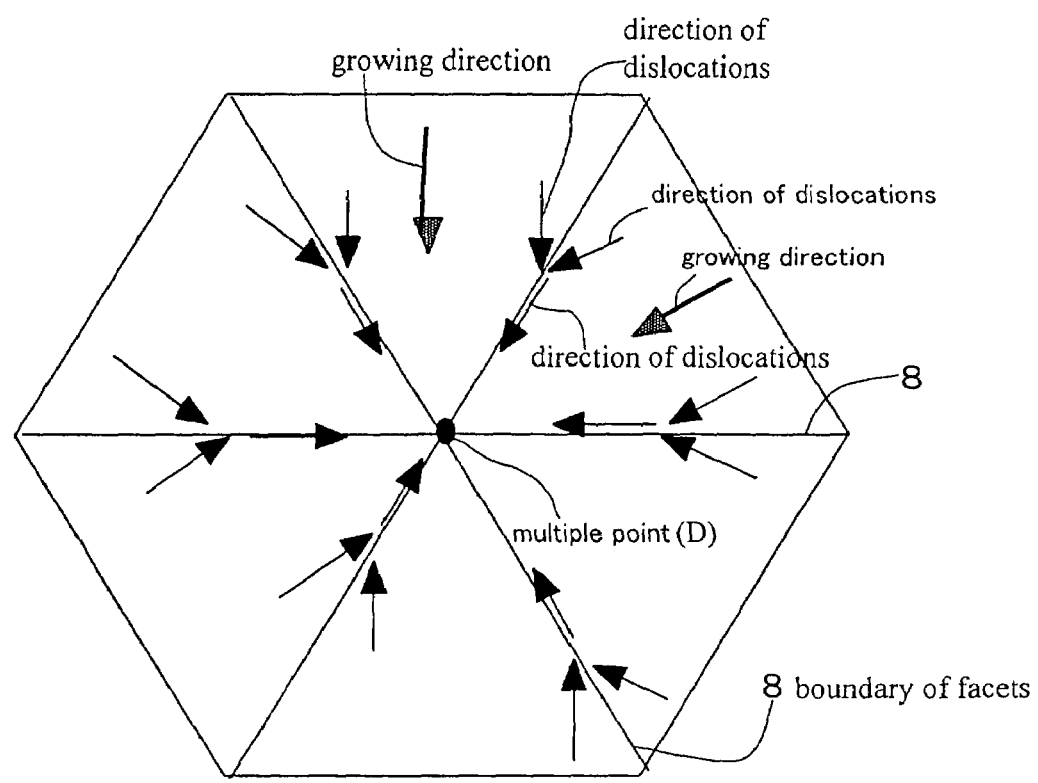
FIG. 2 is a plan view of a pit for showing that dislocations are swept and gathered to corner lines by inward growing facets and accumulated at dislocation confluence (manifold point) under the center bottom of the pit in the facet growth suggested by Japanese Patent Laying Open No. 2001-102307 invented by the inventors of the present invention.
Figure 3:
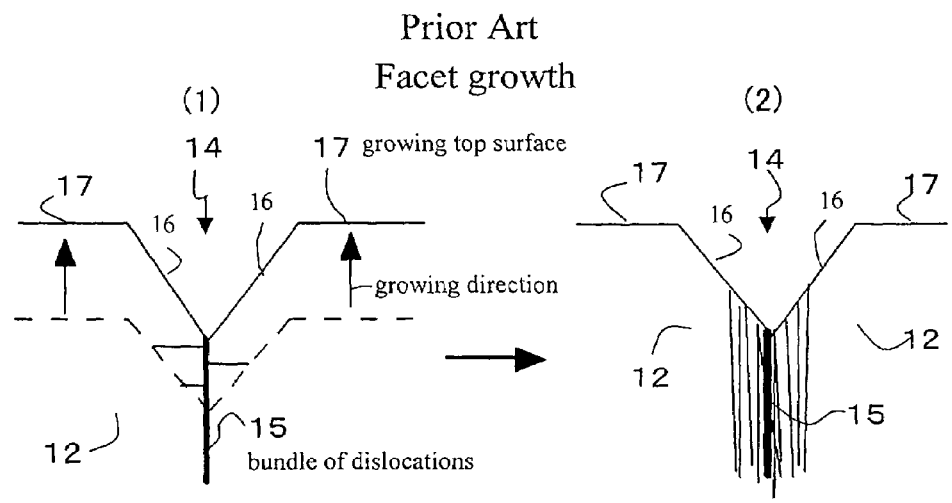
FIGS. 3(1) and 3(2) are vertically sectioned views of a pit for showing that dislocations are swept and gathered to the corner lines by inward growing facets are accumulated at dislocation confluence (manifold point) under the center bottom of the pit and are shaped into longitudinally extending bundles of dislocations hanging from the bottom in the facet growth suggested by Japanese Patent Laying Open No. 2001-102307 invented by the inventors of the present invention.
Figure 4:
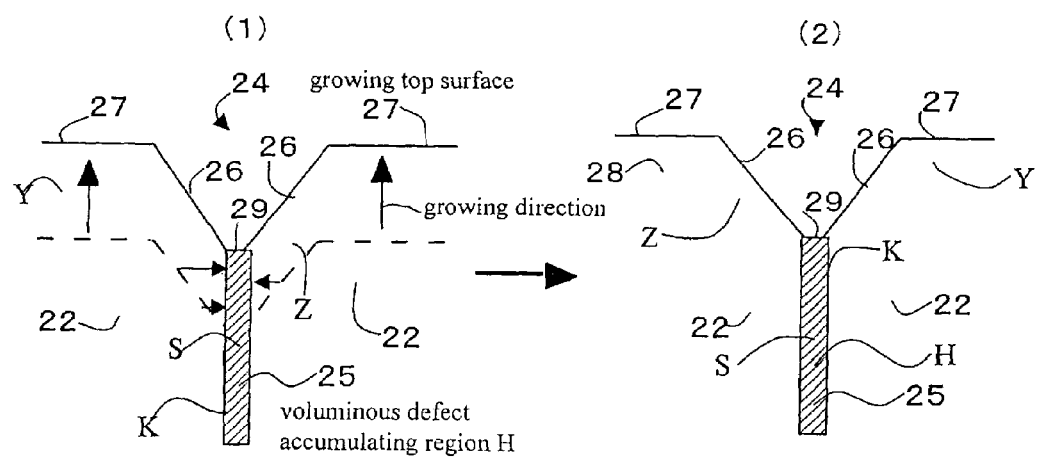
FIGS. 4(1) and 4(2) are vertically sectioned views of a longitudinally extending V-groove having a valley for showing that dislocations are transferred by inward growing facets and are formed into voluminous defect accumulating regions (H) dangling from the valley of the facets.
Figure 5:
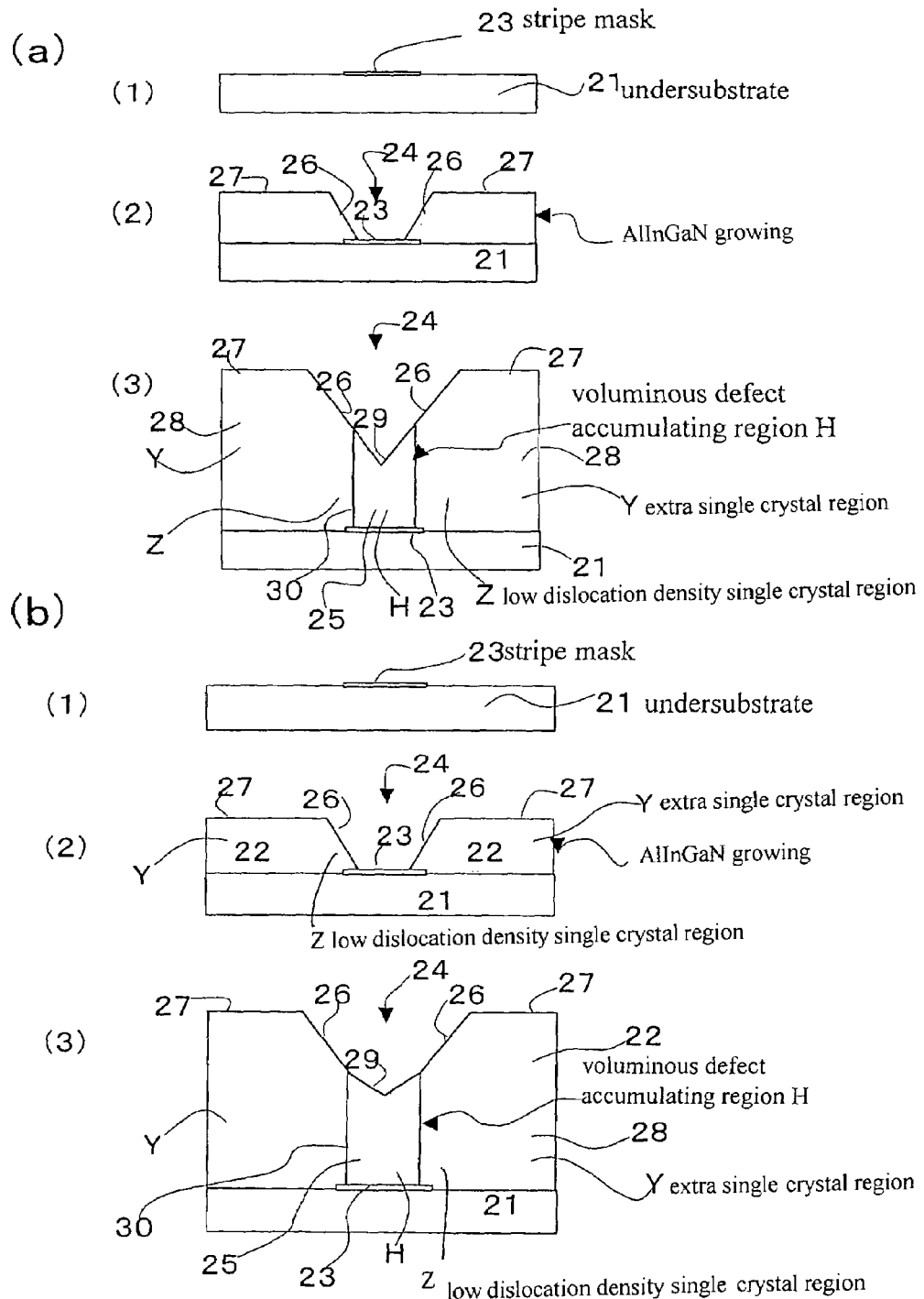
FIGS. 5(a) and 5(b) are sectional views of a sample at various steps for demonstrating the steps of the present invention of making a linearly extending stripe mask on an undersubstrate, growing an $Al_xIn_yGa_{1-x-y}N$ crystal on the masked undersubstrate, producing linear facets on the stripe mask, producing voluminous defect accumulating regions (H) under the valleys of the facets, and growing low dislocation single crystal regions (Z) neighboring the voluminous defect accumulating regions (H).
Figure 6:
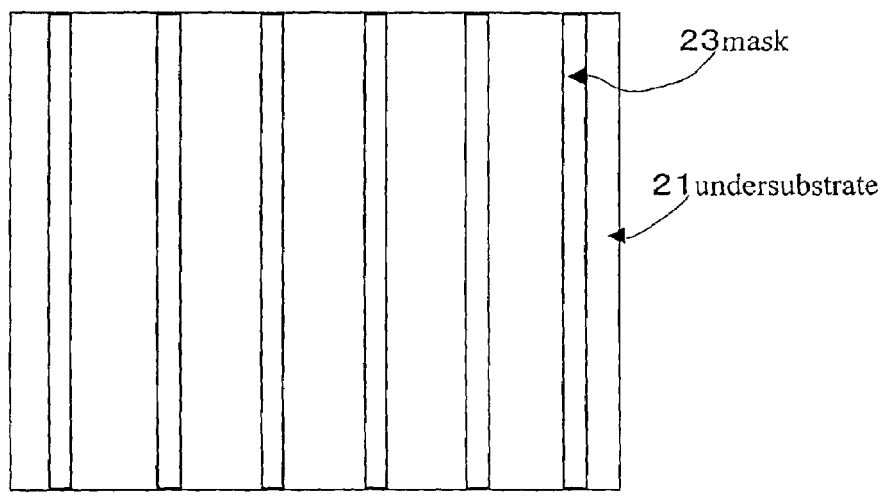
FIGS. 6(a) and 6(b) are CL (cathode luminescence) plan views of a stripe mask and a grown $Al_xIn_yGa_{1-x-y}N$ crystal for showing an $Al_xIn_yGa_{1-x-y}N$ growth of the present invention.
Figure 6:
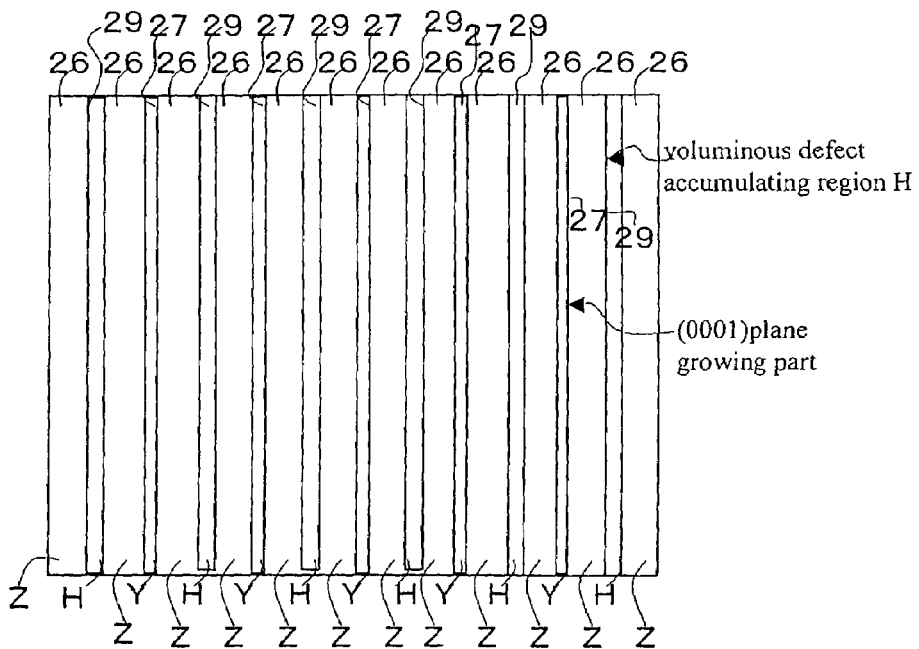

In L2, the CL observation confirms the existence of planar defects, which root in facet pit centers and extend radially in six directions spaced by 60 degrees of rotation. The radial planar defects extend farther by a distance longer than 100 µm somewhere. The planar defects are similar to the planar defects 10 shown in FIG. 1(b). Vacant V-grooves carry dislocation arrays without voluminous defect accumulating region (H) under the valleys (bottoms), the dislocation arrays being planar defects in a three-dimensional view.

It is confirmed that the facets lose the clear prism shape and degrade to an amorphous shape, when the closed defect accumulating region (H) is vanished like Sample L2. The closed defect accumulating region (H) is indispensable for maintaining the prism regular shape of the facets (repetition of valleys and hills).

The closed defect accumulating region (H) acts as a dislocation annihilation/accumulation region. When the closed defect accumulating region (H) is not formed (vacant bottom), assembling of dislocations is disturbed, once gathered dislocations diffuse again and sometimes planar dislocation assemblies happen. Sample L clarifies the significance of the voluminous defect accumulating region (H).

Lack of the voluminous defect accumulating region (H) disturbs assembling of dislocations and prevents the growing $Al_{0.3}In_{0.3}Ga_{0.4}N$ crystal from forming low dislocation regions, even if the facets form a set of the rack-shaped parallel hills and valleys. The voluminous defect accumulating region (H) is important. The voluminous defect accumulating region (H) under the bottoms of prism shaped facets is an essential requirement of the present invention.

Embodiment 4

Figure 13:
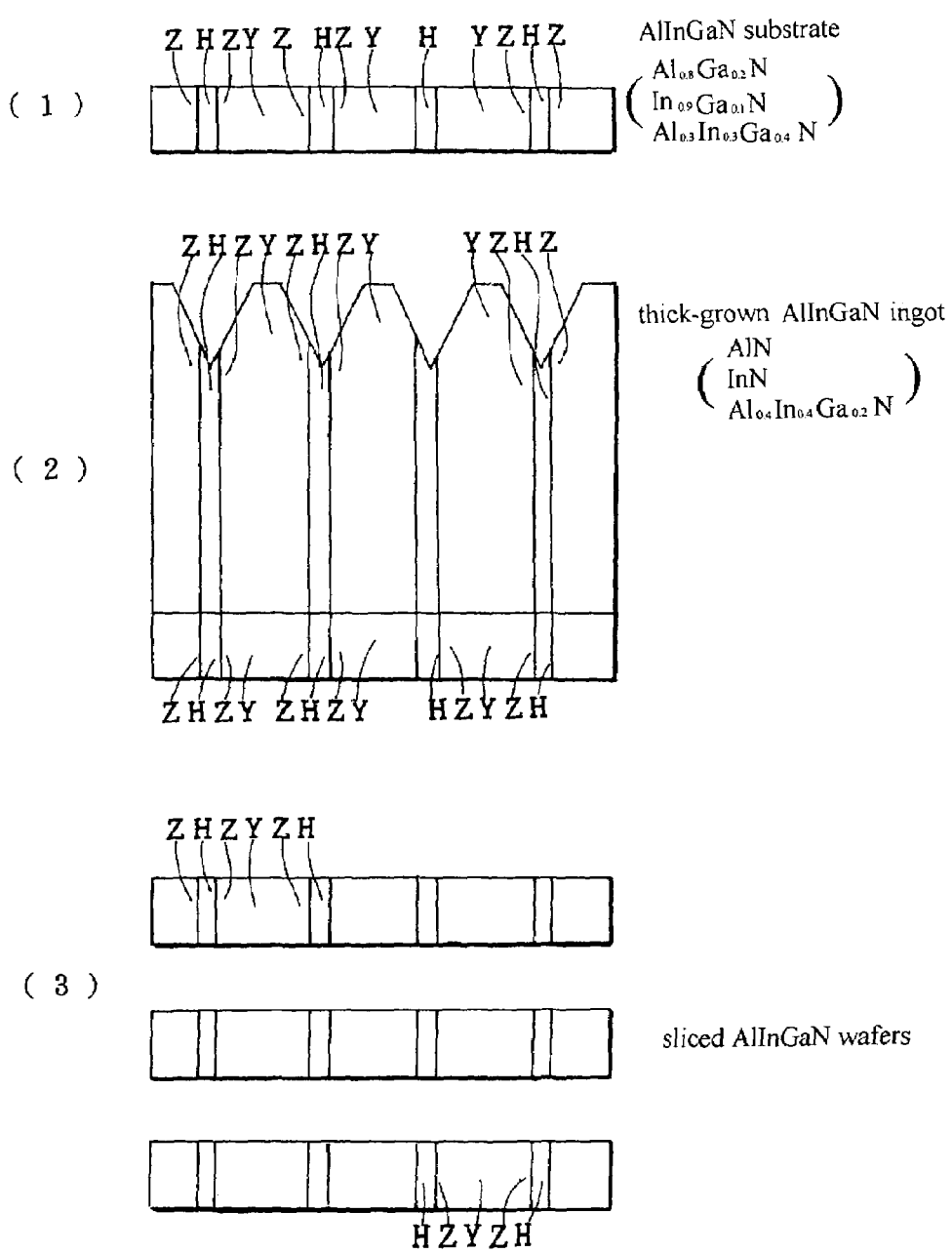
FIG. 13(1) to 13(3) are a series of sectional views of steps of making an $Al_xIn_yGa_{1-x-y}N$ (AlN, InN or $Al_{0.4}In_{0.4}Ga_{0.4}N$) crystal Embodiment 4, 5 or 6 of the present invention by preparing an $Al_xIn_yGa_{1-x-y}N$ ($Al_{0.8}In_{0.2}N$, $In_{0.9}Ga_{0.1}N$ or $Al_{0.3}In_{0.3}Ga_{0.4}N$) seed substrate made by Embodiment 1, 2 or 3 of the present invention, growing a thick $Al_xIn_yGa_{1-x-y}N$ (AlN, InN or $Al_{0.4}In_{0.4}Ga_{0.4}N$) epitaxial crystal on the seed $Al_xIn_yGa_{1-x-y}N$ ($Al_{0.8}In_{0.2}N$, $In_{0.9}Ga_{0.4}N$ or $Al_{0.3}In_{0.3}Ga_{0.4}N$) substrate on the condition of facet growing, forming linearly extending slanting facets and linearly extending facet hills on parent low dislocation single crystal regions (Z) and parent C-plane growth regions (Y) of the $Al_xIn_yGa_{1-x-y}N$ seed substrate, forming facet valleys just upon parent voluminous defect accumulating regions (H) of the $Al_xIn_yGa_{1-x-y}N$ seed, producing voluminous defect accumulating regions (H) under the bottoms of the valleys on the parent voluminous defect accumulating regions (H), forming low dislocation single crystal regions (Z) and C-plane growth regions (Y) under the hills and the facets on the parent low dislocation single crystal regions (Z) and the parent C-plane growth regions (Y), slicing an as-grown thick crystal into a plurality of as-cut $Al_xIn_yGa_{1-x-y}N$ wafers, grinding both surfaces of the as-cut $Al_xIn_yGa_{1-x-y}N$ wafers, and mirror-polishing the as-cut $Al_xIn_yGa_{1-x-y}N$ wafers into a plurality of $Al_xIn_yGa_{1-x-y}N$ mirror wafers.
Figure 14:
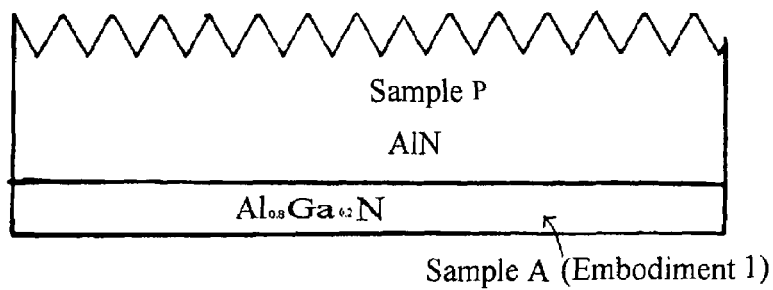
FIG. 14 is a section of Embodiment 4 having a structure of $AlN/Al_{0.8}Ga_{0.2}N$, wherein a thick AlN crystal is grown upon a masked undersubstrate of $Al_{0.8}Ga_{0.2}N$ which has been produced by Embodiment 1.

Growth of Thick AlN (x=1, y=0) on $Al_{0.8}Ga_{0.2}N$ Undersubstrate; FIGS. 13, 14; Sample P FIG. 13 demonstrates a common method of making thick AlInGaN crystals upon AlInGaN undersubstrates (Samples A, F and O) which has been made by Embodiments 1, 2 and 3 of the present invention. FIG. 13 is common to Embodiments 4, 5 and 6. FIG. 13(1) shows an AlInGaN undersubstrate which has been made by the present invention, has been sliced and polished into mirror flatness. The undersubstrate has a . . . ZHYZHZY . . . structure. FIG. 13(2) shows a thick facetted AlInGaN crystal grown on the AlInGaN undersubstrate. The tall grown AlInGaN crystal has the same . . . ZHYZHZY . . . structure. FIG. 13 (3) shows a plurality of AlInGaN wafers sliced from the thick AlInGaN crystal. The AlInGaN wafer crystal has the same . . . ZHYZHZY . . . structure as the undersubstrate. FIG. 14 shows a layered structure of Embodiment 4. Thick AlN ($x=1$, $y=0$) crystals are made by the method of the present invention. An undersubstrate is prepared by eliminating the sapphire undersubstrate from Sample A ($Al_{0.8}Ga_{0.2}N$/sapphire) substrate which has been already produced by Embodiment 1 and polishing the top surface of Sample A. The starting undersubstrate is here named Undersubstrate P ($Al_{0.8}Ga_{0.2}N$: abbr. AlGaN). An AlN ((aluminum nitride) thick crystal (Sample P) is grown on Undersubstrate P (AlGaN) by the HVPE method. The HVPE apparatus has a hot-wall furnace, $H_2$ and HCl gas inlets at a top of the furnace, an Al-boat having an Al-melt at a higher position, a susceptor at a lower position, and heaters for heating the Al-melt and the susceptor. Undersubstrate P is laid upon the susceptor. The Al-boat and the susceptor are heated. $HCl+H_2$ gases are introduced via the top gas inlets to the Al-melt. HCl gas reacts with Al and produces $AlCl_3$ (aluminum chloride) gas. The $AlCl_3$ gas falls from the Al-boat toward Undersubstrate P on the susceptor. Ammonia ($NH_3$) gas is introduced near the susceptor. $NH_3$ gas reacts with $AlCl_3$ gas and produces aluminum nitride (AlN). Synthesized AlN adheres to Undersubstrate P. An AlN layer is formed on Undersubstrate P (Sample A). The HVPE growth conditions are as follows;

| | |
|---|---|
| Growth Temperature(susceptor) | 1050° C. |
| HCl partial pressure (Al-boat) | 0.02 atm (2 kPa) |
| $NH_3$ partial pressure | 0.3 atm (30 kPa) |
| Growth Time | 140 hours |
| AlN thickness | 8000 μm (8 mm) |

The 140 hour HVPE growth makes an 8 mm thick AlN (aluminum nitride) crystal (Sample P) on Undersubstrate P. CL observation shows Sample P (AlN/AlGaN) has a pattern aligning regularly a set of parallel facet groove/valleys having a 400 μm spatial period. The groove/valley pattern of Sample P exactly transcribes the original groove/valley pattern of Undersubstrate P (AlGaN). Six AlN crystal wafers are obtained by cutting the AlN ingot in the direction vertical to the c-axis by an inner blade slicer. TEM observation measures the dislocation density. Except the (H) regions, dislocations are sufficiently decreased. The average of dislocation density is $7\times10^5$ cm$^{-2}$ in the (Z) regions and (Y) regions. Sample P is an excellent AlN substrate of low dislocation density.

Embodiment 5

Figure 15:
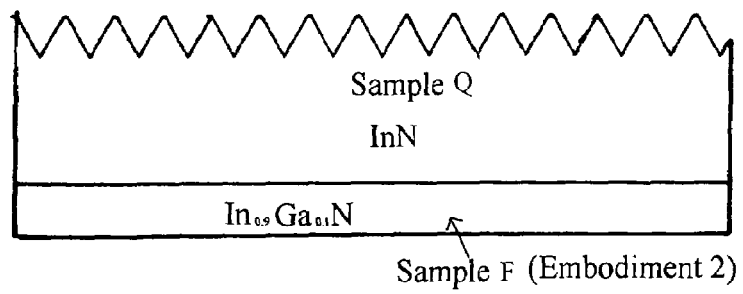
FIG. 15 is a section of Embodiment 5 having a structure of $InN/In_{0.9}Ga_{0.1}N$, wherein a thick InN crystal is grown upon a masked undersubstrate of $In_{0.9}Ga_{0.1}N$ which has been produced by Embodiment 2.

Growth of Thick InN ($x=0$, $y=1$) on $In_{0.9}Ga_{0.1}N$ Undersubstrate: FIGS. 13, 15; Sample Q Embodiment 5 makes a thick InN crystal upon an InGaN undersubstrate which has been made by Embodiment 2 by the processes shown in FIG. 13. FIG. 15 shows a layered structure of Embodiment 5. Thick InN ($x=0$, $y=1$) crystals are made by the method of the present invention. An undersubstrate is prepared by eliminating the sapphire undersubstrate from Sample F ($In_{0.9}Ga_{0.1}N$/sapphire) substrate which has been already produced by Embodiment 2 and polishing the top surface of Sample F. The starting undersubstrate prepared from Sample F is here named Undersubstrate Q ($In_{0.9}Ga_{0.1}N$: abbr. InGaN). An InN (indium nitride) thick crystal is grown on Undersubstrate Q (InGaN) by the HVPE method. The HVPE apparatus has a hot-wall furnace, $H_2$ and HCl gas inlets at a top of the furnace, an In-boat having an In-melt at a higher position, a susceptor at a lower position, and heaters for heating the In-melt and the susceptor. Undersubstrate Q is laid upon the susceptor. The In-boat and the susceptor are heated. $HCl+H_2$ gases are introduced via the top gas inlets to the In-melt. HCl gas reacts with In and produces $InCl_3$ (indium chloride) gas. The $InCl_3$ gas falls from the In-boat toward Undersubstrate Q on the susceptor. Ammonia ($NH_3$) gas is introduced near the susceptor. $NH_3$ gas reacts with $InCl_3$ gas and produces indium nitride (InN). Synthesized InN adheres to Undersubstrate Q. An InN layer is formed on Undersubstrate Q. The HVPE growth conditions are as follows;

| | |
|---|---|
| Growth Temperature(susceptor) | 650° C. |
| HCl partial pressure (In-boat) | 0.02 atm (2 kPa) |
| $NH_3$ partial pressure | 0.3 atm (30 kPa) |
| Growth Time | 140 hours |
| InN thickness | 4200 μm |

The 140 hour HVPE growth makes a 4.2 mm thick InN (indium nitride) crystal (Sample Q) on Undersubstrate Q. CL observation shows Sample Q (InN/InGaN) has a pattern aligning regularly a set of parallel facet groove/valleys having a 400 μm spatial period. The groove/valley pattern of Sample Q exactly transcribes the original groove/valley pattern of Undersubstrate Q (InGaN). Four InN crystal wafers are obtained by cutting the InN ingot in the direction vertical to the c-axis by an inner blade slicer. TEM observation measures the dislocation density. Except the (H) regions, dislocations are sufficiently decreased. The average of dislocation density is $8\times10^5$ cm$^{-2}$ in the (Z) regions and (Y) regions. Sample Q is an excellent InN substrate of low dislocation density.

Embodiment 6

Figure 16:
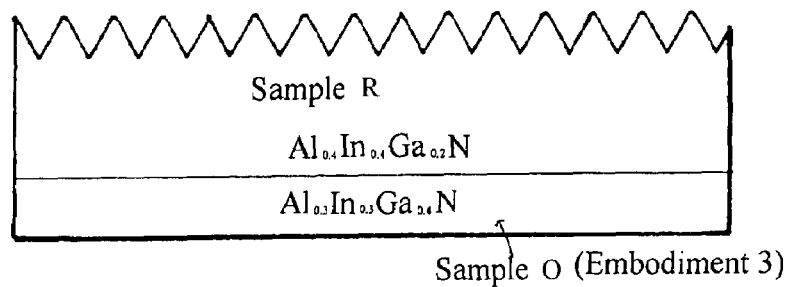
FIG. 16 is a section of Embodiment 6 having a structure of $Al_{0.4}In_{0.4}Ga_{0.2}N/Al_{0.3}In_{0.3}Ga_{0.4}N$ wherein a thick $Al_{0.4}In_{0.4}Ga_{0.2}N$ crystal is grown upon a masked undersubstrate of $Al_{0.3}In_{0.3}Ga_{0.4}N$ which has been produced by Embodiment 3.

Growth of Thick $Al_{0.4}In_{0.4}Ga_{0.2}N$ ($x=0.4$, $y=0.4$) on $Al_{0.3}In_{0.3}Ga_{0.4}N$ Undersubstrate (O); FIGS. 13, 16; Sample R FIG. 16 shows a layered structure of Embodiment 6. FIG. 13 demonstrates the steps of making an AlInGaN crystal upon an AlInGaN undersubstrate. Thick $Al_{0.4}In_{0.4}GaN$ ($x=0.4$, $y=0.4$) crystals are made by the method of the present invention. An undersubstrate is prepared by eliminating the GaAs undersubstrate from Sample O ($Al_{0.3}In_{0.3}Ga_{0.4}N$/GaAs) substrate which has been already produced by Embodiment 3 and polishing the top surface of Sample O. The starting undersubstrate is here named Undersubstrate O ($Al_{0.3}In_{0.3}Ga_{0.4}N$: abbr. AlInGaN). An $Al_{0.4}In_{0.4}Ga_{0.2}N$ thick crystal is grown on Undersubstrate O ($Al_{0.3}In_{0.3}Ga_{0.4}N$) by the HVPE method. The HVPE apparatus has a hot-wall furnace, $H_2$, $AlCl_3$ and HCl gas inlets at a top of the furnace, an In-boat having an In-melt and a Ga-boat having a Ga-melt at higher positions, a susceptor at a lower position, and heaters for heating the In- and Ga-melts and the susceptor. Undersubstrate O ($Al_{0.3}In_{0.3}Ga_{0.4}N$) is laid upon the susceptor. The In-boat, Ga-boat and the susceptor are heated. $HCl+H_2$ gases are introduced via the top gas inlets to the In-melt. HCl gas reacts with In and produces $InCl_3$ (indium chloride) gas. The $InCl_3$ gas falls from the In-boat toward Undersubstrate O on the susceptor. Ammonia ($NH_3$) gas and $AlCl_3$ gas are introduced near the susceptor. $NH_3$ gas reacts with $InCl_3$, $AlCl_3$ and GaCl gases. The reaction produces aluminum indium gallium nitride ($Al_{0.4}In_{0.4}Ga_{0.2}N$) mixture crystal. Synthesized $Al_{0.4}In_{0.4}Ga_{0.2}N$ adheres to Undersubstrate O ($Al_{0.3}In_{0.3}Ga_{0.4}N$). An $Al_{0.4}In_{0.4}Ga_{0.2}N$ layer is formed on Undersubstrate O. The HVPE growth conditions are as follows;

| | |
|---|---|
| Growth Temperature(susceptor) | 690° C. |
| HCl partial pressure (In-boat) | 0.02 atm (2 kPa) |
| HCl partial pressure (Ga-boat) | 0.01 atm (1 kPa) |
| $AlCl_3$ partial pressure | 0.02 atm (2 kPa) |
| $NH_3$ partial pressure | 0.3 atm (30 kPa) |
| Growth Time | 160 hours |
| $Al_{0.4}In_{0.4}Ga_{0.2}N$ thickness | 4100 μm |

The 160 hour HVPE growth makes a 4.1 mm thick $Al_{0.4}In_{0.4}Ga_{0.2}N$ crystal (Sample R) on Undersubstrate O. CL observation shows Sample R ($Al_{0.4}In_{0.4}Ga_{0.2}N$/$Al_{0.3}In_{0.3}Ga_{0.4}N$) has a pattern aligning regularly a set of parallel facet groove/valleys having a 400 μm spatial period. The groove/valley pattern of Sample R exactly transcribes the original groove/valley pattern of Undersubstrate O ($Al_{0.3}In_{0.3}Ga_{0.4}N$). Four $Al_{0.4}In_{0.4}Ga_{0.2}N$ crystal wafers are obtained by cutting the $Al_{0.4}In_{0.4}Ga_{0.2}N$ ingot in the direction vertical to the c-axis by an inner blade slicer. TEM observation measures the dislocation density. Except the (H) regions, dislocations are sufficiently decreased. The average of dislocation density is $1\times10^6$ $cm^{-2}$ in the (Z) regions and (Y) regions. Sample R is an excellent $Al_{0.4}In_{0.4}Ga_{0.2}N$ substrate of low dislocation density.

Table 1 shows embodiment numbers, AlInGaN materials, stripe mask widths s (μm), voluminous defect accumulating region (H) widths h (μm), mask stripe pitches p (μm), C-plane growth region (Y) widths y (μm), film thicknesses T(μm) and values of 2z+y of Samples A to R of Embodiments 1, 2, 3, 4, 5 and 6.

What we claim is:

1. An $Al_xIn_yGa_{1-x-y}N$ ($0\leq x\leq 1$, $0\leq y\leq 1$, $0<x+y\leq 1$) mixture crystal substrate having a top surface and a bottom surface,
   the top surface comprising:
   a linear low dislocation single crystal region (Z) extending in a direction defined on the top surface, and
   two linear defect accumulating regions (H) extending in the same direction as the low dislocation single crystal region (Z), having interfaces (K) on both sides and being in contact with the low dislocation single crystal regions (Z) via the interfaces (K).

2. An $Al_xIn_yGa_{1-x-y}N$ ($0\leq x\leq 1$, $0\leq y\leq 1$, $0<x+y\leq 1$) mixture crystal substrate having a top surface and a bottom surface,
   the top surface comprising repetitions (ZHZH . . . ) of a unit (ZH) having a pair of:
   a linear low dislocation single crystal region (Z) extending in a direction defined on the top surface, and
   a linear defect accumulating region (H) extending in the same direction as the low dislocation single crystal region (Z), having interfaces (K) on both sides and being in contact with the low dislocation single crystal region (Z) via the interfaces (K).

3. An $Al_xIn_yGa_{1-x-y}N$ ($0\leq x\leq 1$, $0\leq y\leq 1$, $0<x+y\leq 1$) mixture crystal substrate having a top surface, a bottom surface and a definite thickness,
   the $Al_xIn_yGa_{1-x-y}N$ mixture crystal substrate comprising:
   a planar low dislocation single crystal region (Z) extending in both a direction of thickness and a direction defined on the top surface, and
   two planar voluminous defect accumulating regions (H) extending in the same directions as the low dislocation single crystal region (Z), having interfaces (K) on both sides and being in contact with the low dislocation single crystal regions (Z) via the interfaces (K).

4. An $Al_xIn_yGa_{1-x-y}N$ ($0\leq x\leq 1$, $0\leq y\leq 1$, $0<x+y\leq 1$) mixture crystal substrate having a top surface, a bottom surface and a definite thickness,
   the $Al_xIn_yGa_{1-x-y}N$ mixture crystal substrate comprising repetitions (ZHZH . . . ) of a unit (ZH) having a pair of:

TABLE 1

Table of the embodiment numbers, (AlInGaN) materials, stripe mask widths s, voluminous defect accumulating region (H) widths h, mask pitches p, C-plane growth region (Y) widths y, AlInGaN layer thicknesses T, and values of 2z + y according to Embodiments 1 to 6

| Symbol of Samples | Embodiments | Materials | undersubstrate | pattern | s (μm) | h (μm) | p (μm) | y (μm) | T (μm) | 2Z + y (μm) |
|---|---|---|---|---|---|---|---|---|---|---|
| A | 1 | $Al_{0.8}Ga_{0.2}N$ | sapphire | A | 50 | 40 | 400 | 30 | 1200 | 360 |
| B | | $Al_{0.8}Ga_{0.2}N$ | sapphire | B | 200 | 190 | 400 | | 1200 | 210 |
| C | | $Al_{0.8}Ga_{0.2}N$ | sapphire | C | 2 | 1 | 20 | | 90 | 19 |
| D | | $Al_{0.8}Ga_{0.2}N$ | sapphire | D | 300 | 250 | 2000 | | 3500 | 1750 |
| E | | $Al_{0.8}Ga_{0.2}N$ | sapphire | E | 50 | | 400 | | 900 | |
| F | 2 | $In_{0.9}Ga_{0.1}N$ | sapphire | A | 50 | 40 | 400 | 30 | 800 | 360 |
| G | | $In_{0.9}Ga_{0.1}N$ | sapphire | B | 200 | 190 | 400 | | 800 | 210 |
| I | | $In_{0.9}Ga_{0.1}N$ | sapphire | C | 2 | 1 | 20 | | 50 | 19 |
| J | | $In_{0.9}Ga_{0.1}N$ | sapphire | D | 300 | 250 | 2000 | | 2900 | 1750 |
| K | | $In_{0.9}Ga_{0.1}N$ | sapphire | E | 50 | | 400 | | 600 | |
| L | 3 | $Al_{0.3}In_{0.3}Ga_{0.4}N$ | GaAs | A | 50 | 40 | 400 | 20~40 | 900 | 360 |
| M | | $Al_{0.3}In_{0.3}Ga_{0.4}N$ | sapphire | A | 50 | 40 | 400 | 20~40 | 900 | 360 |
| N | | $Al_{0.3}In_{0.3}Ga_{0.4}N$ | Si | A | 50 | 40 | 400 | 20~40 | 900 | 360 |
| O | | $Al_{0.3}In_{0.3}Ga_{0.4}N$ | GaAs | U | 50 | 40 | 400 | 20~40 | 900 | 360 |
| P | 4 | AlN | AlGaN | A | 50 | 40 | 400 | 30~50 | 8000 | 360 |
| Q | 5 | InN | InGaN | A | 50 | 40 | 400 | 30~50 | 4200 | 360 |
| R | 6 | $Al_{0.4}In_{0.4}Ga_{0.2}N$ | AlInGaN | U | 50 | 40 | 400 | 30~50 | 4100 | 360 | a planar low dislocation single crystal region (Z) extending both in a direction of thickness and in a direction defined on the top surface, and a planar voluminous defect accumulating region (H) extending in the same directions as the low dislocation single crystal region (Z), having interfaces (K) on both sides and being in contact with the low dislocation single crystal region (Z) via the interfaces (K).

5. The $Al_xIn_yGa_{1-x-y}N$ ($0 \leq x \leq 1$, $0 \leq y \leq 1$, $0 < x+y \leq 1$) mixture crystal substrate according to claim 1, the top surface further comprising a linear C-plane growth region (Y) lying at a middle of the linear low dislocation single crystal region (Z) and extending in the same direction as the low dislocation single crystal region (Z), the linear C-plane growth region (Y) being a low dislocation density single crystal and having higher resistivity than other regions, and three low dislocation density single crystal regions of ZYZ being sandwiched between the linear defect accumulating regions (H).

6. The $Al_xIn_yGa_{1-x-y}N$ ($0 \leq x \leq 1$, $0 \leq y \leq 1$, $0 < x+y \leq 1$) mixture crystal substrate according to claim 2, the top surface further comprising repetitions (HZYZHZYZH . . . ) of a unit (HZYZ) having a set of:

a parallel linear defect accumulating region (H), a parallel linear low dislocation single crystal region (Z), a parallel linear C-plane growth region (Y) of a low dislocation single crystal with higher resistivity than other regions, and another parallel linear low dislocation single crystal region (Z).

7. The $Al_xIn_yGa_{1-x-y}N$ ($0 \leq x \leq 1$, $0 \leq y \leq 1$, $0 < x+y \leq 1$) mixture crystal substrate according to claim 3, the substrate further comprising a planar C-plane growth region (Y) lying at a middle of the planar low dislocation single crystal region (Z) and extending in the same direction as the low dislocation single crystal region (Z), the planar C-plane growth regions (Y) being a low dislocation density single crystal and having higher resistivity than other regions, and three low dislocation density single crystal regions of ZYZ being sandwiched between the voluminous defect accumulating regions (H).

8. The $Al_xIn_yGa_{1-x-y}N$ ($0 \leq x \leq 1$, $0 \leq y \leq 1$, $0 < x+y \leq 1$) mixture crystal substrate according to claim 4, the substrate further comprising repetitions (HZYZHZYZH . . . ) of a unit (ZYZH) having a set of:

a parallel planar low dislocation single crystal region (Z), a parallel planar C-plane growth region (Y) of a low dislocation single crystal with higher resistivity than other regions, and another parallel planar low dislocation single crystal region (Z).

9. The $Al_xIn_yGa_{1-x-y}N$ ($0 \leq x \leq 1$, $0 \leq y \leq 1$, $0 < x+y \leq 1$) mixture crystal substrate according to claim 4, wherein the low dislocation single crystal regions (Z) and the voluminous defect accumulating regions (H) penetrate the substrate from the top surface to the bottom surface.

10. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating region (H) is a polycrystal and has the interfaces (K) between the voluminous defect accumulating regions (H) and the low dislocation single crystal regions (Z).

11. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating region (H) is a single crystal of an orientation nearly equal to an orientation of the neighboring low dislocation single crystal regions (Z) and the interface (K) between the voluminous defect accumulating region (H) and the low dislocation single crystal region (Z) contains planar defects.

12. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating region (H) is a single crystal of an orientation nearly equal to an orientation of the neighboring low dislocation single crystal regions (Z) and has an inner core (S) having threading dislocation bundles.

13. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating region (H) is a single crystal of an orientation nearly equal to an orientation of the neighboring low dislocation single crystal regions (Z) and has an inner core (S) having planar defects and threading dislocation bundles.

14. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating region (H) is a single crystal of an orientation slightly slanting to an orientation of the neighboring low dislocation single crystal regions (Z).

15. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating region (H) is a single crystal of an orientation nearly equal to an orientation of the neighboring low dislocation single crystal regions (Z), has an interface (K) containing planar defects, and has an inner core (S) having planar defects and threading dislocation bundles.

16. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating region (H) is a single crystal of an orientation nearly equal to an orientation of the neighboring low dislocation single crystal regions (Z), has an interface (K) containing planar defects, and has an inner core (S) having a layer of longitudinally extending planar defects.

17. The $Al_xIn_yGa_{1-x-y}N$ ($0 \leq x \leq 1$, $0 \leq y \leq 1$, $0 < x+y \leq 1$) mixture crystal substrate according to claim 4, wherein the top surface is a (0001) plane.

18. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis antiparallel to a c-axis of the neighboring low dislocation single crystal regions (Z).

19. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis antiparallel to a c-axis of the neighboring low dislocation single crystal regions (Z) and have interfaces (K) of planar defects.

20. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis antiparallel to a c-axis of the neighboring low dislocation single crystal regions (Z) and have an inner core (S) containing threading dislocation bundles.

21. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis antiparallel to a c-axis of the neighboring low dislocation single crystal regions (Z) and have an inner core (S) containing threading dislocation bundles and planar defects.

22. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis which is slightly slanting to a direction antiparallel to a c-axis of the neighboring low dislocation single crystal regions (Z).

23. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis antiparallel to a c-axis of the neighboring low dislocation single crystal regions (Z) and have interfaces (K) composed of planar defects and an inner core (S) containing threading dislocation bundles and planar defects.

24. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis antiparallel to a c-axis of the neighboring low dislocation single crystal regions (Z) and have interfaces (K) composed of planar defects and an inner core (S) containing a longitudinally extending planar defect.

25. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis antiparallel to a c-axis of the neighboring low dislocation single crystal regions (Z), the low dislocation single crystal regions (Z) have (0001) planes on the top surface of the substrate and the voluminous defect accumulating regions (H) have (000-1) planes on the top surface of the substrate.

26. The $Al_xIn_yGa_{1-x-y}N$ ($0 \leq x \leq 1$, $0 \leq y \leq 1$, $0 < x+y \leq 1$) mixture crystal substrate according to claim 4, wherein the low dislocation single crystal regions (Z) and the voluminous defect accumulating regions (H) extend in a <1-100> direction.

27. The $Al_xIn_yGa_{1-x-y}N$ ($0 \leq x \leq 1$, $0 \leq y \leq 1$, $0 < x+y \leq 1$) mixture crystal substrate according to claim 4, wherein the low dislocation single crystal regions (Z) and the voluminous defect accumulating regions (H) extend in a <11-20> direction.

28. The $Al_xIn_yGa_{1-x-y}N$ ($0 \leq x \leq 1$, $0 \leq y \leq 1$, $0 < x+y \leq 1$) mixture crystal substrate according to claim 4, wherein the planar low dislocation single crystal regions (Z) and the planar voluminous defect accumulating regions (H) extend both in a <1-100> direction and in a <0001> direction.

29. The $Al_xIn_yGa_{1-x-y}N$ ($0 \leq x \leq 1$, $0 \leq y \leq 1$, $0 < x+y \leq 1$) mixture crystal substrate according to claim 4, wherein the planar low dislocation single crystal regions (Z) and the planar voluminous defect accumulating regions (H) extend both in a <11-20> direction and in a <0001> direction.

30. The $Al_xIn_yGa_{1-x-y}N$ ($0 \leq x \leq 1$, $0 \leq y \leq 1$, $0 < x+y \leq 1$) mixture crystal substrate according to claim 8, wherein a sum (y+2z) of a width y of the C-plane growth region (Y) and widths z of the low dislocation single crystal regions (Z) ranges from 10 µm to 2000 µm.

31. The $Al_xIn_yGa_{1-x-y}N$ ($0 \leq x \leq 1$, $0 \leq y \leq 1$, $0 < x+y \leq 1$) mixture crystal substrate according to claim 8, wherein a sum (y+2z) of a width y of the C-plane growth region (Y) and widths z of the low dislocation single crystal regions (Z) ranges from 100 µm to 800 µm.

32. The $Al_xIn_yGa_{1-x-y}N$ ($0 \leq x \leq 1$, $0 \leq y \leq 1$, $0 < x+y \leq 1$) mixture crystal substrate according to claim 4, wherein a width h of the voluminous defect accumulating region (H) is 1 µm to 200 µm.

33. The $Al_xIn_yGa_{1-x-y}N$ ($0 \leq x \leq 1$, $0 \leq y \leq 1$, $0 < x+y \leq 1$) mixture crystal substrate according to claim 4, wherein a width h of the voluminous defect accumulating region (H) is 10 µm to 80 µm.

34. The $Al_xIn_yGa_{1-x-y}N$ ($0 \leq x \leq 1$, $0 \leq y \leq 1$, $0 < x+y \leq 1$) mixture crystal substrate according to claim 4, wherein an average of dislocation density is less than $5 \times 10^6$ $cm^{-2}$ in the low dislocation single crystal regions (Z).

35. The $Al_xIn_yGa_{1-x-y}N$ ($0 \leq x \leq 1$, $0 \leq y \leq 1$, $0 < x+y \leq 1$) mixture crystal substrate according to claim 4, wherein dislocation density in the low dislocation single crystal regions (Z) is the highest in the vicinity of the interface (K) and decreases in proportion to a distance from the interface (K).

36. The $Al_xIn_yGa_{1-x-y}N$ ($0 \leq x \leq 1$, $0 \leq y \leq 1$, $0 < x+y \leq 1$) mixture crystal substrate according to claim 25, wherein the surface of the substrate has lower steps of cavities at positions of the voluminous defect accumulating regions (H).

37. The $Al_xIn_yGa_{1-x-y}N$ ($0 \leq x \leq 1$, $0 \leq y \leq 1$, $0 < x+y \leq 1$) mixture crystal substrate according to claim 36, wherein the cavities have depths less than 1 µm.

38. The $Al_xIn_yGa_{1-x-y}N$ ($0 \leq x \leq 1$, $0 \leq y \leq 1$, $0 < x+y \leq 1$) mixture crystal substrate according to claim 4, wherein the voluminous defect accumulating regions (H) are single crystals having a c-axis antiparallel to a c-axis of the neighboring low dislocation single crystal regions (Z), the low dislocation single crystal regions (Z) have (000-1) planes on the top surface of the substrate and the voluminous defect accumulating regions (H) have (0001) planes on the top surface of the substrate.

39. The $Al_xIn_yGa_{1-x-y}N$ ($0 \leq x \leq 1$, $0 \leq y \leq 1$, $0 < x+y \leq 1$) mixture crystal substrate according to claim 38, wherein the surface of the substrate has lower steps of cavities at positions of the low dislocation single crystal regions (Z).

40. An $Al_xIn_yGa_{1-x-y}N$ ($0 \leq x \leq 1$, $0 \leq y \leq 1$, $0 < x+y \leq 1$) mixture crystal substrate having a top surface and a bottom surface,
the top surface comprising:
parallel linear defect accumulating regions (H) accumulating dislocations and aligning periodically, regularly with a pitch p, and
parallel linear low dislocation single crystal regions (Z) sandwiched between the neighboring linear defect accumulating regions (H) or
a set (ZYZ) of parallel linear low dislocation single crystal regions (Z) and a C-plane growth region (Y) with higher resistivity than other regions between the neighboring linear defect accumulating regions (H).

41. The $Al_xIn_yGa_{1-x-y}N$ ($0 \leq x \leq 1$, $0 \leq y \leq 1$, $0 < x+y \leq 1$) mixture crystal substrate according to claim 40, wherein the pitch p of aligning the parallel linear defect accumulating regions (H) is 20 µm to 2000 µm.

42. The $Al_xIn_yGa_{1-x-y}N$ ($0 \leq x \leq 1$, $0 \leq y \leq 1$, $0 < x+y \leq 1$) mixture crystal substrate according to claim 40, wherein the pitch p of aligning the parallel linear defect accumulating regions (H) is 100 µm to 1200 µm.

43. A method of growing an $Al_xIn_yGa_{1-x-y}N$ ($0 \leq x \leq 1$, $0 \leq y \leq 1$, $0 < x+y \leq 1$) mixture crystal comprising the steps of:
preparing an undersubstrate;
growing a set (HZH) of a linear low dislocation single crystal region (Z) and two linear voluminous defect accumulating regions (H) including plenty of dislocations and being in contact with the low dislocation single crystal region (Z) on the undersubstrate;
attracting dislocations existing in the low dislocation single crystal region (Z) to the voluminous defect accumulating regions (H);
making use of a core (S) or an interface (K) of the voluminous defect accumulating regions (H) as an annihilation/accumulation place of dislocations; and
reducing dislocations in the low dislocation single crystal region (Z).

44. A method of growing an $Al_xIn_yGa_{1-x-y}N$ ($0 \leq x \leq 1$, $0 \leq y \leq 1$, $0 < x+y \leq 1$) mixture crystal comprising the steps of:

preparing an undersubstrate;
growing a set (HZYZH) of a linear C-plane growth region (Y), two linear low dislocation single crystal regions (Z) neighboring to the C-plane growth region (Y), two linear voluminous defect accumulating regions (H) including plenty of dislocations and being in contact with the low dislocation single crystal regions (Z) on the undersubstrate;
attracting dislocations existing in the low dislocation single crystal regions (Z) and the C-plane growth region (Y) to the voluminous defect accumulating regions (H);
making use of a core (S) or an interface (K) of the voluminous defect accumulating regions (H) as an annihilation/accumulation place of dislocations; and
reducing dislocations in the low dislocation single crystal regions (Z) and the C-plane growth region (Y).

45. A method of growing an $Al_xIn_yGa_{1-x-y}N$ ($0 \leq x \leq 1$, $0 \leq y \leq 1$, $0 < x+y \leq 1$) mixture crystal comprising the steps of:
preparing an undersubstrate;
growing an $Al_xIn_yGa_{1-x-y}N$ ($0 \leq x \leq 1$, $0 \leq y \leq 1$, $0 < x+y \leq 1$) mixture crystal on the undersubstrate;
making linearly extending, reciprocally slanting facets forming valleys and a hill;
growing a set (HZH) composed of a linear low dislocation single crystal region (Z) and two linear voluminous defect accumulating regions (H);
the linear low dislocation single crystal region (Z) dangling from two reciprocally slanting facets;
the linear voluminous defect accumulating regions (H) hanging from the valleys and sandwiching the low dislocation single crystal region (Z);
maintaining the facets, the valleys and the hill;
attracting dislocations in the low dislocation single crystal region (Z) into the voluminous defect accumulating regions (H) by growing the facets;
making use of a core (S) or an interface (K) of the voluminous defect accumulating regions (H) as an annihilation/accumulation place of dislocations; and
reducing dislocations in the low dislocation single crystal region (Z).

46. A method of growing an $Al_xIn_yGa_{1-x-y}N$ ($0 \leq x \leq 1$, $0 \leq y \leq 1$, $0 < x+y \leq 1$) mixture crystal comprising the steps of:
preparing an undersubstrate;
growing an $Al_xIn_yGa_{1-x-y}N$ ($0 \leq x \leq 1$, $0 \leq y \leq 1$, $0 < x+y \leq 1$) mixture crystal on the undersubstrate;
making linearly extending, slanting facets forming a valley and hills;
growing a set (ZHZ) composed of a linear voluminous defect accumulating region (H) and two linear low dislocation single crystal regions (Z);
the linear voluminous defect accumulating region (H) dangling from the valley of the facets;
the linear low dislocation single crystal regions (Z) hanging from the facets and sandwiching the voluminous defect accumulating region (H);
maintaining the facets, the valley and the hills;
attracting dislocations in the low dislocation single crystal regions (Z) into the voluminous defect accumulating region (H) by growing the facets;
making use of a core (S) or an interface (K) of the voluminous defect accumulating region (H) as an annihilation/accumulation place of dislocations; and
reducing dislocations in the low dislocation single crystal regions (Z).

47. A method of growing an $Al_xIn_yGa_{1-x-y}N$ ($0 \leq x \leq 1$, $0 \leq y \leq 1$, $0 < x+y \leq 1$) mixture crystal comprising the steps of:
preparing an undersubstrate;
growing an $Al_xIn_yGa_{1-x-y}N$ ($0 \leq x \leq 1$, $0 \leq y \leq 1$, $0 < x+y \leq 1$) mixture crystal on the undersubstrate;
making linearly extending, reciprocally slanting facets forming valleys and hills;
growing regularly and periodically aligning parallel units (HZ) composed of a linear voluminous defect accumulating region (H) and a linear low dislocation single crystal region (Z) being in contact with the voluminous defect accumulating region (H), the linear low dislocation single crystal regions (Z) hanging from two reciprocally slanting facets and sandwiching the voluminous defect accumulating regions (H);
maintaining the facets, the valleys and the hills;
attracting dislocations in the low dislocation single crystal regions (Z) into the voluminous defect accumulating regions (H) by growing the facets;
making use of a core (S) or an interface (K) of the voluminous defect accumulating regions (H) as an annihilation/accumulation place of dislocations;
reducing dislocations in the low dislocation single crystal regions (Z); and
obtaining an HZHZHZ . . . structure constructed by repetitions of the (HZ) units.

48. A method of growing an $Al_xIn_yGa_{1-x-y}N$ ($0 \leq x \leq 1$, $0 \leq y \leq 1$, $0 < x+y \leq 1$) mixture crystal comprising the steps of:
preparing an undersubstrate;
growing an $Al_xIn_yGa_{1-x-y}N$ ($0 \leq x \leq 1$, $0 \leq y \leq 1$, $0 < x+y \leq 1$) mixture crystal on the undersubstrate;
making linearly extending, slanting facets forming valleys and hills;
growing regularly and periodically aligning parallel units (HZ) composed of a linear voluminous defect accumulating region (H) and a linear low dislocation single crystal region (Z) being in contact with the voluminous defect accumulating region (H);
the linear voluminous defect accumulating regions (H) dangling from the valleys of the facets;
the linear low dislocation single crystal regions (Z) hanging from the facets and sandwiching the voluminous defect accumulating regions (H);
maintaining the facets, the valleys and the hills;
attracting dislocations in the low dislocation single crystal regions (Z) into the voluminous defect accumulating regions (H) by growing the facets;
making use of a core (S) or an interface (K) of the voluminous defect accumulating regions (H) as an annihilation/accumulation place of dislocations;
reducing dislocations in the low dislocation single crystal regions (Z); and
obtaining an HZHZHZ . . . structure constructed by repetitions of the (HZ) units.

49. The method of growing an $Al_xIn_yGa_{1-x-y}N$ ($0 \leq x \leq 1$, $0 \leq y \leq 1$, $0 < x+y \leq 1$) mixture crystal according to claim 48, wherein the facets form V-grooves like linearly extending plane-symmetric prisms lying along parallel lines.

50. The method of growing an $Al_xIn_yGa_{1-x-y}N$ ($0 \leq x \leq 1$, $0 \leq y \leq 1$, $0 < x+y \leq 1$) mixture crystal comprising the steps of:
preparing an undersubstrate;
growing an $Al_xIn_yGa_{1-x-y}N$ ($0 \leq x \leq 1$, $0 \leq y \leq 1$, $0 < x+y \leq 1$) mixture crystal on the undersubstrate;
making linearly extending, slanting facets forming valleys and hills;
growing regularly and periodically aligning parallel units (HZYZ) composed of a linear voluminous defect accumulating region (H), a linear low dislocation single crystal region (Z), a C-plane growth region (Y) and another low dislocation single crystal region (Z) which are piled in this series;
the linear voluminous defect accumulating regions (H) dangling from the valleys of the facets;
the linear low dislocation single crystal regions (Z) hanging from the facets and sandwiching the voluminous defect accumulating regions (H);
the C-plane growth regions (Y) having a flat top surface with high electric resistivity;
maintaining the facets, the valleys and the hills;
attracting dislocations in the low dislocation single crystal regions (Z) and the C-plane growth regions (Y) into the voluminous defect accumulating regions (H) by growing the facets;
making use of a core (S) or an interface (K) of the voluminous defect accumulating regions (H) as an annihilation/accumulation place of dislocations;
reducing dislocations in the low dislocation single crystal regions (Z) and the C-plane growth regions (Y); and
obtaining an HZYZHZYZH . . . structure constructed by repetitions of the (HZYZ) units.

51. The method of growing an $Al_xIn_yGa_{1-x-y}N$ ($0 \leq x \leq 1$, $0 \leq y \leq 1$, $0 < x+y \leq 1$) mixture crystal according to claim 45, wherein an average growing direction is a c-axis direction, the voluminous defect accumulating regions (H) extend in a <1-100> direction, and the facets on the surface are {kk-2kn} (k, n; integers).

52. The method of growing an $Al_xIn_yGa_{1-x-y}N$ ($0 \leq x \leq 1$, $0 \leq y \leq 1$, $0 < x+y \leq 1$) mixture crystal according to claim 45, wherein an average growing direction is a c-axis direction, the voluminous defect accumulating regions (H) extend in a <1-100> direction, and the facets on the surface are {11-22}.

53. The method of growing an $Al_xIn_yGa_{1-x-y}N$ ($0 \leq x \leq 1$, $0 \leq y \leq 1$, $0 < x+y \leq 1$) mixture crystal according to claim 45, wherein an average growing direction is a c-axis direction, the voluminous defect accumulating regions (H) extend in a <11-20> direction, and the facets on the surface are {k-k0n} (k, n; integers).

54. The method of growing an $Al_xIn_yGa_{1-x-y}N$ ($0 \leq x \leq 1$, $0 \leq y \leq 1$, $0 < x+y \leq 1$) mixture crystal according to claim 45, wherein an average growing direction is a c-axis direction, the voluminous defect accumulating regions (H) extend in a <11-20> direction, and the facets on the surface are {1-101}.

55. The method of growing an $Al_xIn_yGa_{1-x-y}N$ ($0 \leq x \leq 1$, $0 \leq y \leq 1$, $0 < x+y \leq 1$) mixture crystal according to claim 50, wherein an average growing direction is a c-axis direction, the voluminous defect accumulating regions (H) extend in a <1-100> direction or a <11-20> direction, the facets appearing on the surface are {11-22}, {1-101}, {kk-2kn} or {k-k0n} planes (k, n; integers) and the flat tops between the facets are (0001) planes.

56. The method of growing an $Al_xIn_yGa_{1-x-y}N$ ($0 \leq x \leq 1$, $0 \leq y \leq 1$, $0 < x+y \leq 1$) mixture crystal according to claim 43, wherein the voluminous defect accumulating regions (H) grow as polycrystals.

57. The method of growing an $Al_xIn_yGa_{1-x-y}N$ ($0 \leq x \leq 1$, $0 \leq y \leq 1$, $0 < x+y \leq 1$) mixture crystal according to claim 45, wherein the linear voluminous defect accumulating regions (H) grow under shallow facets which have a smaller slanting angle than the facets existing on the linear low dislocation single crystal regions (Z).

58. The method of growing an $Al_xIn_yGa_{1-x-y}N$ ($0 \leq x \leq 1$, $0 \leq y \leq 1$, $0 < x+y \leq 1$) mixture crystal according to claim 57, wherein the linear voluminous defect accumulating regions (H) have the interfaces (K) which coincide with interfaces between the pit facets and the shallow facets.

59. The method of growing an $Al_xIn_yGa_{1-x-y}N$ ($0 \leq x \leq 1$, $0 \leq y \leq 1$, $0 < x+y \leq 1$) mixture crystal according to claim 43, wherein the linear voluminous defect accumulating regions (H) grow with the interfaces (K) composed of planar defects on both sides.

60. The method of growing an $Al_xIn_yGa_{1-x-y}N$ ($0 \leq x \leq 1$, $0 \leq y \leq 1$, $0 < x+y \leq 1$) mixture crystal according to claim 43, wherein the linear voluminous defect accumulating regions (H) grow with an orientation slightly slanting to an orientation of the surrounding low dislocation single crystal regions (Z) outside the interfaces (K).

61. The method of growing an $Al_xIn_yGa_{1-x-y}N$ ($0 \leq x \leq 1$, $0 \leq y \leq 1$, $0 < x+y \leq 1$) mixture crystal according to claim 58, wherein the linear voluminous defect accumulating regions (H) grow inside of the interfaces (K) with shallow facets, and have equal orientation to the shallow facets.

62. The method of growing an $Al_xIn_yGa_{1-x-y}N$ ($0 \leq x \leq 1$, $0 \leq y \leq 1$, $0 < x+y \leq 1$) mixture crystal according to claim 61, wherein the voluminous defect accumulating regions (H) grow inside of the interfaces (K) with shallow facets, have an equal orientation to the shallow facets, and the interfaces (K) have planar defects.

63. The method of growing an $Al_xIn_yGa_{1-x-y}N$ ($0 \leq x \leq 1$, $0 \leq y \leq 1$, $0 < x+y \leq 1$) mixture crystal according to claim 43, wherein the linear voluminous defect accumulating regions (H) grow with maintaining a c-axis antiparallel to a c-axis of the neighboring low dislocation single crystal regions (Z).

64. The method of growing an $Al_xIn_yGa_{1-x-y}N$ ($0 \leq x \leq 1$, $0 \leq y \leq 1$, $0 < x+y \leq 1$) mixture crystal according to claim 63, wherein the low dislocation single crystal regions (Z) grow in a [0001] direction and the linear voluminous defect accumulating regions (H) grow in a [000-1] direction.

65. The method of growing an $Al_xIn_yGa_{1-x-y}N$ ($0 \leq x \leq 1$, $0 \leq y \leq 1$, $0 < x+y \leq 1$) mixture crystal according to claim 63, wherein the linear voluminous defect accumulating regions (H) extend in a <1-100> direction and shallow facets existing on the linear voluminous defect accumulating regions (H) are {11-2±5} or {11-2±6} planes.

66. The method of growing an $Al_xIn_yGa_{1-x-y}N$ ($0 \leq x \leq 1$, $0 \leq y \leq 1$, $0 < x+y \leq 1$) mixture crystal according to claim 63, wherein the linear voluminous defect accumulating regions (H) extend in a <11-20> direction and shallow facets existing on the linear voluminous defect accumulating regions (H) are {1-10±3} or {1-10±4} planes.

67. The method of growing an $Al_xIn_yGa_{1-x-y}N$ ($0 \leq x \leq 1$, $0 \leq y \leq 1$, $0 < x+y \leq 1$) mixture crystal according to claim 43, wherein the linear voluminous defect accumulating regions (H) have a width h between 1 μm and 200 μm.

68. The method of growing an $Al_xIn_yGa_{1-x-y}N$ ($0 \leq x \leq 1$, $0 \leq y \leq 1$, $0 < x+y \leq 1$) mixture crystal according to claim 44, wherein a width z of the linear low dislocation single crystal region (Z) in the case of having no C-plane growth region (Y) or a sum (y+2z) of a width y of the linear C-plane growth region (Y) and widths z of the linear low dislocation single crystal regions (Z) in the case of having the C-plane growth regions (Y) is 10 μm to 2000 μm.

69. The method of growing an $Al_xIn_yGa_{1-x-y}N$ ($0 \leq x \leq 1$, $0 \leq y \leq 1$, $0 < x+y \leq 1$) mixture crystal comprising the steps of:
aligning parallel linear voluminous defect accumulating regions (H) with a pitch p regularly on an undersubstrate; and
allotting a linear low dislocation single crystal region (Z) between every neighboring voluminous defect accumulating regions (H) or a set of (Z, Y, Z) a linear low dislocation single crystal region (Z), a C-plane growth region (Y) and another linear low dislocation single crystal region (Z) between every neighboring voluminous defect accumulating regions (H).

70. The method of growing an $Al_xIn_yGa_{1-x-y}N$ ($0 \leq x \leq 1$, $0 \leq y \leq 1$, $0 < x+y \leq 1$) mixture crystal according to claim 69, wherein the pitch p periodically aligning the parallel linear voluminous defect accumulating regions (H) is 20 µm to 2000 µm.

71. The method of growing an $Al_xIn_yGa_{1-x-y}N$ ($0 \leq x \leq 1$, $0 \leq y \leq 1$, $0 < x+y \leq 1$) mixture crystal comprising the steps of:
preparing a mask having a linear stripe on an undersubstrate;
growing an $Al_xIn_yGa_{1-x-y}N$ ($0 \leq x \leq 1$, $0 \leq y \leq 1$, $0 < x+y \leq 1$) mixture crystal on the undersubstrate with the mask;
forming a linear voluminous defect accumulating region (H) on the stripe of the mask; and
forming a low dislocation single crystal region (Z) or a low dislocation single crystal region (Z) and a C-plane growth region (Y) on other part except the linear stripe of the undersubstrate.

72. The method of growing an $Al_xIn_yGa_{1-x-y}N$ ($0 \leq x \leq 1$, $0 \leq y \leq 1$, $0 < x+y \leq 1$) mixture crystal comprising the steps of:
preparing a mask having a plurality of parallel linear stripes on an undersubstrate;
growing an $Al_xIn_yGa_{1-x-y}N$ ($0 \leq x \leq 1$, $0 \leq y \leq 1$, $0 < x+y \leq 1$) mixture crystal on the undersubstrate with the mask;
forming a plurality of parallel linear voluminous defect accumulating regions (H) on the stripes of the mask; and
forming low dislocation single crystal regions (Z) or low dislocation single crystal regions (Z) and C-plane growth regions (Y) on other parts except the linear stripes of the undersubstrate.

73. The method of growing an $Al_xIn_yGa_{1-x-y}N$ ($0 \leq x \leq 1$, $0 \leq y \leq 1$, $0 < x+y \leq 1$) mixture crystal according to claim 71, wherein sets of shallow facets and the linear voluminous defect accumulating regions (H) grow upon the mask stripes and sets of steep facets and the low dislocation single crystal regions (Z) grow on the parts other than the stripes of the under substrate.

74. The method of growing an $Al_xIn_yGa_{1-x-y}N$ ($0 \leq x \leq 1$, $0 \leq y \leq 1$, $0 < x+y \leq 1$) mixture crystal according to claim 71, wherein the stripe mask is made of either silicon dioxide ($SiO_2$) or silicon nitride ($Si_3N_4$).

75. The method of growing an $Al_xIn_yGa_{1-x-y}N$ ($0 \leq x \leq 1$, $0 \leq y \leq 1$, $0 < x+y \leq 1$) mixture crystal according to claim 71, wherein the stripe mask is made of either platinum (Pt) or tungsten (W).

76. The method of growing an $Al_xIn_yGa_{1-x-y}N$ ($0 \leq x \leq 1$, $0 \leq y \leq 1$, $0 < x+y \leq 1$) mixture crystal according to claim 71, wherein the stripe mask is made of either polycrystalline aluminum nitride (AlN) or polycrystalline gallium nitride (GaN).

77. The method of growing an $Al_xIn_yGa_{1-x-y}N$ ($0 \leq x \leq 1$, $0 \leq y \leq 1$, $0 < x+y \leq 1$) mixture crystal according to claim 71, wherein the stripe mask is made of silicon dioxide ($SiO_2$) having a surface dispersed with polycrystalline GaN.

78. The method of growing an $Al_xIn_yGa_{1-x-y}N$ ($0 \leq x \leq 1$, $0 \leq y \leq 1$, $0 < x+y \leq 1$) mixture crystal according to claim 72, wherein the mask having stripes is prepared by
making an $Al_xIn_yGa_{1-x-y}N$ mixture crystal epitaxial thin layer on the undersubstrate,
depositing a mask layer on the $Al_xIn_yGa_{1-x-y}N$ mixture crystal epitaxial layer,
etching away partially the mask layer, and
forming the mask layer having parallel stripes lying on positions for making the voluminous defect accumulating regions (H).

79. The method of growing an $Al_xIn_yGa_{1-x-y}N$ ($0 \leq x \leq 1$, $0 \leq y \leq 1$, $0 < x+y \leq 1$) mixture crystal according to claim 72, wherein the mask having stripes is prepared by
depositing a mask layer on the undersubstrate,
etching away partially the mask layer, and
forming the mask layer having parallel stripes lying on positions for making the voluminous defect accumulating regions (H).

80. The method of growing an $Al_xIn_yGa_{1-x-y}N$ ($0 \leq x \leq 1$, $0 \leq y \leq 1$, $0 < x+y \leq 1$) mixture crystal according to claim 72, wherein epitaxial lateral overgrowth masks are formed upon exposed areas of the undersubstrate uncovered with the stripe mask for generating the voluminous defect accumulating regions (H).

81. The method of growing an $Al_xIn_yGa_{1-x-y}N$ ($0 \leq x \leq 1$, $0 \leq y \leq 1$, $0 < x+y \leq 1$) mixture crystal according to claim 72, wherein a stripe width s of the stripe mask for forming the voluminous defect accumulating regions (H) is 10 µm to 250 µm.

82. The method of growing an $Al_xIn_yGa_{1-x-y}N$ ($0 \leq x \leq 1$, $0 \leq y \leq 1$, $0 < x+y \leq 1$) mixture crystal according to claim 72, wherein a stripe pitch p of the stripe mask for forming the voluminous defect accumulating regions (H) is 20 µm to 2000 µm.

83. A method of producing an $Al_xIn_yGa_{1-x-y}N$ ($0 \leq x \leq 1$, $0 \leq y \leq 1$, $0 < x+y \leq 1$) mixture crystal substrate comprising the steps of:
growing an $Al_xIn_yGa_{1-x-y}N$ ($0 \leq x \leq 1$, $0 \leq y \leq 1$, $0 < x+y \leq 1$) mixture crystal on a facet-growth condition;
making voluminous defect accumulating regions (H);
reducing dislocations in low dislocation single crystal regions (Z) and C-plane growth regions (Y) in contact with the voluminous defect accumulating regions (H) by utilizing interfaces (K) and cores (S) of the voluminous defect accumulating regions (H) as dislocation annihilation/accumulation places;
obtaining a rack-shaped as-grown $Al_xIn_yGa_{1-x-y}N$ mixture crystal;
mechanical-processing the as-grown $Al_xIn_yGa_{1-x-y}N$ mixture crystal; and
making a flat, smooth $Al_xIn_yGa_{1-x-y}N$ ($0 \leq x \leq 1$, $0 \leq y \leq 1$, $0 < x+y \leq 1$) mixture crystal substrate.

84. A method of producing an $Al_xIn_yGa_{1-x-y}N$ ($0 \leq x \leq 1$, $0 \leq y \leq 1$, $0 < x+y \leq 1$) mixture crystal substrate comprising the steps of:
forming valleys composed of facets on an $Al_xIn_yGa_{1-x-y}N$ mixture crystal growing surface;
making voluminous defect accumulating regions (H) hanging from bottoms of the valleys, low dislocation single crystal regions (Z) under the facets and C-plane growth regions (Y) under flat tops of a C-plane;
reducing dislocations in the low dislocation single crystal regions (Z) and the C-plane growth regions (Y);
obtaining a rack-shaped as-grown $Al_xIn_yGa_{1-x-y}N$ ($0 \leq x \leq 1$, $0 \leq y \leq 1$, $0 < x+y \leq 1$) mixture crystal;
mechanical-processing the as-grown $Al_xIn_yGa_{1-x-y}N$ mixture crystal; and
making a flat, smooth $Al_xIn_yGa_{1-x-y}N$ ($0 \leq x \leq 1$, $0 \leq y \leq 1$, $0 < x+y \leq 1$) mixture crystal substrate.

85. The method of producing an $Al_xIn_yGa_{1-x-y}N$ ($0 \leq x \leq 1$, $0 \leq y \leq 1$, $0 < x+y \leq 1$) mixture crystal substrate according to claim 83, wherein the mechanical-processing includes at least one of slicing, grinding and lapping.

86. The method of growing an $Al_xIn_yGa_{1-x-y}N$ ($0 \leq x \leq 1$, $0 \leq y \leq 1$, $0 < x+y \leq 1$) mixture crystal according to claim 78, wherein the undersubstrate is one of a GaN substrate, a sapphire substrate, an SiC substrate, a spinel substrate, a GaAs substrate and an Si substrate.

87. The $Al_xIn_yGa_{1-x-y}N$ ($0 \leq x \leq 1, 0 \leq y \leq 1, 0 < x+y \leq 1$) mixture crystal substrate according to claims 4, wherein the voluminous defect accumulating region (H) is divided into separated small regions intermittently extending along a line.

88. The method of growing $Al_xIn_yGa_{1-x-y}N$ ($0 \leq x \leq 1, 0 \leq y \leq 1, 0 < x+y \leq 1$) mixture crystal according to claim 43, wherein the voluminous defect accumulating region (H) is divided into separated small regions intermittently extending along a line.

89. The $Al_xIn_yGa_{1-x-y}N$ ($0 \leq x \leq 1, 0 \leq y \leq 1, 0 < x+y \leq 1$) mixture crystal substrate according to claim 4, wherein the dislocation density is less than $3 \times 10^7 \, cm^{-2}$ at points distanced by 30 μm from the interface (K) in the low dislocation single crystal regions (Z).

90. A method of producing an $Al_xIn_yGa_{1-x-y}N$ ($0 \leq x \leq 1, 0 \leq y \leq 1, 0 < x+y \leq 1$) mixture crystal substrate comprising the steps of:
   forming a striped mask with parallel stripes on a foreign material undersubstrate;
   growing an $Al_xIn_yGa_{1-x-y}N$ ($0 \leq x \leq 1, 0 \leq y \leq 1, 0 < x+y \leq 1$) mixture crystal upon the masked foreign material undersubstrate;
   forming ribbon-shaped slanting facets linearly extending in parallel with the stripes;
   making facet hills and facet valleys which coincide with the stripes;
   producing voluminous defect accumulating regions (H) under the valleys of facets above the stripes;
   yielding low dislocation single crystal regions (Z) under the facets;
   making C-plane growth regions (Y) under flat tops between neighboring reciprocal facets;
   maintaining the facets, the voluminous defect accumulating regions (H), the low dislocation single crystal regions (Z) and the C-plane growth regions (Y);
   attracting dislocations from the low dislocation single crystal regions (Z) and the C-plane growth regions (Y) into the voluminous defect accumulating regions (H);
   annihilating and accumulating the dislocations at the voluminous defect accumulating regions (H);
   reducing dislocations in the low dislocation single crystal regions (Z) and the C-plane growth regions (Y);
   making a thick tall $Al_xIn_yGa_{1-x-y}N$ ($0 \leq x \leq 1, 0 \leq y \leq 1, 0 < x+y \leq 1$) mixture crystal ingot;
   slicing the tall $Al_xIn_yGa_{1-x-y}N$ mixture crystal into a plurality of as-cut wafers; and
   polishing the as-cut wafers into $Al_xIn_yGa_{1-x-y}N$ mixture crystal mirror wafers.

91. A method of producing an $Al_xIn_yGa_{1-x-y}N$ ($0 \leq x \leq 1, 0 \leq y \leq 1, 0 < x+y \leq 1$) mixture crystal substrate comprising the steps of:
   preparing an undersubstrate;
   forming a stripe mask with parallel stripes upon the undersubstrate;
   growing an $Al_xIn_yGa_{1-x-y}N$ ($0 \leq x \leq 1, 0 \leq y \leq 1, 0 < x+y \leq 1$) mixture crystal on the undersubstrate;
   making pairs of reciprocally slanting facets linearly extending in parallel to the mask stripes;
   forming hills composed of the reciprocally slanting facets;
   forming valleys composed of the reciprocally slanting facets just above the stripes;
   producing voluminous defect accumulating regions (H) under the valleys above the stripes;
   forming low dislocation single crystal regions (Z) under the facets above parts not covered with the stripes of the undersubstrate;
   making C-plane growth regions (Y) under flat tops between neighboring reciprocal facets;
   growing a set (HZH) or a set (HZYZH) composed of the linear low dislocation single crystal region (Z), the linear voluminous defect accumulating region (H) and the C-plane growth region (Y);
   maintaining the facets, the valleys and the hills;
   attracting dislocations in the low dislocation single crystal regions (Z) and the C-plane growth regions (Y) into the voluminous defect accumulating regions (H) by growing the facets;
   making use of cores (S) or interfaces (K) of the voluminous defect accumulating regions (H) as an annihilation/accumulation place of dislocations;
   reducing dislocations in the low dislocation single crystal regions (Z);
   obtaining an $Al_xIn_yGa_{1-x-y}N$ ($0 \leq x \leq 1, 0 \leq y \leq 1, 0 < x+y \leq 1$) mixture crystal substrate with an inherent structure of " . . . HZYZHZYZH . . . " or " . . . HZHZHZ . . . ";
   employing the $Al_xIn_yGa_{1-x-y}N$ ($0 \leq x \leq 1, 0 \leq y \leq 1, 0 < x+y \leq 1$) mixture crystal substrate with the inherent structure of " . . . HZYZHZYZH . . . "or " . . . HZHZHZ . . . " made by former steps as a seed parent undersubstrate without mask;
   growing an $Al_xIn_yGa_{1-x-y}N$ ($0 \leq x \leq 1, 0 \leq y \leq 1, 0 < x+y \leq 1$) mixture crystal upon the maskless parent $Al_xIn_yGa_{1-x-y}N$ undersubstrate;
   forming ribbon-shaped slanting facets linearly extending in parallel to parent voluminous defect accumulating regions (H) of the $Al_xIn_yGa_{1-x-y}N$ substrate;
   making facet hills and facet valleys which coincide with the inherent voluminous defect accumulating regions (H) of the parent $Al_xIn_yGa_{1-x-y}N$ undersubstrate;
   producing voluminous defect accumulating regions (H) under the valleys of facets above the parent voluminous defect accumulating regions (H);
   yielding low dislocation single crystal regions (Z) under the facets;
   making C-plane growth regions (Y) at flat tops between neighboring reciprocal facets;
   maintaining the facets, the voluminous defect accumulating regions (H), the low dislocation single crystal regions (Z) and the C-plane growth regions (Y);
   attracting dislocations from the low dislocation single crystal regions (Z) and the C-plane growth regions (Y) into the voluminous defect accumulating regions (H);
   annihilating and accumulating the dislocations in the voluminous defect accumulating regions (H);
   reducing dislocations in low dislocation single crystal regions (Z) and the C-plane growth regions (Y);
   making a thick tall $Al_xIn_yGa_{1-x-y}N$ single crystal ingot;
   slicing the tall s $Al_xIn_yGa_{1-x-y}N$ single crystal ingot into a plurality of as-cut wafers; and
   polishing the as-cut wafers into $Al_xIn_yGa_{1-x-y}N$ mirror wafers.

92. A method of producing an $Al_xIn_yGa_{1-x-y}N$ ($0 \leq x \leq 1, 0 \leq y \leq 1, 0 < x+y \leq 1$) mixture crystal substrate comprising the steps of:
   preparing an undersubstrate;
   forming a stripe mask with parallel stripes upon the undersubstrate;
   growing an $Al_xIn_yGa_{1-x-y}N$ crystal on the undersubstrate;
   making pairs of reciprocally slanting facets linearly extending in parallel to the mask stripes;

forming hills composed of the reciprocally slanting facets;
forming valleys composed of the reciprocally slanting facets just above the stripes;
producing voluminous defect accumulating regions (H) under the valleys above the stripes;
forming low dislocation single crystal regions (Z) under the facets above parts not covered with the stripes of the undersubstrate;
making C-plane growth regions (Y) under flat tops between neighboring reciprocal facets;
growing a set (HZH) or a set (HZYZH) composed of the linear low dislocation single crystal region (Z), the linear voluminous defect accumulating region (H) and the C-plane growth region (Y);
maintaining the facets, the valleys and the hill;
attracting dislocations in the low dislocation single crystal regions (Z) and the C-plane growth regions (Y) into the voluminous defect accumulating regions (H) by growing the facets;
making use of cores (S) or interfaces (K) of the voluminous defect accumulating regions (H) as an annihilation/accumulation place of dislocations;
reducing dislocations in the low dislocation single crystal regions (Z) and the C-plane growth regions (Y);
obtaining a single crystal $Al_xIn_yGa_{1-x-y}N$ substrate with an inherent structure of " . . . HZYZHZYZH . . . " or " . . . HZHZHZ . . . ";
employing the $Al_xIn_yGa_{1-x-y}N$ substrate with the inherent structure of " . . . HZYZHZYZH . . . " or " . . . HZHZHZ . . . " made by former steps as a seed parent undersubstrate without mask;
growing an $Al_xIn_yGa_{1-x-y}N$ crystal upon the maskless $Al_xIn_yGa_{1-x-y}N$ undersubstrate;
forming ribbon-shaped slanting facets linearly extending in parallel with the parent voluminous defect accumulating regions (H) of the $Al_xIn_yGa_{1-x-y}N$ substrate;
making facet hills and facet valleys which coincide with the inherent voluminous defect accumulating regions (H) of the parent $Al_xIn_yGa_{1-x-y}N$ undersubstrate;
forming less inclining shallow facets just on the valleys;
producing voluminous defect accumulating regions (H) under the valley shallow facets above the parent voluminous defect accumulating regions (H);
yielding low dislocation single crystal regions (Z) or C-plane growth regions (Y) upon the parent inherent low dislocation single crystal regions (Z) and the parent C-plane growth regions (Y);
maintaining the facets, the voluminous defect accumulating regions (H), the low dislocation single crystal regions (Z) and the C-plane growth regions (Y);
attracting dislocations from the low dislocation single crystal regions (Z) and the C-plane growth regions (Y) into the voluminous defect accumulating regions (H);
annihilating and accumulating the dislocations in the voluminous defect accumulating regions (H);
reducing dislocations in the low dislocation single crystal regions (Z) and the C-plane growth regions (Y);
making a thick tall $Al_xIn_yGa_{1-x-y}N$ single crystal ingot;
slicing the tall $Al_xIn_yGa_{1-x-y}N$ single crystal into a plurality of as-cut wafers; and
polishing the as-cut wafers into $Al_xIn_yGa_{1-x-y}N$ mirror wafers.

* * * * *